(12) United States Patent
Moslehi et al.

(10) Patent No.: US 9,680,041 B2
(45) Date of Patent: *Jun. 13, 2017

(54) THREE-DIMENSIONAL THIN-FILM SEMICONDUCTOR SUBSTRATE WITH THROUGH-HOLES AND METHODS OF MANUFACTURING

(71) Applicant: Solexel, Inc., Milpitas, CA (US)

(72) Inventors: Mehrdad M. Moslehi, Los Altos, CA (US); David Xuan-Qi Wang, Fremont, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/578,161

(22) Filed: Dec. 19, 2014

(65) Prior Publication Data
US 2015/0303331 A1 Oct. 22, 2015

Related U.S. Application Data

(63) Continuation of application No. 13/962,291, filed on Aug. 8, 2013, now Pat. No. 8,916,772, which is a continuation of application No. 12/791,842, filed on Jun. 1, 2010, now Pat. No. 8,551,866.

(60) Provisional application No. 61/182,635, filed on May 29, 2009, provisional application No. 61/228,068, filed on Jul. 23, 2009.

(51) Int. Cl.
H01L 31/00 (2006.01)
H01L 31/0352 (2006.01)
H01L 31/18 (2006.01)
H01L 31/0468 (2014.01)
H01L 27/142 (2014.01)
H01L 31/0224 (2006.01)
H01L 31/054 (2014.01)
H01L 31/056 (2014.01)

(52) U.S. Cl.
CPC ...... *H01L 31/03529* (2013.01); *H01L 27/142* (2013.01); *H01L 31/022458* (2013.01); *H01L 31/035281* (2013.01); *H01L 31/0468* (2014.12); *H01L 31/1804* (2013.01); *H01L 31/1892* (2013.01); *H01L 31/054* (2014.12); *H01L 31/056* (2014.12); *Y02E 10/547* (2013.01); *Y02P 70/521* (2015.11)

(58) Field of Classification Search
CPC ............. H01L 31/1892; H01L 31/0468; H01L 31/054; H01L 31/056; H01L 27/142; Y02E 10/547
See application file for complete search history.

*Primary Examiner* — Matthew Martin

(57) ABSTRACT

A three-dimensional thin-film semiconductor substrate with selective through-holes is provided. The substrate having an inverted pyramidal structure comprising selectively formed through-holes positioned between the front and back lateral surface planes of the semiconductor substrate to form a partially transparent three-dimensional thin-film semiconductor substrate.

5 Claims, 33 Drawing Sheets

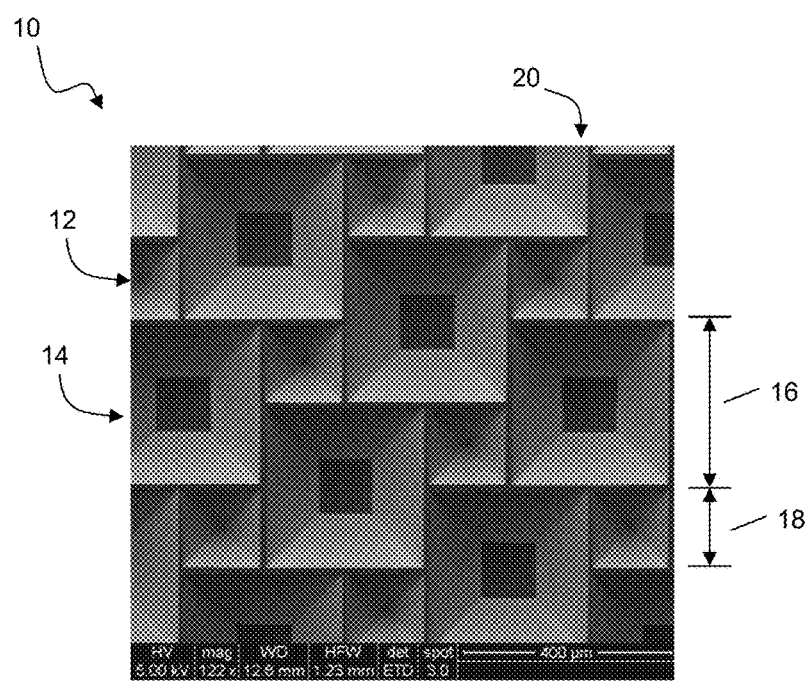
FIG. 1A
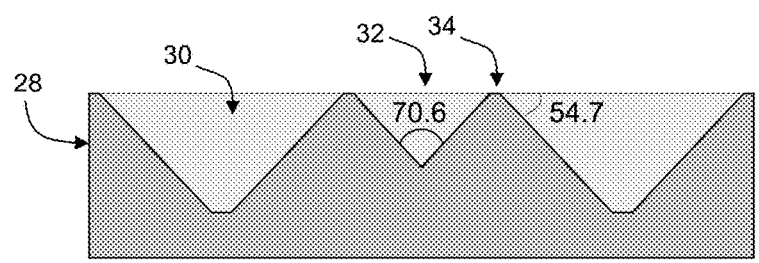
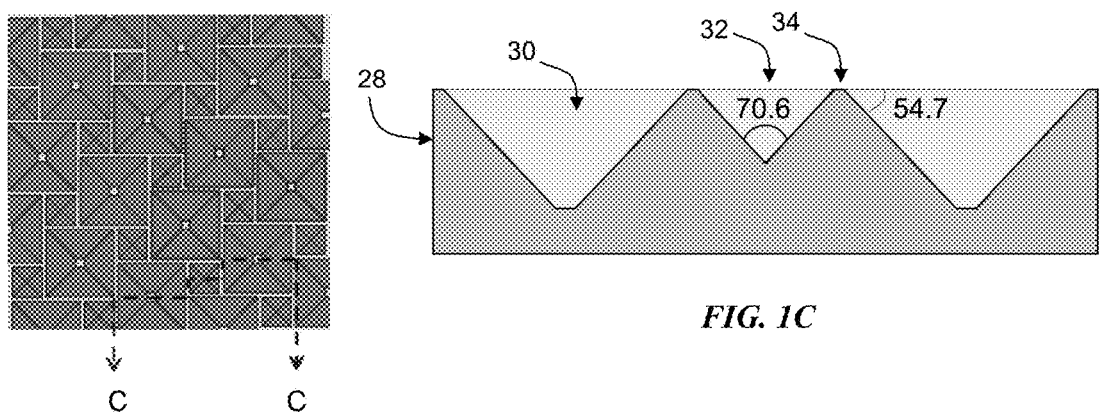
FIG. 1B
FIG. 1C

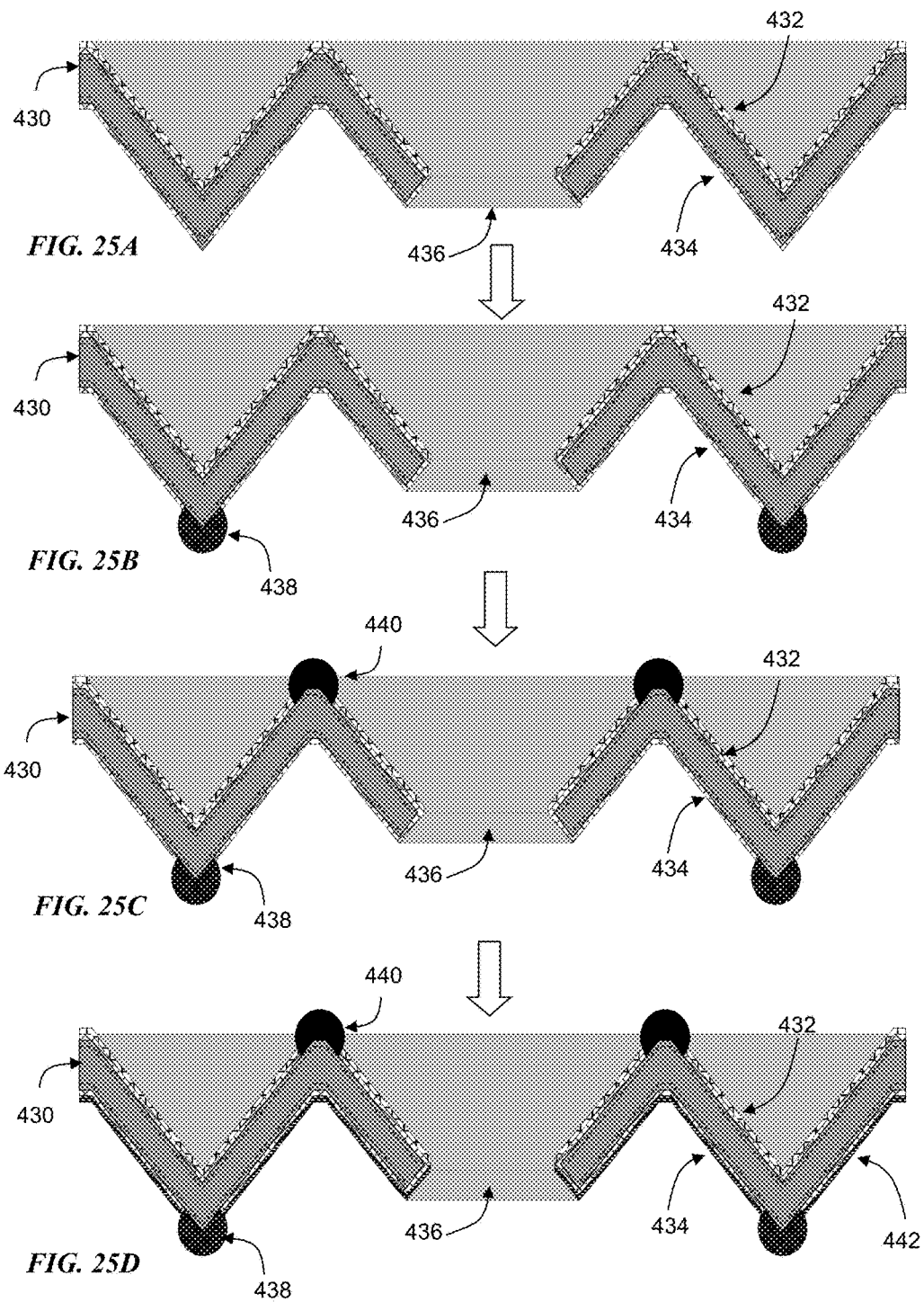

THREE-DIMENSIONAL THIN-FILM SEMICONDUCTOR SUBSTRATE WITH THROUGH-HOLES AND METHODS OF MANUFACTURING

CROSS-REFERENCE TO RELATED APPLICATIONS

This application is a continuation of U.S. patent application Ser. No. 13/962,291 filed Aug. 8, 2013 which is a continuation of U.S. patent application Ser. No. 12/791,842 filed Jun. 1, 2010 issued as U.S. Pat. No. 8,551,866 which claims the benefit of both U.S. Prov. App. 61/182,635 filed on May 29, 2009 and U.S. Prov. App. 61/228,068 filed on Jul. 23, 2009, all of which are hereby incorporated by reference in their entirety.

FIELD OF THE INVENTION

This disclosure relates in general to the field of photovoltaics and solar cells, and more particularly to semiconductor substrates and methods for making semiconductor substrates with through-holes for use in manufacturing three-dimensional thin-film solar cells.

BACKGROUND OF THE INVENTION

Building-Integrated Photovoltaics (BIPV) involves the process of integrating energy (electricity) producing photovoltaic technology into residential, commercial, and industrial building and construction design and materials. By using BIPV, the solar electricity producing components actually become an integral part of the building or construction materials and design, often serving as the protective exterior weathering skin and/or interior building components. Semi-transparent or see-through solar PV modules comprise the most attractive segment of BIPV applications. These modules can be used in many applications including window glazing in building windows. In some applications they are also a part of shading devices such as car parking covers. Such BIPV systems are also known as "shadowvoltaic" systems. See-through BIPV modules can be also part of energy efficient glazing, where they are used instead of usual glass.

Currently, about 80% of the BIPV applications are served by crystalline semiconductor cell technology, while inorganic thin-film (TF) technologies account for the remaining 20% of the total BIPV market. However, the TF technologies are projected to capture over 50% of the BIPV applications by 2015. The TF technologies include amorphous semiconductor (a-Si), cadmium telluride (CdTe), copper-indium-gallium-diselenide (CIGS), and organic PV. Among them, CdTe and CIGS promise higher efficiencies than a-Si. However, these TF technologies in practice offer efficiencies in the range of 5% to 12%, with the TF see-through BIPV module efficiencies being essentially limited to the single-digit efficiency range of 4% to 8%. Both organic PV (OPV) and dye-sensitized solar cells (DSSC) are considered to be the third generation BIPV technologies (both currently providing module efficiencies on the order of 6%). All the TF and DSSC BIPV technologies currently offer much lower efficiencies than crystalline semiconductor BIPV. However, the TF technologies provide better aesthetics than crystalline semiconductor, particularly for see-through BIPV module applications. In a typical see-through crystalline semiconductor BIPV module for solar glass applications, the crystalline semiconductor cells are spaced apart to allow for visible light transmission in between the tiled cells. While this see-through crystalline semiconductor PV modules can provide relatively high effective efficiencies (e.g., typically in the range of 10% to 12%), they do not offer very attractive aesthetics, both due to the tiled design and also due to the standard busbar emitter interconnects in the cells (thus, showing visible metallization fingers and busbars).

Dye-sensitised solar cells (DSSC) operate based on the interaction between light and a dye coated onto small grains of titanium dioxide. The grains are placed in a liquid that acts as an electrolyte, collecting the electrons released by the dye as it absorbs light, thus, generating current. The whole mixture is sandwiched between a transparent glass sheet electrode doped with tin oxide to make it electrically conducting, and a rear panel. The efficiency of DSSC designed for outdoor conditions is currently about 6%. This is far below the efficiency of standard crystalline semiconductor BIPV modules.

OPV and DSSC BIPV modules cannot easily compete with the conventional crystalline semiconductor or TF BIPV solar panels due to their relatively low conversion efficiencies and shorter operational lifetimes. Crystalline semiconductor solar cells and modules have proven long lifetimes in excess of 25-30 years in the field and no TF or DSSC technology can offer or match such track record. While the conventional crystalline semiconductor wafer BIPV is only suitable for rigid BIPV applications, the TF and DSSC BIPV modules can be used for both rigid and flexible substrate applications.

This invention provides a 3D crystalline (including monocrystalline) thin-film semiconductor substrate for making disruptive, high-efficiency, and low cost see-through solar cells. The semiconductor film thickness may be in the range of a few microns to tens of microns (up to ~100 μm).

For example, U.S. Pat. Pub. No. 2008/0264477, U.S. Pat. Pub. No. 2008/0289684, U.S. Pat. Pub. No. 2008/0295887 and U.S. Pat. Pub. No 2009/0107545 by common inventor Mehrdad M. Moslehi disclose methods for manufacturing a 3-Dimensional Thin-Film Soar Cell (3-D TFSC). The methods comprise forming a 3-Dimensional Thin-Film Substrate (3-D TFSS) using a semiconductor template. The template structures may comprise any combination or variation of three-dimensional surface features such as a plurality of posts and a plurality of trenches between said a plurality of posts or a plurality of inverted three-dimensional pyramid surface cavities. The 3-D TFSS is formed by forming a sacrificial layer on the template, subsequently depositing a semiconductor layer, selective etching the sacrificial layer and releasing the semiconductor layer from the template. More specifically, the semiconductor layer is a self-supporting, free-standing three-dimensional (3D) epitaxial semiconductor thin film deposited on and released from a low-cost reusable crystalline semiconductor substrate template. The reusable semiconductor template may be reused to form the 3D film numerous times before being reconditioned or recycled. Select portions of the released 3-D TFSS are then doped with a first dopant, and other select portions are than doped with a second dopant. After surface passivation processes, emitter and base metallization regions are formed to complete the solar cell structure.

Known 3-D TFSS fabrication methods provides fabrication process improvements and manufacturing cost reduction by using inverted and staggered pyramid structures on the re-usable semiconductor templates. More specifically, the inverted pyramid structures disclosed in the said patent application are made by KOH-like semiconductor etching. The known crystallographic semiconductor planes on the template surface from KOH etching enable convenient epitaxial growth control as well as large number of template re-use cycles in order to amortize the template cost over numerous released cell substrates.

SUMMARY OF THE INVENTION

In accordance with the present disclosure, methods for manufacturing three-dimensional thin-film solar cells (3-D TFSCs) are provided. The 3-D TFSCs of the disclosed subject matter substantially eliminate or reduce disadvantages and problems associated with previously developed semiconductor wafer-based solar cells as well as TFSCs, both in terms of conversion efficiency as well as manufacturing costs.

According to one aspect of the disclosed subject matter structural designs and methods of manufacturing 3-D see-through TFSS and TFSCs as well as aesthetically appealing, three-dimensional (3-D) Partially-Transparent (See-through) TFSCs with relatively high conversion efficiencies and substantially uniform light trasmissivities. The disclosed subject matter is particularly applicable to Building-Integrated PhotoVoltaics (BIPV) applications including power-generating solar glass as well as other solar photovoltaic power modules.

According to one aspect of the disclosed subject matter, there is provided 3-D See-through Thin-Film-Semiconductor-Substrate (TFSS), comprising continuous, staggered, inverted pyramidal cavities. Furthermore, the pyramid structures may comprise of square and/or rectangular pyramids with two or more different sizes that are interweaved for providing an overall better mechanical rigidity than a 3-D TFSS with non-staggered, regular array pyramid structures. The pyramid layout designs of the disclosed subject matter staggered and non-staggered inverted pyramidal surface features.

According to another aspect of the disclosed subject matter, there is provided partially transparent 3-D TFSS or crystalline film solar semiconductor substrate, comprising staggered, inverted and hollow pyramid structures with uniformly distributed see-through apertures or holes etched through the pyramid structures.

Furthermore, the pyramid structures comprise of square and/or rectangular pyramids with two or more different sizes that are interweaved for providing an overall better mechanical rigidity than a 3-D TFSS with non-staggered, regular array pyramid structures. The pyramid layout designs of the disclosed subject matter include the staggered and non-staggered pyramid structures. The see-through apertures or holes are etched (or chemically/mechanically polished) from one or multiple sizes of the pyramids. The partially transparent 3-D TFSC are provided for BIPV applications such as electricity generating solar glass. The 3-D TFSC of this type is provided for conventional module (e.g., rooftop) and solar field (solar PV power farm) photovoltaic applications.

According to another aspect of the disclosed subject matter, there are provided fabrication methods forming see-through 3-D TFSSs and 3-D TFSCs. Such as using abrasive tape and diaphragm lapping for self-aligned thin layer removal on a pre-structured wafer surface and using abrasive tape lapping for wafer edge thin layer removal that is unique for the fabrication process of the present invention.

According to another aspect of the disclosed subject matter, there are provided fabrication methods in making the see-through holes on the 3-D TFSS in self-aligned coating and etching processes. In addition to using 3-D TFSSs with see-through hole for fabricating partially transparent 3-D TFSCs, the see-through holes, with proper dimension and location designs, may also be used to make 3-D TFSCs with solar cell emitter and base contacts on the same side of the substrate. In this case, through-TFSS emitter metal plugs may be made using the see-through holes to make emitter wrap-through or back-contact cells.

The 3-D TFSS is formed by forming a bi-layer, triple-layer, or graded-porosity porous semiconductor layer (a low porosity layer on top of a high porosity layer) on a pre-structured semiconductor template, subsequently depositing a semiconductor layer by epitaxial semiconductor growth and then releasing the semiconductor layer from the template. The semiconductor template, which comprises a plurality of pre-structured inverted pyramid structures, may be reused to form the 3-D TFSS numerous times before being recycled. Select portions of the 3-D TFSS is doped with n-type and p-type dopant during the epitaxial growth and form the emitter and base of the semiconductor solar cell in the in-situ epitaxial growth process. Alternatively, the emitter doping process may be performed after the epitaxial semiconductor growth or even after the TFSS releasing. Next, front surface passivation and anti-reflection-coating (ARC) as well as backside passivation layer are formed followed by opening of the dielectric layer to form the emitter and base metal contact regions by subsequent metallization processes (such as with selective plating). In the case of partially transparent TFSCs, the see-through holes are preferably formed prior to the surface passivation and metallization processes.

The 3-D TFSCs may be made to be relatively rigid, semi-rigid, or flexible depending on the structural design parameters of the cell substrate. This structural design and fabrication process results in substantially reduced semiconductor consumption and PV manufacturing cost. In addition, compared to other flat, thin-film (TF) crystalline Si approaches, 3D-TFSC in the present invention cell offers the following key advantages:

(i) Surface texturing of flat, thin film, Si to reduce reflectance losses requires a minimum film thickness of preferably tens of microns (e.g., >30 µm) to avoid texturing etch-induced punch-through pinholes. 3D-TFSC of the disclosed subject matter does not suffer from this constraint. (ii) Thin flat Si films have much reduced mean optical path length which reduces IR absorption, and results in reduced cell quantum efficiency. 3D-TFSC of the disclosed subject matter traps light extremely efficiently by virtue of its 3D nature. (iii) Flat TF Si has poor mechanical strength for cell and module processing needs. 3-D TFSC disclosed has proven to be mechanically robust because of its unique 3D structure, providing enhanced mechanical strength and handlebility. (iv) The staggered, inverted and hollow pyramid structure allows see-though holes to be made in a convenient self-aligned patterning and etching method.

These and other advantages of the disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here proved will become apparent to one with skill in the art upon examination of the following Figures and detailed description. It is intended that all such additional systems, methods, features and advantages be included within this description, be within the scope of the accompanying claims.

BRIEF DESCRIPTION OF THE DRAWINGS

For a more complete understanding of the disclosed subject matter and advantages thereof, reference is now made to the following description taken in conjunction with the accompanying drawings in which like reference numbers indicate like features and wherein:

FIGS. 1A through 3B show examples of templates and 3-D TFSS/TFSCs without see-through holes;

FIGS. 25A through 25D are cross-sectional drawings depicting a process flow for the fabrication a 3-D TFSC with or without see-through holes;

DETAILED DESCRIPTION

Figure 2A:
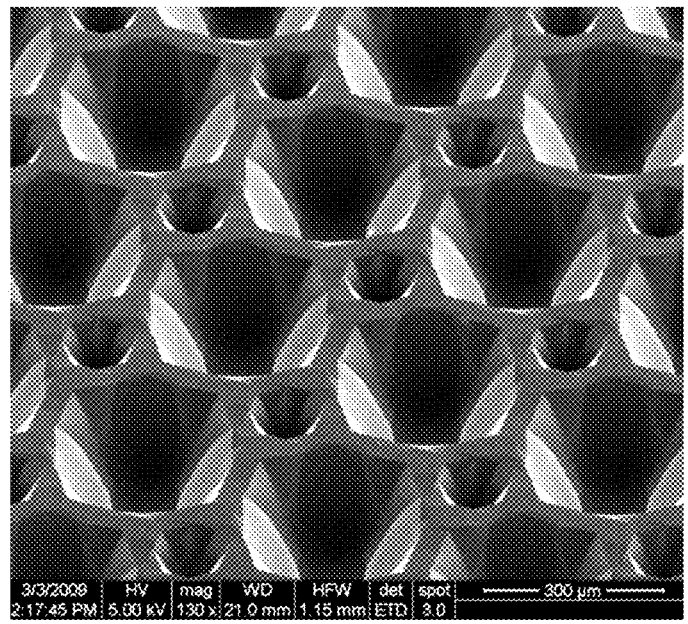

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Although described with reference to specific embodiments, one skilled in the art could apply the principles discussed herein to other areas and/or embodiments. A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, although the disclosure has typically described P and B implantation for n and p doping, respectively, other elements such as As and Sb may be used for n doping, and Al, Ga, In, may be used for p doping.

In the present application, the term 3-D TFSS refers to a three-dimensional thin-film semiconductor substrate and the term 3-D TFSC refers to a three-dimensional thin-film solar cell. Further the term selective refers to the controlled etching or coating of selected surface regions on a template, 3-D TFSS, or 3-D TFSC. Further, the term flat surface areas may refer to the top ridges of the inverted pyramidal cavities or larger flat top surface areas on the top surface of the 3-D TFSS and 3-D TFSC.

FIGS. 1A through 3B show examples of templates and 3-D TFSS/TFSCs without see-through holes.

FIG. 1A illustrates a top Scanning Electron Microscope (SEM) partial view of an embodiment of an etched re-usable semiconductor template with staggered inverted pyramidal cavities as shown in U.S. patent application Ser. No. 12/618,663 having common inventors David Xuan-Qi Wang and Mehrdad M. Moslehi. Structured semiconductor template 10 consists of anisotropically etched small pyramid cavities 12 and large pyramid cavities 14. The top opening size 16 of the large cavities is in the range of 10 um to 1 mm and the top opening size 18 of the small cavities is a partial of 16. As shown the opening size of the large cavities, 16, is about 300 um and opening size of the small cavities, 18, is about 150 um. In this case, the depth of the small cavities is about 110 um and the depth of the large cavities is about 200 um. The top surface ridges between the inverted pyramid cavities, shown as reference numeral 20, are aligned along the (100) semiconductor crystallographic planes. The sidewalls of the cavities are aligned along (111) semiconductor crystallographic planes. Small pyramid cavity 12 has a pointed cavity apex/bottom which occurs at the intersection of four (111) sidewalls. Large pyramid cavity bottom 14 has a flat cavity bottom/apex the size of which may be in the range of 0 to 100 um and is aligned along the (100) crystallographic plane. The ridge defining the opening between inverted pyramidal cavities, 20, is preferably narrow and less than 10 um wide.

The semiconductor template defines the basic structures of the 3-D TFSCs and it is used in multiple re-use cycles to make 3-D TFSSs. In other words, one template could be used to produce many substrates (3-D TFSSs) for reducing the mono-crystalline semiconductor consumption and cost. The semiconductor template is anisotropically etched from a p-type 200 mm semiconductor wafer from a batch etching process and its frontside consists of inverted and staggered large and small pyramid cavities as shown in FIG. 1A. The width of the pyramid cavity is in the range of 50 um to 500 um. The size of the small cavity is a fraction of the large cavity.

FIG. 1B is a graphic depiction of the template in FIG. 1A showing the C-C cross sectional line used in FIG. 1C. FIG. 1C is a graphic depiction of a cross section of the template in FIG. 1B along the C-C line. Inverted pyramidal template 28 consists of large inverted pyramidal cavities 30 and small inverted pyramidal cavities 32 which are defined by walls aligned along a (111) plane of inverted pyramidal template 28. Top surface ridge 34 is aligned along a (100) plane of inverted pyramidal template 28. The inverted pyramid-shape cavities may be chemically etched by anisotropic semiconductor etchant and the angle between a sidewall and a top lateral plane (such as top surface ridge 34), is about 54.7°—which is the defined angle between two (111) and (100) semiconductor crystallographic planes. Shown, small inverted pyramidal cavities 32 have an apex defined by walls aligned along the (111) crystallographic planes giving the apex, or tip, of the inverted pyramid an angle of 70.6°. Large inverted pyramidal cavities 30 have a flat apex, or flat tip, aligned along the (100) crystallographic plane. However, the template may employ various apex styles dependent on shape of the 3-D TFSS desired. It is to be noted the bottom of the large pyramid cavity may be etched to a sharp profile where the four sidewalls ((111) semiconductor planes) meet or leave a small flat bottom surface ((100) semiconductor plane).

Figure 2B:
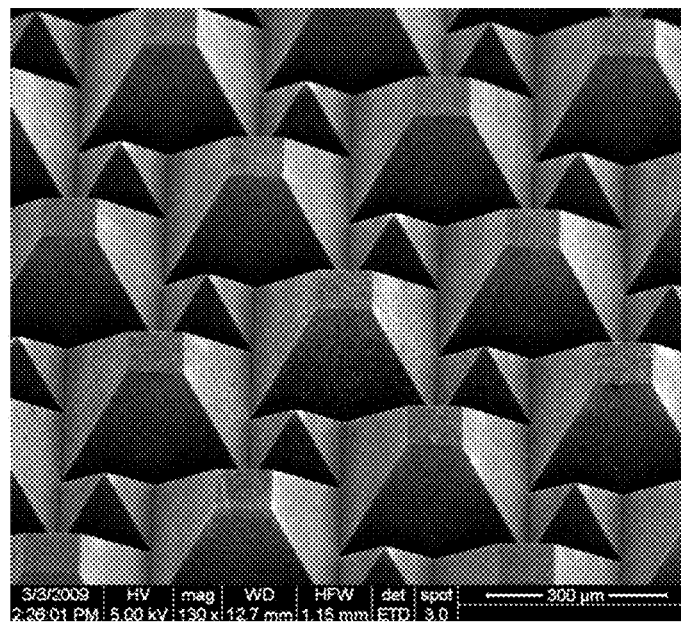

FIGS. 2A and 2B are SEM images of a non-see-through 3-D TFSS and 3-D TFSC, such as those shown in U.S. patent application Ser. No. 12/618,663 having common inventors David Xuan-Qi Wang and Mehrdad M. Moslehi. FIGS. 2A and 2B show the SEM front side view (FIG. 2A) and back side view (FIG. 2B) of the 3-D TFSS prior to passivation layer coating and metallization process steps. The 3-D TFSS is preferably made of mono-crystalline epitaxial grown semiconductor and either the front side or the back side of the 3D-TFSS may face the sun light during use. It comprises of staggered/interweaved, inverted and hollow pyramids that have two or more different sizes. Since the 3-D TFSS is made and released from a semiconductor template, the backside of the 3-D TFSS (shown in FIG. 2B) resembles the inverted surface profile of the semiconductor template top surface shown in FIG. 1A. The thickness of the deposited epitaxial layer is in the range of 5 to 50 microns. Because of its 3-D pyramid structural design, the thickness of the 3-D TFSS is in the range of 100 um to 500 um. The area of each 3-D TFSC is in the range of 100 $cm^2$ to 250 $cm^2$. The shapes of the 3-D TFSCs may include squares, squares with truncated or rounded corners, and hexagons.

Figure 3A:
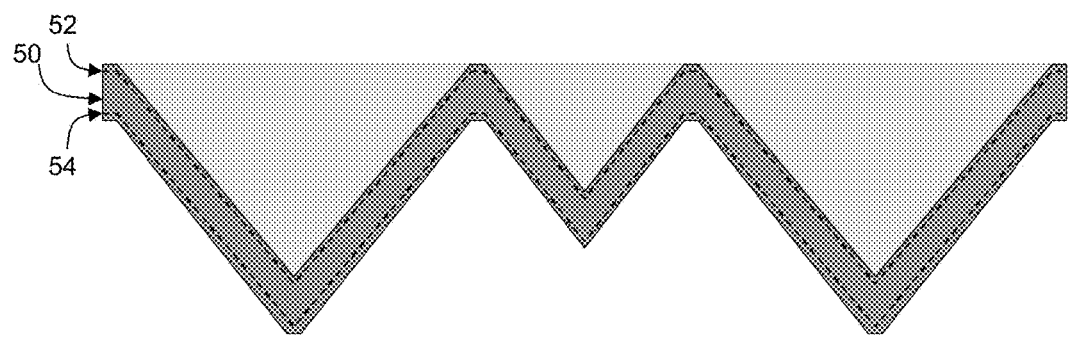

FIG. 3A is cross-sectional depiction of the 3-D TFSS shown in FIG. 1B along the C-C lines. Lightly doped p-type 3-D TFSS 50 has n-type doped emitter region 52 and p-type doped base region (Back Surface Field—BSF) 54. The n-type and p-type region is preferred to be doped in-situ to the epitaxial semiconductor growth. Alternatively, these regions may be doped by vapor, liquid or solid phase dopant diffusion or directly by ion implantation.

Figure 3B:
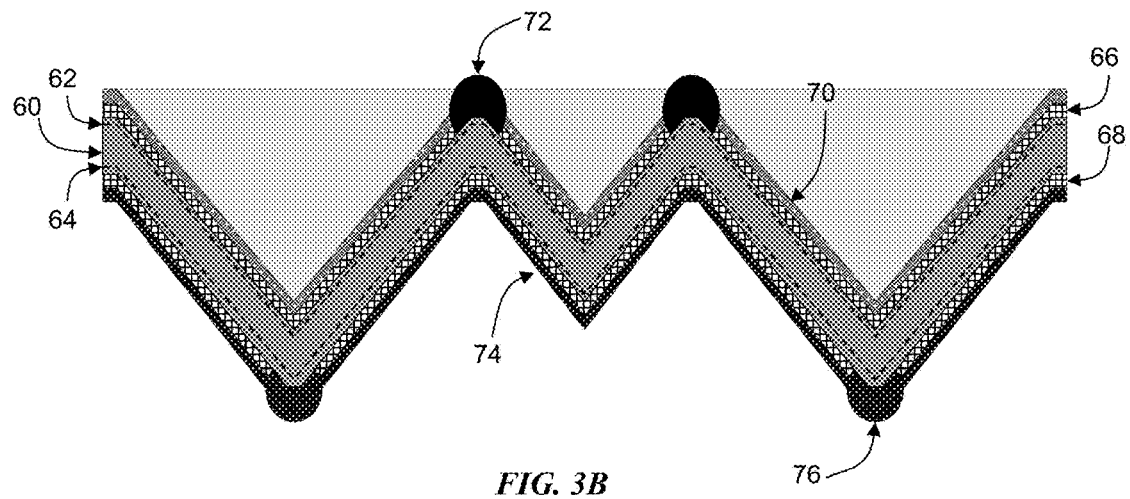

FIG. 3B is cross-sectional depiction of a 3-D TFSC made from the 3-D TFSS of FIG. 3A. 3-D TFSC 60 has n-type doped emitter region 62 and p-type doped base region (Back Surface Field—BSF) 64. 3-D TFSC 60 also comprises front side surface passivation layer 66 and antireflection coating (ARC) dielectric layer 70, back side surface passivation layer 68, emitter metal contact 72 and base metal contact 76, and the backside metal reflector layer 74. The front and back side surface passivation layers and the front ARC layer (which may be the same layer used for frontside surface passivation) include, but are not limited to, a thin layer of or a combination of layers of thermal oxide, semiconductor nitride layer and/or aluminum oxide. The dielectric layers on front and back surface may be selectively opened for making the emitter and base metal contacts. In order to further reduce electrical series resistance, the contact regions of semiconductor may be differentially/selectively doped with n+ for emitter and p+ for base. The choice of emitter metals includes but is not limited to fire-through silver (Ag) or electroplated/electroless-plated nickel (Ni) and silver (Ag). Alternatively, without opening the dielectric layers, the metal contacts may be formed by firing through the oxide and nitride layers. The backside reflector layer can be made of a thin layer of PVD/sputtered aluminum (Al), silver (Ag), or a dielectric (oxide/nitride) layer with a particular thickness to reflect the long wavelength light that penetrate to the back surfaces.

Figure 4A:
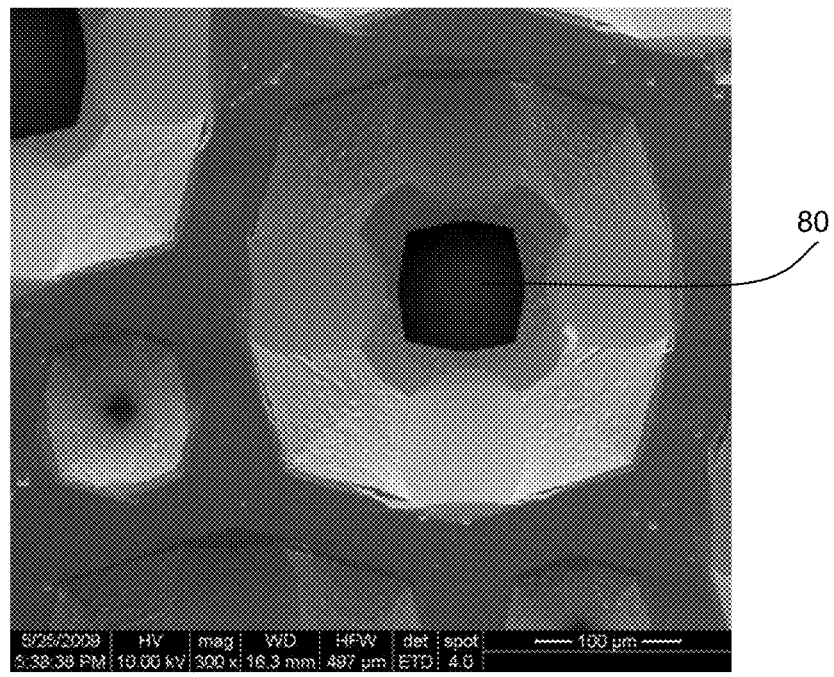
FIGS. 4A and 4B are SEM images of the front side (FIG. 4A) and back side (FIG. 4B) a 3-D TFSS with etched see-through holes.
Figure 4B:
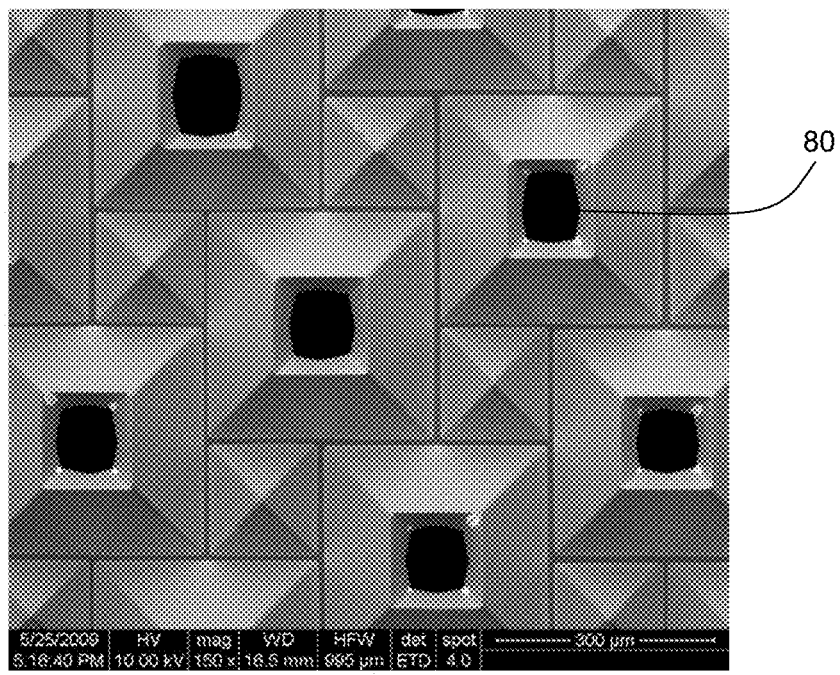

FIGS. 4A and 4B are SEM images of the front side (FIG. 4A) and back side (FIG. 4B) a 3-D TFSS with etched see-through holes in accordance with the disclosed subject matter. Shown, the 3-D TFSS is made of mono-crystalline epitaxial grown semiconductor and the front side of the 3D-TFSS (shown in FIG. 4A) faces the sunlight during use. Before the see-through holes, such as see-through hole 80, are etched, the 3-D TFSS in FIGS. 4A and 4B has a substantially similar 3-D surface structure as the non-see-through 3-D TFSS described and illustrated in FIGS. 2A and 2B—in which the 3-D TFSS is comprised of staggered/interweaved, inverted pyramidal cavities of two or more different sizes.

Figure 5A:
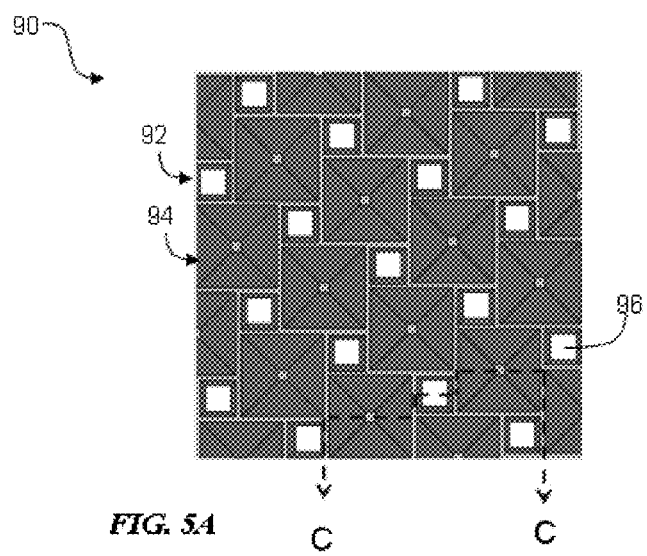
FIG. 5A illustrates a top view of an embodiment of a 3-D TFSS with etched see-through holes.

FIG. 5A illustrates a top view of an embodiment of a 3-D TFSS with etched see-through holes in accordance with the disclosed subject matter. The 3-D TFSS is made of mono-crystalline epitaxial growth semiconductor and the front side of the 3-D TFSS faces the sunlight during use. FIG. 5A illustrates 3-D TFSS 90 with a type of an inverted and staggered pyramidal design consisting of staggered large pyramid cavities 94 and small pyramid cavities 92. The width of the pyramid cavity is in the range of 50 um to 500 um. The size of the small cavity is fraction of the large cavity. Prior to passivation layer coating and metallization process steps, see-though holes 96 are etched into the small pyramids, preferably from the backside of 3-D TFSS 90 in a controlled semiconductor etching process. The etched openings are small, in the range of 50 um to 300 um, and they are uniform and evenly distributed among the large pyramids. Therefore, viewing by human eyes, either in close proximity to in a distance, the see-through effects of the resulting 3-D TFSC are aesthetically appealing. As in the non-see-through 3-D TFSS described herein, the thickness of the deposited epitaxial layer is preferably in the range of 5 to 60 microns. Because of its 3-D pyramid structural design, the peak-to-peak thickness of the 3-D TFSS is in the range of 100 um to 500 um. The area of each 3-D TFSC is typically in the range of 100 $cm^2$ to over 300 $cm^2$. And the shapes of the 3-D TFSCs may include squares, squares with truncated or rounded corners, and hexagons.

Figure 5B:
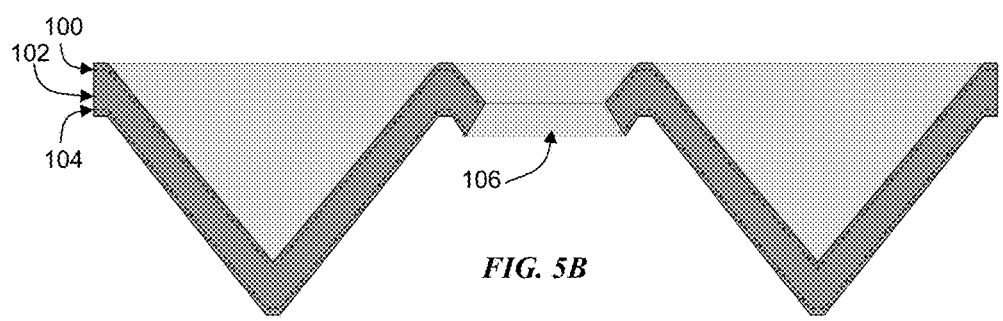
FIGS. 5B and 5C are cross-sectional illustrations of the 3-D TFSS and 3-D TFSC.
Figure 5C:
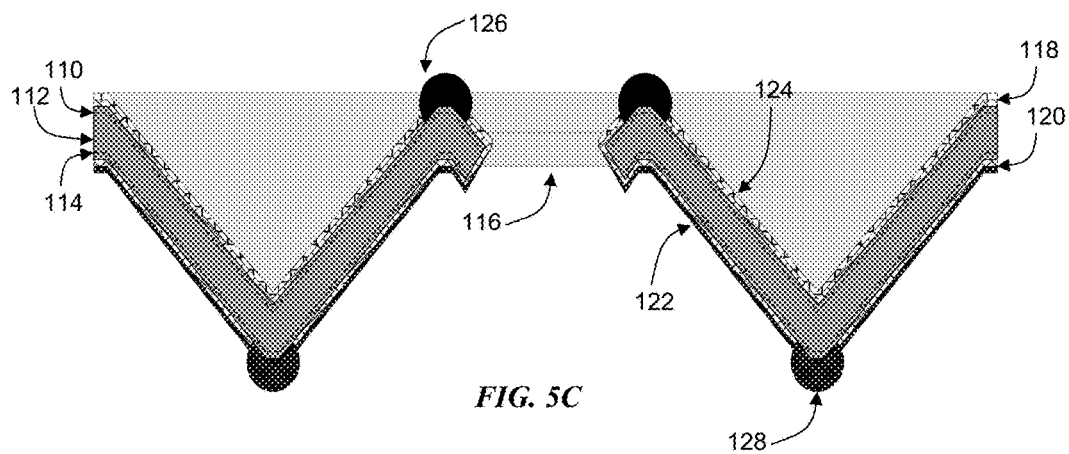

FIGS. 5B and 5C are cross-sectional illustrations of the 3-D TFSS and 3-D TFSC, respectively, along the C-C cross-sectional line in FIG. 5A. FIG. 5B is cross-sectional depiction of the 3-D TFSS shown in FIG. 5A along the C-C lines. Lightly doped p-type 3-D TFSS 102 has n-type doped emitter region 100 and p-type doped base region (Back Surface Field—BSF) 104. Importantly 3-D TFSS 102 comprises see-through holes 106 that are etched from the back side of 3-D TFSS 102. The n-type and p-type region is preferred to be doped in-situ to the epitaxial semiconductor growth. Alternatively, these regions may be doped by vapor, liquid or solid phase dopant diffusion or directly by ion implantation. The n-type and p-type regions are preferably doped in situ during the epitaxial semiconductor growth.

Alternatively, the n-type and p-type regions may be doped by vapor, liquid or solid phase dopant diffusion or directly by ion implantation. As illustrated in FIG. 5B, the lateral plane of the etch hole openings lies in between the front and back TFSS lateral planes. In other words, the etch hole opening is located between the pyramid top ridges and bottom tips in the vertical direction. Therefore, the existence of the hole-openings does not interfere with the emitter and back metal contacts. As a result, the fabrication process of the see-through 3-D TFSC is highly harmonized with the non-see-through 3-D TFSC. As another advantage, the opening size or the ratio of opening area versus non-opening area may be tuned to a specific value per design and controlled by convenient etching time control during the hole-opening etching process.

FIG. 5C is cross-sectional depiction of a 3-D TFSC made from the 3-D TFSS of FIG. 5B. 3-D TFSC 112 has n-type doped emitter region 110 and p-type doped base region (Back Surface Field—BSF) 114. 3-D TFSC 112 also comprises front side surface passivation layer 118 and antireflection coating (ARC) dielectric layer 124, back side surface passivation layer 120, emitter metal contact 126 and base metal contact 128, and the backside metal reflector layer 122. Importantly, 3-D TFSC 112 comprises see-through hole 116 in accordance with the disclosed subject matter. The front and back side surface passivation layers and the front ARC layer include, but are not limited to, a thin layer of or a combination of layers of thermal oxide, semiconductor nitride layer and/or aluminum oxide. As shown in FIG. 5C, the sidewalls of the etched see through opening 116 are also covered with the passivation dielectric layer; therefore shorting between emitter and base metal contacts through the openings is avoided. The dielectric layers on front and back surface may be selectively opened for making the emitter and base metal contacts. In order to avoid large series resistance, the regions of semiconductor close to the point contacts are differentially/selectively doped with n+ for emitter and p+ for base. The choice of emitter metals includes plated nickel (Ni) and silver (Ag). Alternatively, without opening the dielectric layers, the metal contacts may be formed by applying Ag and Al pastes to the front side (emitter) and backside (base) and forming metallization via firing through the oxide and nitride layers. The backside reflector layer may be made of a thin layer of PVD/sputtered aluminum (Al), silver (Ag), or a suitable dielectric (oxide/nitride) layer with a particular thickness (with or without a metallic mirror overlayer) to reflect the long wavelength (red and infrared) light that penetrate to the back surfaces.

Figure 6A:
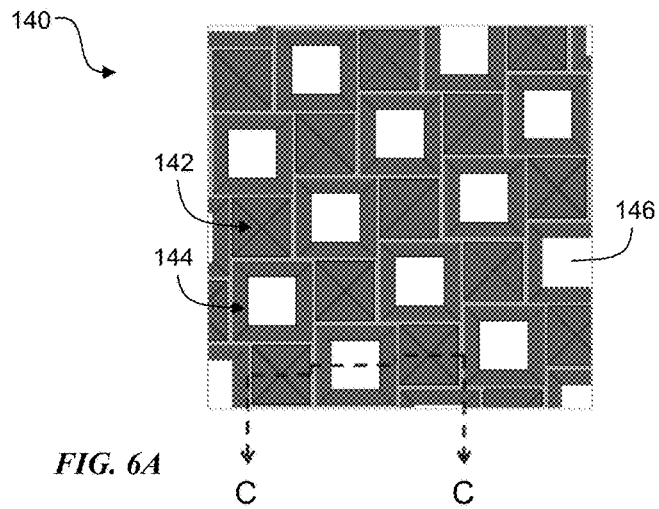
FIG. 6A illustrates a top view of an embodiment of a 3-D TFSS with etched through holes.

FIG. 6A illustrates a top view of an embodiment of a 3-D TFSS with etched through holes in accordance with the disclosed subject matter. The 3-D TFSS is made of monocrystalline epitaxial grown semiconductor and either the front side or the back side of the 3D-TFSS may face the sun light during use. FIG. 6A illustrates 3-D TFSS 140 with a type of an inverted and staggered pyramidal design consisting of staggered large pyramid cavities 144 with through holes 146 and small pyramid cavities 142.

The see-through 3-D TFSS in FIG. 6A is similar to the 3-D TFSS described and illustrated in FIG. 5A which is comprises of staggered/interweaved, inverted pyramidal cavities that have two or more different sizes; however, instead of having the see-through holes etched in the small pyramid cavities, as in FIG. 5, the see-through holes are etched in the large pyramid cavities in an alternative see-through hole etching process. As illustrated in FIGS. 5A and 5B, prior to the passivation layer coating and metallization process steps, see-though holes are selectively etched into the large pyramids preferably from the backside of the 3-D TFSS in a controlled semiconductor etching process. The etched openings are small, in the range of 50 um to 300 um, and they are uniform and evenly distributed among the large pyramids. Therefore, viewing by human eyes, either in close proximity or in a distance, the see-through effects of the resulting 3-D TFSC are uniform and aesthetically appealing. As in the non-see-through case described, the thickness of the deposited epitaxial layer is in the range of 5 to 60 microns. Because of its 3-D pyramid structural design, the thickness of the 3-D TFSS is typically in the range of 100 um to 500 um. The area of each 3-D TFSC is in the range of 100 $cm^2$ to >300 $cm^2$. And the shapes of the 3-D TFSCs may include squares, squares with truncated or rounded corners, and hexagons.

Figure 6B:
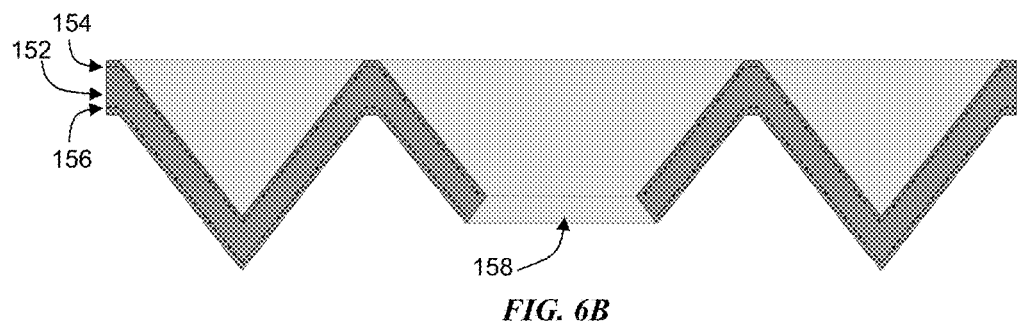
FIGS. 6B and 6C are cross-sectional illustrations of the 3-D TFSS and 3-D TFSC.
Figure 6C:
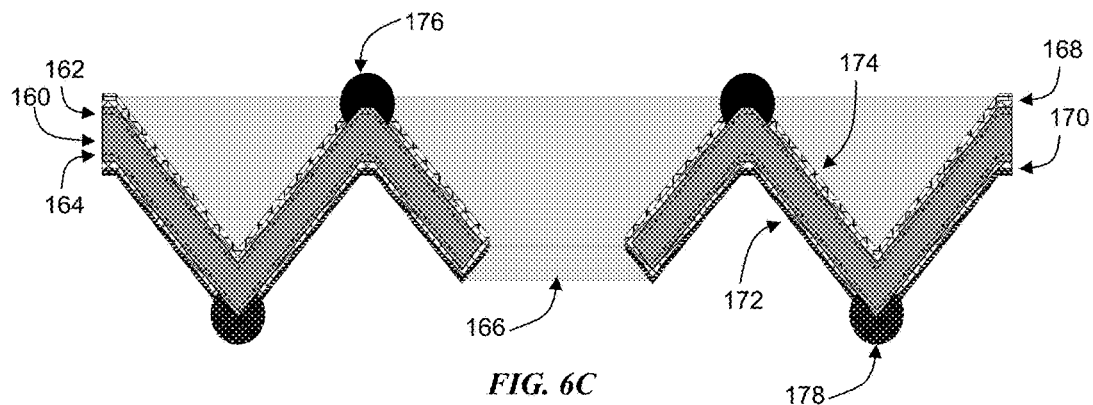

FIGS. 6B and 6C are cross-sectional illustrations of the 3-D TFSS and 3-D TFSC, respectively, along the C-C cross-sectional line in FIG. 6A. FIG. 6B is cross-sectional depiction of the 3-D TFSS shown in FIG. 6A along the C-C lines. Lightly doped p-type 3-D TFSS 152 has n-type doped emitter region 154 and p-type doped base region (Back Surface Field—BSF) 156. Importantly 3-D TFSS 152 comprises see-through holes 158 that are etched from the back side of 3-D TFSS 152.

The n-type and p-type regions are preferably doped in situ during the epitaxial semiconductor growth. Alternatively, they could be doped by vapor, liquid or solid phase dopant diffusion or directly by ion implantation. As illustrated in FIG. 6B, the lateral plane of the etch hole openings lies in between the front and back TFSS lateral planes. In other words, etch hole opening 158 is located between the pyramid top ridges and bottom tips in the vertical direction. Therefore, the existence of the hole-openings does not interfere with the emitter and back metal contacts. As a result, the fabrication process of the see-through 3-D TFSC is highly harmonized with the non-see-through 3-D TFSC. In another advantage, the opening size or the ratio of opening area versus non-opening area may be purposely tuned to a specific value per design and it is realized by convenient etching time control during the hole-opening etching process.

FIG. 6C is cross-sectional depiction of a 3-D TFSC made from the 3-D TFSS of FIG. 6B. 3-D TFSC 160 has n-type doped emitter region 162 and p-type doped base region (Back Surface Field—BSF) 164. 3-D TFSC 160 also comprises front side surface passivation layer 168 and antireflection coating (ARC) dielectric layer 174, back side surface passivation layer 170, emitter metal contact 178 and base metal contact 176, and the backside metal reflector layer 172. Importantly, 3-D TFSC 160 comprises see-through hole 166 in accordance with the disclosed subject matter.

The front and back side surface passivation layers and the front ARC layer may include but are not limited to a thin layer of or a combination of layers of thermal oxide, semiconductor nitride layer and/or aluminum oxide. As shown in FIG. 6C, the sidewalls of the etched open are also covered with the passivation dielectric layer; therefore shorting between the emitter and base metal contacts is avoided. The dielectric layers on front and back surface may be selectively opened for making the metal contact. In order to achieve sufficiently low electrical series resistance, the contact regions of semiconductor may be differentially/selectively doped with n+ for emitter and p+ for base. The choice of emitter metals includes but not limited to plated nickel (Ni) and silver (Ag). Alternatively, without opening the dielectric layers, the metal contacts may be formed by applying Ag and Al etch pastes on frontside and backside and then firing through the oxide and nitride layers to form the metal contacts. The backside reflector layer may be made of a thin layer of PVD/sputtered aluminum (Al), silver (Ag), or a dielectric (oxide/nitride) layer (with or without a metallic mirror overlayer) with a particular thickness to reflect the long (red and infrared) wavelength light that penetrates to the back surfaces.

Figure 7A:
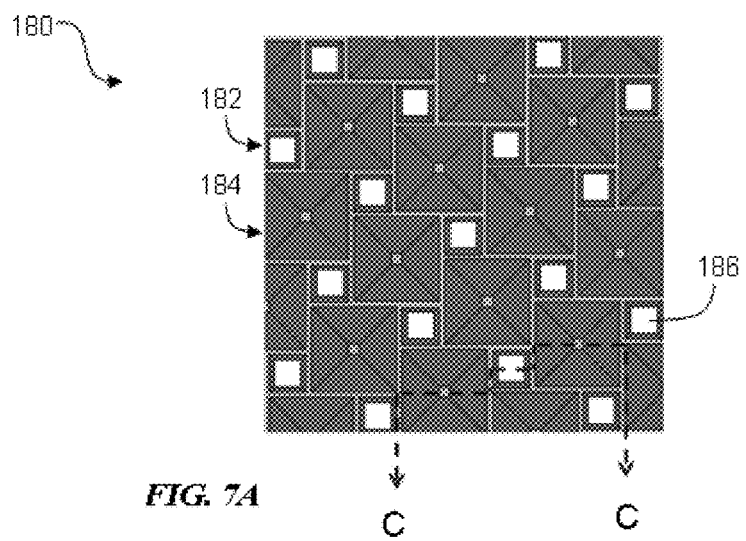
FIG. 7A illustrates a top view of an embodiment of a 3-D TFSS with etched through holes.

FIG. 7A illustrates a top view of an embodiment of a 3-D TFSS with etched through holes in accordance with the disclosed subject matter. The 3-D TFSS is made of monocrystalline epitaxial grown semiconductor and the front side or the back side of the 3D-TFSS may face the sun light during use. FIG. 7A illustrates 3-D TFSS 180 with a type of an inverted and staggered pyramidal design consisting of staggered pyramid cavities 184 and flat surface areas 182 with through holes 186. See-through 3-D TFSS 180 comprises staggered/interweaved, inverted pyramidal cavities 184 that have flat surface areas 182 regularly distributed among them. However, instead of having the see-through holes etched in the small pyramids as in FIG. 5A, see-through holes 186 are formed in the flat surface areas. As illustrated in FIG. 7A, prior to passivation layer coating and metallization process steps, see-though holes are formed in the flat surface areas from either the front or the back side of the 3-D TFSS. The etched openings are small, in the range of 50 um to 300 um, and they are preferably uniform and evenly distributed among the large pyramids. Therefore, viewing by human eyes, either in close proximity or in a distance, the see-through effects of the 3-D TFSC is aesthetically uniform and appealing. As in the non-see-through case described, the thickness of the deposited epitaxial layer is in the range of 5 to 60 microns. Because of its 3-D pyramid structural design, the thickness of the 3-D TFSS is in the range of 100 um to 500 um. The area of each 3-D TFSC is in the range of 100 $cm^2$ to over 300 $cm^2$. And the shapes of the 3-D TFSCs may include squares, squares with truncated or rounded corners, and hexagons.

Figure 7B:
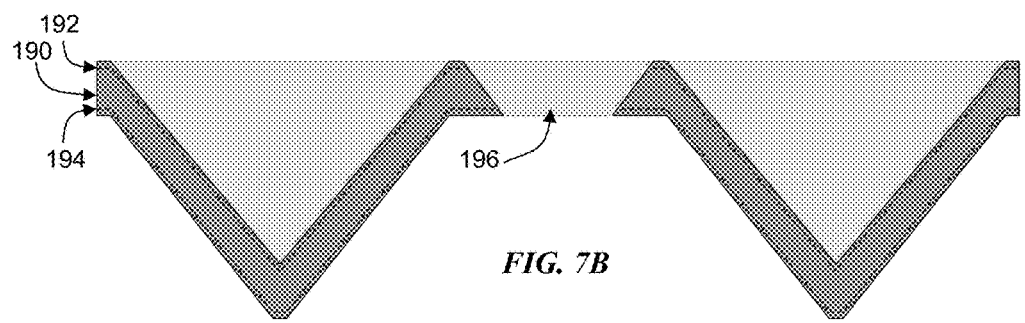
FIGS. 7B and 7C are cross-sectional illustrations of the 3-D TFSS and 3-D TFSC.
Figure 7C:
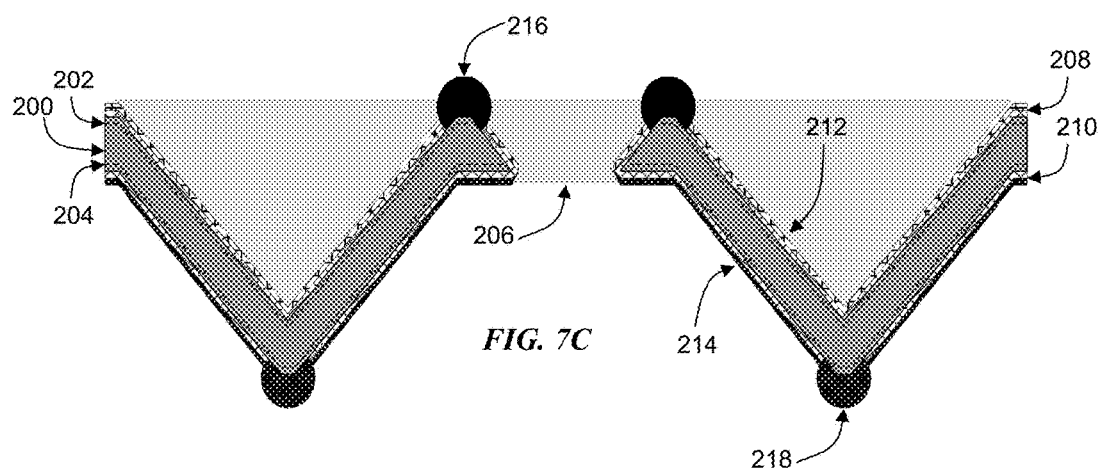

FIGS. 7B and 7C are cross-sectional illustrations of the 3-D TFSS and 3-D TFSC, respectively, along the C-C cross-sectional line in FIG. 7A. FIG. 7B is cross-sectional depiction of the 3-D TFSS shown in FIG. 7A along the C-C lines. Lightly doped p-type 3-D TFSS 190 has n-type doped emitter region 192 and p-type doped base region (Back Surface Field—BSF) 194. Importantly 3-D TFSS 190 comprises see-through holes 196 that are etched from either the front or back side of 3-D TFSS 190. The n-type and p-type regions are preferably doped in situ during the epitaxial semiconductor growth. Alternatively, they could be doped by vapor, liquid or solid phase dopant diffusion or directly by ion implantation. The opening size or the ratio of opening area versus non-opening area can be tuned when the opening pattern is made.

FIG. 7C is cross-sectional depiction of a 3-D TFSC made from the 3-D TFSS of FIG. 7B. 3-D TFSC 200 has n-type doped emitter region 202 and p-type doped base region (Back Surface Field—BSF) 204. 3-D TFSC 200 also comprises front side surface passivation layer 208 and antireflection coating (ARC) dielectric layer 212, back side surface passivation layer 210, emitter metal contact 216 and base metal contact 218, and the backside metal reflector layer 214. Importantly, 3-D TFSC 200 comprises see-through hole 206 in accordance with the disclosed subject matter.

The front and back side surface passivation layers and the front ARC layer include but not limited to a thin layer of or a combination of layers of thermal oxide, semiconductor nitride layer and/or aluminum oxide. As shown in FIG. 7C, the sidewalls of the etched openings or apertures are also covered with the passivation dielectric layer; therefore electrical shorting between the emitter and base metal contacts is avoided. The dielectric layers on the front and back surface may be selectively opened for making the metal contact. In order to ensure sufficiently low electrical series resistance, the contact regions are differentially/selectively doped with n+ for emitter and p+ for base. The choice of emitter metals includes but is not limited to plated nickel (Ni) and silver (Ag). Alternatively, without opening the dielectric layers, the metal contacts may be formed by applying silver and aluminum pastes and firing through the oxide and nitride layers. The backside reflector layer may be made of a thin layer of PVD/sputtered aluminum (Al), silver (Ag), or a dielectric (oxide/nitride) layer with a particular thickness (with or without a metallic reflector overlayer) to reflect the long wavelength (red and infrared) light that penetrate to the back surfaces.

In addition to the see-through structures illustrated in FIGS. 5A, 6A, and 7A, see-through holes may be made larger than the pyramid cavity sizes and/or coarsely distributed. Furthermore, the see-through openings do not have to be aligned to the pyramid patterns. In these irregular see-though pattern layouts, even though the conversion efficiency may be lower than the layouts described in FIGS. 5A, 6A, and 7A, the resulting 3-D TFSC may still be useful and provide higher efficiency than other partially transparent solar cells currently known. As an example, see-through holes may be conveniently drilled by laser ablation with or without alignment to the pyramid cavity patterns. The laser drilling may be done before or after the surface passivation and metallization process steps. Methods of forming the see-though holes and layouts of the see-through holes of irregular types are also within the scope of the disclosed subject matter. Further, the disclosed subject matter may be used for both mono-facial and bifacial see-through solar cells.

Figure 8A:
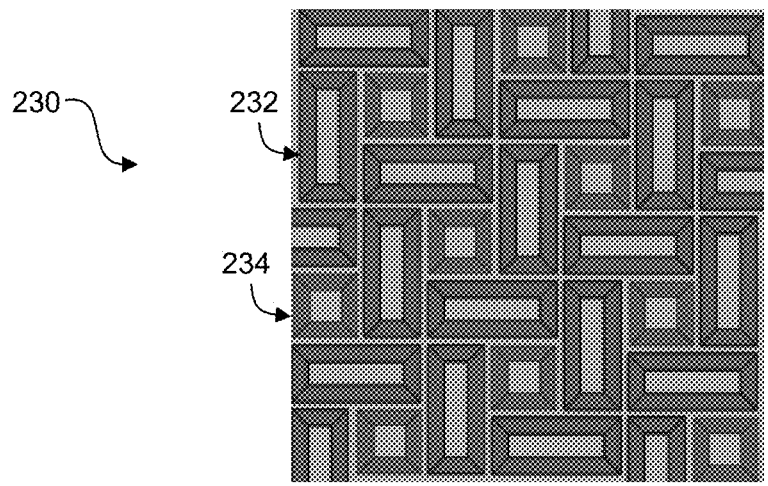
FIGS. 8A and 8B show alternative 3-D TFSS inverted pyramid cavity patterns.
Figure 8B:
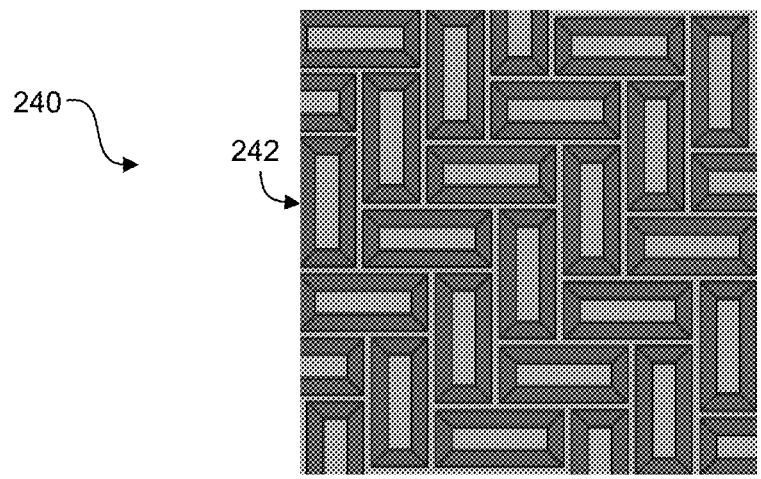

FIGS. 8A and 8B show alternative 3-D TFSS inverted pyramid cavity patterns. 3-D TFSS 230 in FIG. 8A comprises small square cavity 234 and large rectangular cavity 232. And 3-D TFSS 240 in FIG. 8B comprises a pattern of large rectangular cavity 242. Importantly, see-through holes may be positioned on any variation of inverted pyramidal cavity shape and or size in order to maximize the efficiency of the resulting 3-D TFSC.

The mechanical integrities of a reusable template and the released 3D-TFSS in this invention are directly related to the quality of the edge definition of the patterns. In order to minimize the cracks that are initiated from the template and 3D-TFSS edges, encompassing V-grooves are etched into the template at the peripherals to fully enclose the pyramid area. The encompassing V-grooves are not shown in the template and 3-D TFSS/TFSC depictions in this disclosure. The width and depth dimensions of the V-grooves are in the similar range as the pyramid structures.

FIGS. 9 thru 13 are process flows outlining several embodiments for fabricating a 3-D TFSS in accordance with the disclosed subject matter. While the process flows are outlined for fabricating semiconductor-based 3-D TFSCs, the overall concepts and methodologies may be extended and applied to other homojunction and heterojunction semiconductor materials (such as amorphous semiconductor, multi-crystalline semiconductor, polycrystalline semiconductor, CIGS, etc).

The 3-D TFSC fabrication process consists of the following major steps:

(1) Re-usable template fabrication: 3-D pyramid patterns/structures are etched from a semiconductor wafer front surface and into the bulk semiconductor. The structured semiconductor templates are then used in the formation of 3-D TFSSs. The templates are capable of being used numerous times to fabricate numerous 3-D TFSS before being reconditioned or recycled. The template may be reused for as long as it remains relatively free of dislocations and/or for as long as it maintains an acceptable pyramid pattern with its sizes and surface conditions within acceptable control limits (e.g. as gauged by in-line metrology);

(2) 3-D TFSS (substrate) fabrication: After forming a low and a high porosity porous semiconductor layers (or a graded porosity porous semiconductor layer) on the template front surfaces, epitaxial semiconductor is grown from the front template surface. In-situ emitter and base doping may be conducted during epitaxial semiconductor growth. The 3-D TFSS is formed by releasing/separating the epitaxial semiconductor layer from the template. The released 3-D TSFF then goes to subsequent cell processing steps and the template will be reused after proper cleaning and optional reconditioning;

(3) Cell fabrication process: In the process module, the 3-D TFSS is optionally doped to form emitter and base regions if the doping is not conducted prior to the 3-D TFSS release. Then surface passivation layer and antireflection layer depositions, optional contact openings and metallization steps conducted to form a 3-D TFSC; and (4) Module assembly and integration process: After proper testing and inspection, the fabricated 3-D TFSC are then optionally mechanically reinforced, interconnected, encapsulated and mounted in the panels.

The see-through holes are preferably made after the release of the 3-D TFSS and before the surface passivation step by using the opening patterning and etching methods in the present invention. Alternatively, the see-through-hole making process could be conducted after in other process modules, such as before or after the metallization steps. However, the preferred approach is to create the see-through holes after the substrate release and before the surface passivation and cell metallization processes.

Figure 9:
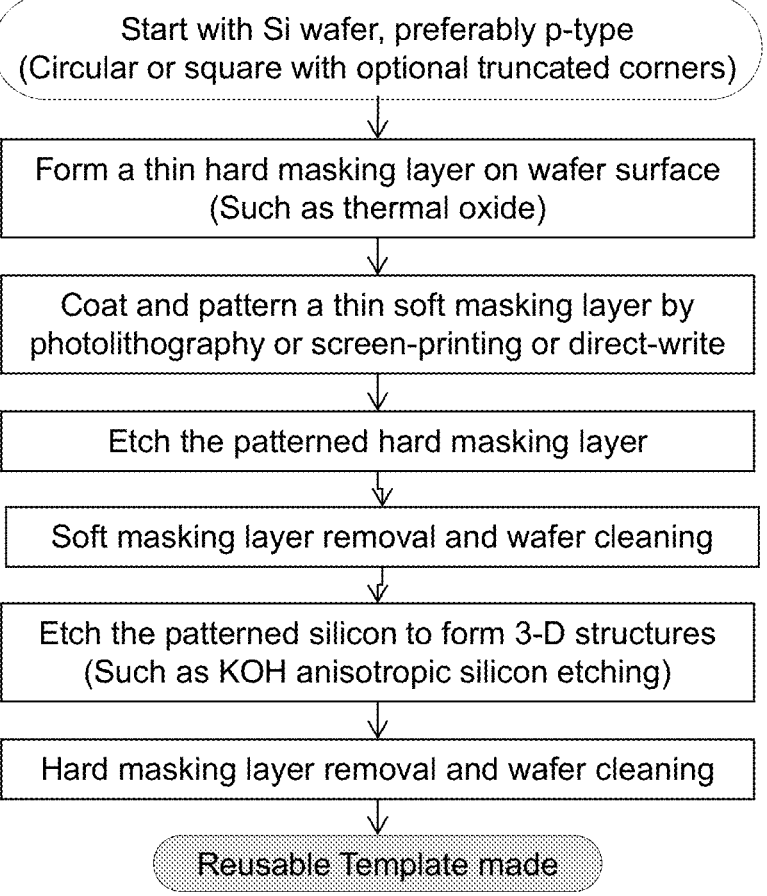
FIGS. 9 thru 13 are process flows outlining several embodiments for fabricating a 3-D TFSS with see-through holes.

FIG. 9 is a process flow outlining the major process steps and options for the fabrication of a re-usable semiconductor template with etched 3-D structures in accordance with the disclosed subject matter. The fabrication process starts from single-crystal (100) semiconductor wafer with polished or non-polished surfaces. The wafer shapes may be circular, square with truncated or rounded corners, and hexagonal. The wafer size may be in the range of 100 mm to 300 mm (or larger in size) with thickness in the range of 0.5 mm to a few millimeters. The first fabrication process involves forming a hard masking layer, such as a thermally grown semiconductor dioxide ($SiO_2$) or LPCVD semiconductor nitride ($SiN_x$), on the wafer surface. In one embodiment, the hard mask layer is formed on all the wafer exposed surfaces, and in another embodiment, the hard masking layer is formed only on the front wafer surface where the patterning are to be made. The hard masking layer thickness is between 0.1 um to 1.5 um. In one embodiment, a photoresist pattern is generated on top of the hard mask layer by photolithography steps including spin-coating (or spray coating), baking, aligned exposure and developing. In another embodiment, a soft mask layer with defined patterns is screen-printed on top of the hard mask layer for reduced fabrication costs. In both embodiments, the patterns are aligned to the wafer (100) direction on the surface of the wafer. In the next step, the exposed hard mask layer is chemically etched. For example, the photoresist pattern is transferred into the oxide layer by etching the exposed oxide with buffered HF solution. The oxide etching step may require using a mechanical fixture for protecting the wafer edge and back surfaces from being etched. Alternatively, the etch process can be performed in a setup allowing only the front wafer surface to be exposed to the hard mask etching chemical. After that the remaining photoresist layer is removed by plasma asking or wet photoresist stripping. The patterned semiconductor dioxide layer is used as a hard mask layer during anisotropic semiconductor etching.

In the next step, anisotropic semiconductor etching, such as KOH (potassium hydroxide) or TMAH (tetramethylammonium hydroxide) solutions, is used to etch the exposed semiconductor area. Anisotropic wet etching of crystalline semiconductor is one of the key technologies for semiconductor micromachining. Due to differing chemical reactivity of certain crystal planes of the semiconductor, anisotropic etchants etch much faster in one direction than in another, exposing the slowest etching crystal planes over time. As an example, when etching a (100) semiconductor wafer with patterned hard mask particularly oriented, an anisotropic etching slow down markedly at (111) planes of semiconductor, relative to their etch rates for other planes. As a result, the etching exhibits perfectly flat surfaces and well-defined angles. The typical etch temperature is in the range of 50° C. to 80° C. and etch rate is about 0.2 um/min to 1 um/min. The KOH or TMAH semiconductor etch rate depends upon the orientations to crystalline semiconductor planes. The (111) family of crystallographic planes are etched at a very slow rate and are normally "stop" planes for the anisotropic etching of a (100) semiconductor wafer with patterned hard mask. As a result, the intersection of two (111) planes or a (111) plane with a bottom (100) plane produce anisotropic etching structures for (100) semiconductor wafers after a time-controlled etch. Examples of these structures include V-grooves and pyramidal cavities with sharp tip cavity bottom (where (111) planes meet) or a small flat cavity bottom (a remaining (100) plane). During the semiconductor etching, the wafer backside and edge surfaces are fully protected by un-patterned oxide layer. The KOH etch may be timely controlled so that a certain inverted pyramidal cavity depth may be reached. Alternatively, the KOH etching may be self-terminated when the (111) walls forming the inverted pyramidal cavity meet at the cavity bottom/apex. After the KOH etching, remaining oxide layers are thinner than before the etching because the oxide is also etched in the KOH or TMAH solution, but with a much slower etch rate than the semiconductor etch.

One of key advantages of using anisotropic wet semiconductor etching, such as Potassium Hydroxide (KOH), is its repeatability and uniformity in semiconductor etching while maintaining a low production cost. In addition, when the KOH etching reaches (111) crystallographic planes, it etches the (111) planes with substantially slower etch rates. As a result, the manufacturing etching process is convenient to control with much wider process control windows and much lower cost than other semiconductor etching methods, such as DRIE semiconductor dry etching. Examples of anisotropic etchants include KOH, NaOH, TMAH, and EDP. In the case that wafer edge and backside surfaces are also covered with hard mask layer, the wafers may be etched in a batch semiconductor etching solution. However, in the case the wafer edge or backside are exposed without hard mask layer, the wafer can only be etched in a setup that only allows the front side of the wafer to be exposed to the semiconductor etching solution. After the semiconductor etching, the remaining hard mask layer is removed by chemical etching, such as in an HF solution for oxide removal. Next, the etched semiconductor wafers are cleaned in standard wafer cleaning processes, such as RCA1 and RCA2 cleanings. Now, the semiconductor template is made and ready for making the 3-D TFSS in the following process flows.

In another embodiment of making the semiconductor template, direct laser micromachining is used to spatially and selectively to remove the hard mask layer. By doing so, the need of soft-mask patterning (photolithography or screen printing) is eliminated. After the laser ablation, anisotropic semiconductor etching such as KOH etching is used to form pyramid structure as described.

In yet another embodiment of making the semiconductor template, direct laser micromachining is used. Laser beam are programmed to scan across the wafers surface and create the periodic patterns with certain depth. After that the semiconductor debris and heat affected zones are etched in an anisotropic semiconductor etching solution (such as KOH) after a quick etch in a HF solution to remove the thin oxide layer on the laser processed areas. Since the debris and heat affected zones have a higher etch rate in anisotropic etch solution than crystallographic semiconductor, after a time-controlled etched, the inverted pyramid structures of the disclosed subject matter may be realized. In this method, using hard and soft masking layers may be avoided for reducing the fabrication costs.

Figure 10:
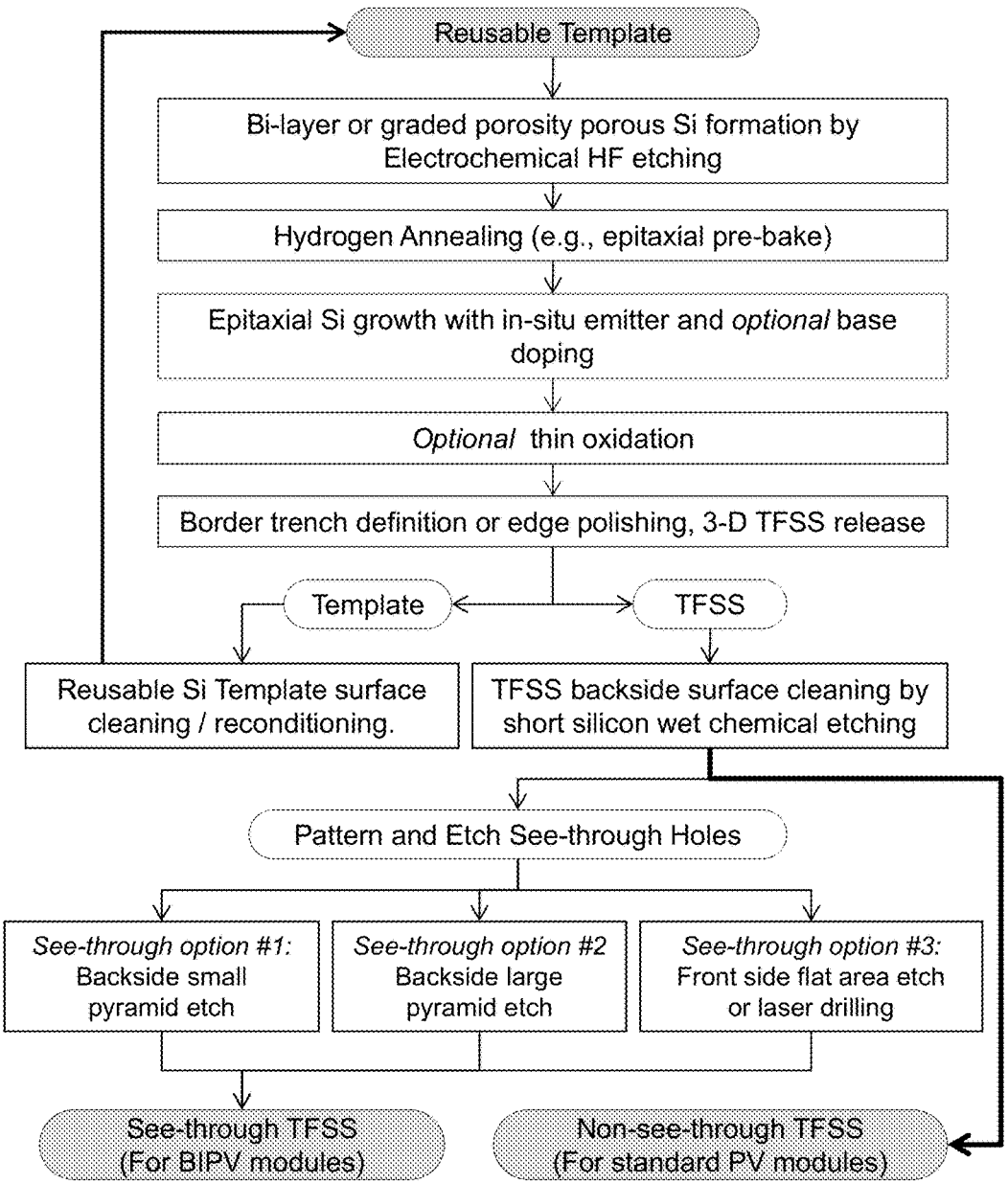

FIG. 10 outlines one embodiment of the 3-D TFSS fabrication process flow, in which the emitter and optional base doping is done in-situ during epitaxial semiconductor growth. The fabrication process starts with forming a bi-layer (or graded porosity) porous layer on the front structured surface of a reusable semiconductor template. The porous semiconductor layer is formed by electrochemical HF etching and is used as a sacrificial layer for epitaxial semiconductor layer release. The porous semiconductor layer preferably consists of two thin layers with different porosities. The first thin porous semiconductor layer is on top and is first formed from the bulk semiconductor wafer. The first thin layer preferably has a lower porosity of 15%~30%. The second thin porous semiconductor layer is directly grown from the bulk semiconductor and is underneath the first thin layer of porous semiconductor. The $2^{nd}$ thin porous semiconductor layer preferably has a higher porosity in the range of 50%~80%. The top lower porosity layer is used as a crystalline seed layer for high quality epitaxial semiconductor growth and the underneath higher porosity porous semiconductor layer is used for the easy release of the TFSS from the template due to its less dense physical connections (between the epitaxial and bulk semiconductor interfaces) and its weaker mechanical strength. Alternatively, a porous semiconductor release layer with a progressively increased porosity from top to bottom may also be used. In this case, the top portion of the porous semiconductor layer has a low porosity of 15% to 30% and the lower portion of the porous semiconductor layer has a high porosity of 50% to 80%. Before the epitaxial semiconductor growth, the wafer is baked in a high temperature (at 950° C. to 1150° C.) hydrogen environment within the epitaxial semiconductor deposition reactor in order to form coalesced structures (with relatively large voids) within the higher-porosity buried porous semiconductor layer while forming a continuous surface seed layer of crystalline semiconductor on the top of the lower-porosity porous semiconductor layer. Next, an in-situ-doped mono-crystalline semiconductor epitaxial layer is deposited on the frontside only. The bulk base of the epitaxial layer is p-type, boron ($B_2H_6$) doped, while the lower base region (initial epitaxial growth at bottom) may be heavily p-type doped and emitter region (end epitaxial growth at top) is n-type, phosphorus ($PH_3$) doped. In an alternative method, only the base is in-situ-doped, while the emitter doping may be conducted after the release of TFSS by a variety of methods, such as diffusion, ion-implantation, and alloying with aluminum contact. Not only does the in-situ-doped epitaxial growth provide the most convenient creation of emitter and base doping, but also allows the active tuning/controlling of the doping type and concentration across the epitaxial layer thickness. The thickness of the epitaxial layer is in the range of 1 um to 60 um. Next, an optional thin oxidation step is conducted to grow a less than 100 nm thick oxide on the top epitaxial semiconductor surface. The thin oxide layer could be used as a sacrificial hard masking layer to etch the remaining porous semiconductor layer and quasi-mono-crystalline-semiconductor (QMS) layer after the 3-D TFSS release. In the next step, prior to the release, a border definition trench is made on the peripheral of the active wafer area to facilitate the release.

Detailed methods of making the border definition trenches include a double-trench method. An inner shallow trench defines the outer boundary of the finished 3-D TFSS. The outer deep trench is cut through porous silicon layer and provides access to the porous silicon layer so that the 3-D TFSS may be released. The encompassing trenches are formed by controlled laser cutting and their depths are in the range of 5 um to 100 um. The trenches define the boundary of the 3-D TFSS to be released and allow initiation of the release from the trenched region. In another embodiment, instead of making the laser cut, the wafer edge is polished by an abrasive tape for removing the epitaxial semiconductor wrap-around and exposes the porous semiconductor layers at the wafer edge. In yet another embodiment, instead of making laser cut trenches on the front surface, the wafer or a batch of wafer stacked together could be edge-ground to a controlled depth in order to facilitate the entire epitaxial semiconductor layer to be released from the template. In the next step, the epitaxial layer of semiconductor is released/separated from the template. U.S. Patent Publication No. 2010-0022074 filed May 28, 2009 entitled, SUBSTRATE RELEASE METHODS AND APPARATUS, by the common inventors David Xuan-Qi Wang Mehrdad M. Moslehi is hereby incorporated by reference. The above reference patent application discloses detail methods of releasing the epitaxial layer to form a released 3-D TFSS. In one method, the 3-D TFSS is released in an ultrasonic DI-water bath. In yet another method, the 3-D TFSS is released by direct pulling with wafer backside and top epitaxial vacuum chucked. After removal of the epitaxial semiconductor layer from the template, the template is cleaned by using diluted HF and diluted wet semiconductor etch solution, such as TMAH and/or KOH to remove the remaining porous semiconductor layers and semiconductor particles. Then the template is further cleaned by conventional semiconductor wafer cleaning methods, such as RCA1 and/or RCA2 wet cleaning to removal possible organic and metallic contaminations. Finally, after proper rinsing with DI water and drying, the template is ready for another re-use cycle. Next, the released TFSS backside surface is cleaned by short semiconductor etching using KOH or TMAH solutions to remove the semiconductor debris and fully or partially remove the QMS layer.

In the case of making a see-through 3-D TFSS, one embodiment of the disclosed subject matter is to etch the see-through openings from the small pyramids according to a self-aligned process that includes hard mask layer and/or soft mask layer coatings, controlled anisotropic semiconductor etching and other process steps. In another see-through holes making process, the openings are etched from the large pyramids and the process also includes self-aligned coating, mechanical lapping and etching steps. In yet another see-through hole making process, the openings are made from flat area by laser drilling or coating, photolithography and controlled semiconductor etching. The detail embodiments of the see-through hole making processes are disclosed in the later sections of the present application.

After forming the see-through holes, the remaining mask layer is removed by chemical etching and the see-through 3-D TFSS is cleaned by standard RCA1 and RCA2 cleaning following by DI water rinsing and drying. The cleaning of the 3-D TFSS with or without see-through holes may require proper fixtures to protect the TFSS from mechanical damages during cleaning and drying. The cleaned 3-D TFSS with or without see-through holes, is ready for the subsequent cell process.

Figure 11:
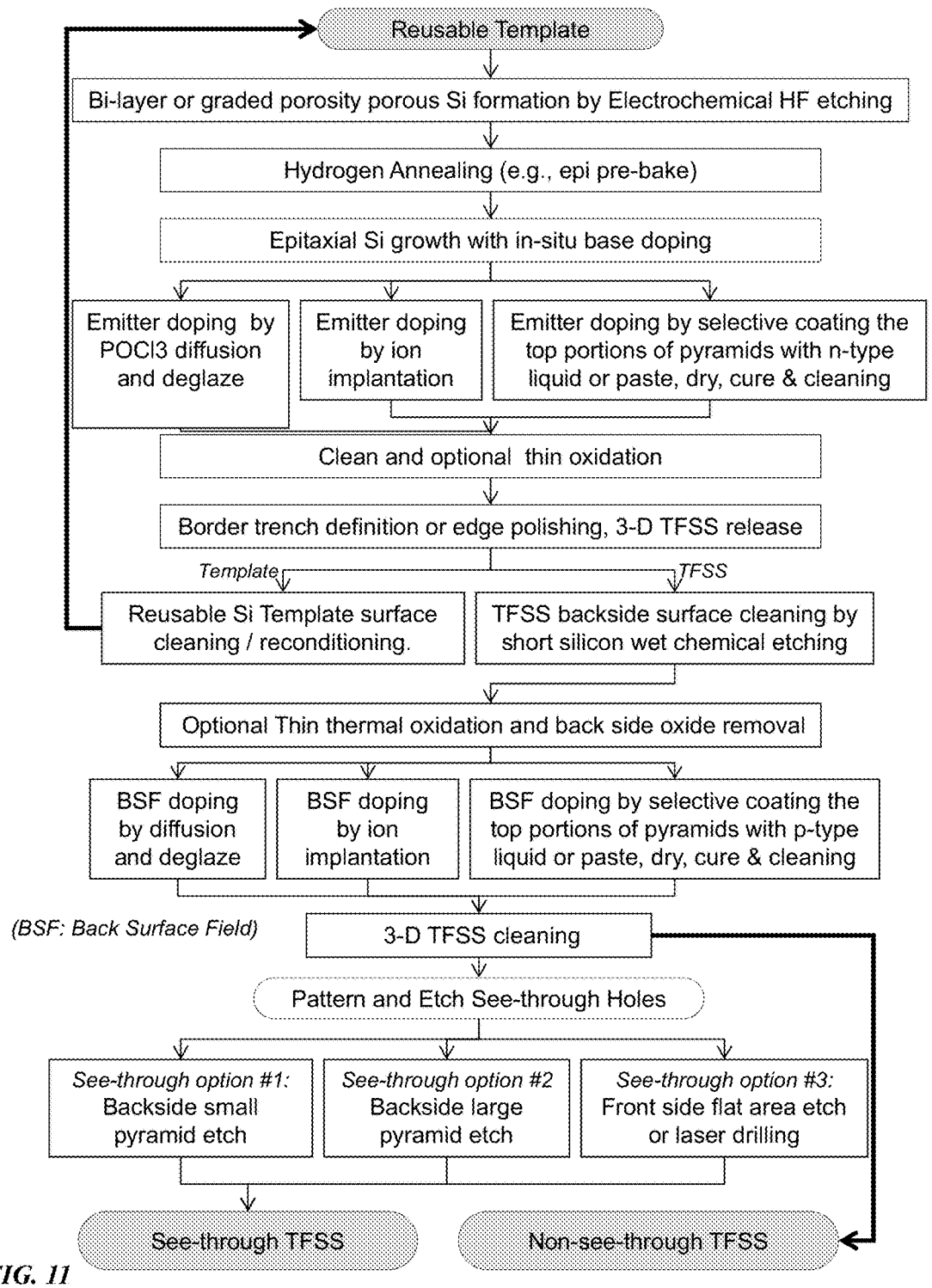

FIG. 11 outlines an embodiment of the process flow for fabrication of the 3-D TFSSs with or without see-through holes.

In this process flow, the emitter and BSF doping is conducted after the epitaxial semiconductor growth process but before the 3-D TFSS release. The process of forming the bi-layer porous semiconductor is same as described in the above section for FIG. 10. After forming the porous semiconductor layers and subsequent hydrogen annealing, epitaxial semiconductor is grown on top of the porous semiconductor layers. In this case, there is no particular emitter and BSF doping process to be conducted except a uniform or graded p-type, boron doping to provide a p-type epitaxial semiconductor layer with a thickness of 1 um to 60 um. Note that all the doping polarities for emitter and base may be inverted (i.e., p-type emitter and n-type base). After the epitaxial semiconductor growth and before the 3-D TFSS release, the emitter doping is conducted by phosphorus diffusion in furnace equipment by using POCl3 phosphorus doping source. After the diffusion process, HF solution based chemical etching is used to remove the phosphorus glass on the top surface in a deglazing process. In another embodiment of emitter doping, ion implantation of n-type doping source can be conducted followed by annealing. In yet another embodiment, liquid or paste n-type doping source can be coated and cured on the top portions (ridges) of the epitaxial semiconductor layer by self-aligned spatially selective coating, such as roller coating, screen printing or dip coating. After drying/curing (250° C. to 400° C.) and thermal annealing (800° C. to 950° C.), the remaining dried doping source layer is removed by chemical etching, such as in a HF solution. The roller coating, screen printing and dip coating methods are types of so-called "Liquid Transfer Coating" (LTC). Examples of LTC methods are disclosed in U.S. Patent Publication No. 2009-0042320, entitled, METHODS FOR LIQUID TRANSFER COATING OF THREE-DIMENSIONAL SUBSTRATES, by common inventors David Xuan-Qi Wang and Mehrdad M. Moslehi is hereby incorporated by reference. Other methods may also be used for this spatially selective etch liquid/paste coating. It is to be noted that the methods of using ion implantation and liquid/paste selective coating of the doping source for emitter doping could provide selective emitters that are heavily doped. In other words, on the front side, the top ridge region is doped with n++ and pyramid sidewall areas are doped with n+. The selective emitter doping effects can provide higher cell efficiencies than non selective emitter cells. In the next step, an optional thin oxidation step is conducted to grow an oxide layer less than 100 nm thick on the top epitaxial semiconductor surface. The thin oxide layer could be used as a hard masking layer to etch the remaining porous semiconductor layer and QMS layer after the 3-D TFSS release. Next, as described above, border trenches are cut into the semiconductor surface by laser cutting. Alternatively, the wafer edge is polished by an abrasive tape for removing the epitaxial semiconductor wrap-around and exposes the porous semiconductor layers at the wafer edge. Then the 3-D TFSS is released from the template by either ultrasonic DI water bath or direct mechanical pulling with vacuum chucking from both sides. The semiconductor template is then cleaned by short semiconductor etching using KOH or TMAH solutions to remove the semiconductor debris and restore the good quality template surface and profile. After the standard RCA1 and RCA2 chemical cleaning, DI water rinsing and drying, the template is sent for the next reuse cycle. Next, the released TFSS backside surface is cleaned by short semiconductor etching using KOH or TMAH solutions to remove the semiconductor debris and fully or partially remove the QMS layer. Another optional thin oxidation process is then conducted and the backside oxide layer is then removed to expose the TFSS backside semiconductor surface.

Shown, there are three options/embodiments for performing BSF p-type doping. One embodiment is achieved by furnace equipment based diffusion of p-type (boron) doping. After the diffusion, HF solution based chemical etching is used to remove the thin glass layer on the back surface in a deglazing process. In another embodiment of BSF doping, ion implantation of p-type doping source can be conducted following by annealing. In yet another embodiment, liquid p-type doping source can be coated and cured on the backside surface by self-aligned spatially selective coating, such as roller coating, dip coating or screen printing.

After drying/curing (250° C. to 400° C.) and thermal annealing (800° C. to 950° C.), the remaining dried doping source layer is removed by chemical etching such as in a HF solution. The roller coating, screen printing and dip coating methods are types of so-called "Liquid Transfer Coating" (LTC). Examples of LTC methods are disclosed in U.S. Patent Publication No. 2009-0042320, entitled, METHODS FOR LIQUID TRANSFER COATING OF THREE-DIMENSIONAL SUBSTRATES, by common inventors David Xuan-Qi Wang and Mehrdad M. Moslehi which is incorporated by reference. Other methods may also be used for this spatially selective etch liquid/paste coating. It is to be noted that the methods of using ion implantation and liquid/paste selective coating of the doping source for BSF doping may provide selective BSF that are heavily doped. In other words, on the back side, the pyramid tip region is doped with p++ and pyramid sidewall areas are doped with p+ back surface field (BSF). After forming the emitter and optional back surface field base regions, the 3-D TFSS is ready for downstream cell process.

In the case of making a see-through 3-D TFSS, as described for FIG. 10, the see-through openings are etched from the small pyramids in a self-aligned process that includes hard mask layer and/or soft mask layer coatings, controlled anisotropic semiconductor etching and other process steps. In another see-through holes making embodiment, the openings are etched from the large pyramids and the process also includes self-aligned coating, mechanical lapping and etching steps. In yet another see-through hole making embodiment, the openings are made from flat areas by laser drilling or coating, photolithography and controlled semiconductor etching. The detailed embodiments of the see-through hole making processes are disclosed in the later sections of the present application.

After forming the see-through holes, the remaining mask layer is removed by chemical etching and the see-through 3-D TFSS is cleaned by standard RCA1 and RCA2 cleaning following by DI water rinsing and drying. The cleaning of the 3-D TFSS with or without see-through holes may require proper fixtures to protect the TFSS from mechanical damages during cleaning and drying. The cleaned 3-D TFSS with or without see-through holes, is ready for the subsequent cell process.

Figure 12:
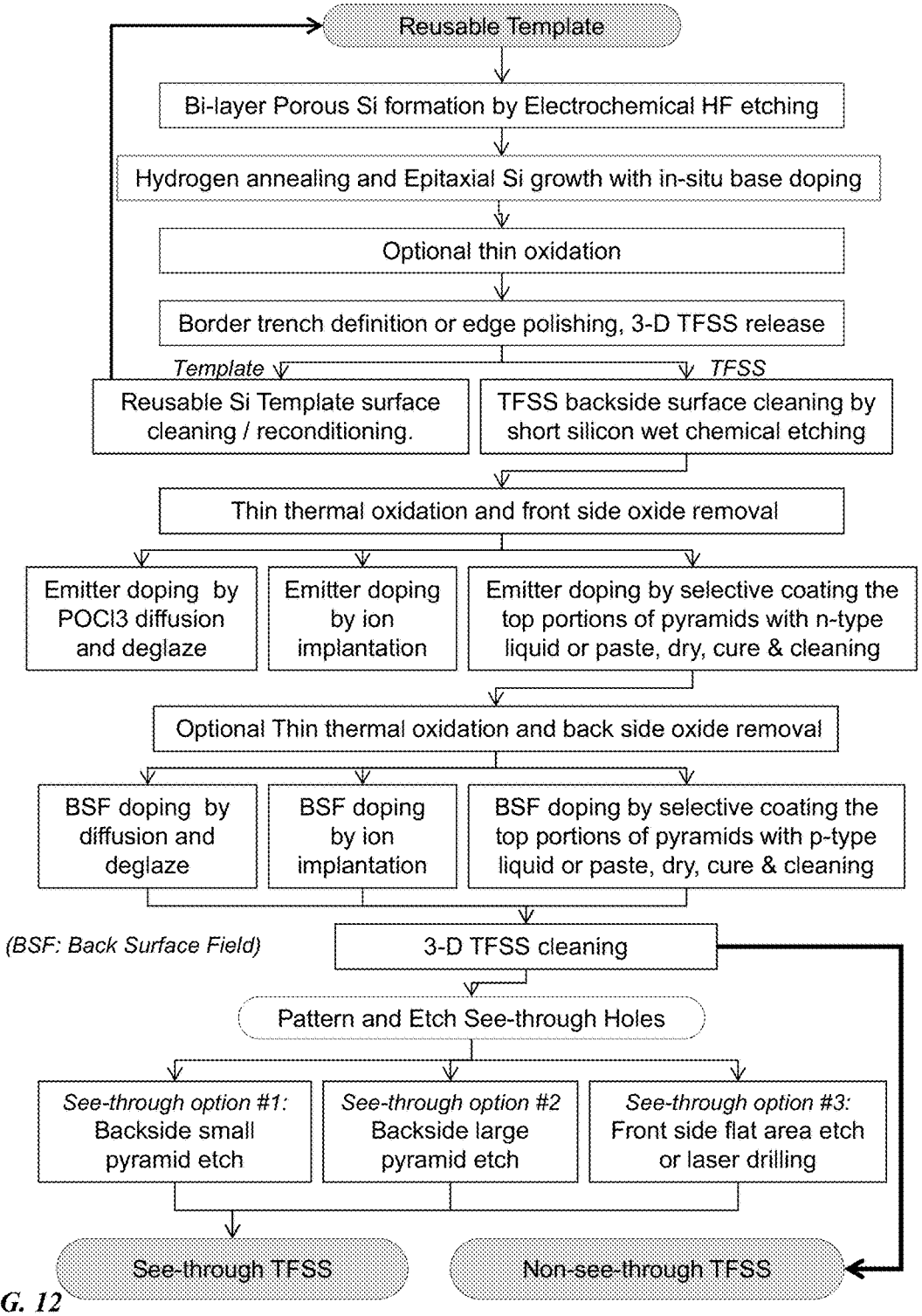

FIG. 12 outlines yet another embodiment of a process flow for fabrication of the 3-D TFSSs with or without see-through holes. In this embodiment, the emitter and BSF doping is conducted after the 3-D TFSS release. The process of forming the bi-layer porous semiconductor is same as described in the above section for FIG. 10. After forming the porous semiconductor layers and subsequent hydrogen annealing, epitaxial semiconductor is grown on top of the porous semiconductor layers. In this case, there is no particular emitter and BSF doping process to be conducted except an optional uniform low level p-type, boron doping to provide a p-type epitaxial semiconductor layer with a thickness of 1 um to 60 um. In the next step, an optional thin oxidation step is conducted to grow a less than 100 nm thick oxide on the top epitaxial semiconductor surface. The thin oxide layer could be used as a hard masking layer to etch the remaining porous semiconductor layer and QMS layer after the 3-D TFSS release. Next, as described in the earlier, border trenches are cut into the semiconductor surface by laser cutting. Alternatively, the wafer edge may be polished by an abrasive tape for removing the epitaxial semiconductor wrap-around and exposes the porous semiconductor layers at the wafer edge. Then the 3-D TFSS is released from the template by either ultrasonic DI water bath or direct mechanical pulling with vacuum chucking from both sides. The semiconductor template is then cleaned by short semiconductor etching using KOH or TMAH solutions to remove the semiconductor debris and restore the good quality template surface and profile. After the standard RCA1 and RCA2 chemical cleaning, DI water rinsing and drying, the template is sent for the next reuse cycle. Next, the released TFSS backside surface is cleaned by short semiconductor etching using KOH or TMAH solutions to remove the semiconductor debris and fully or partially remove the QMS layer. Next, a thin oxidation is thermally grown on the 3-D TFSS and frontside oxide is then removed to expose the semiconductor surface for emitter doping.

Shown are three options/embodiments for performing emitter n-type doping. In the first embodiment, the emitter doping is conducted by phosphorus diffusion in furnace equipment by using POCl3 phosphorus doping source. After the diffusion process, HF solution based chemical etching is used to remove the phosphorus glass on the top surface in a deglazing process. In another embodiment of emitter doping, ion implantation of n-type doping source can be conducted following by annealing. In yet another embodiment, liquid/paste n-type doping source can be coated and cured on the top portions (ridges) of the epitaxial semiconductor layer by self-aligned spatially selective coating, such as roller coating, screen printing or dip coating. After drying/curing (250° C. to 400° C.) and thermal annealing (800° C. to 950° C.), the remaining dried doping source layer is removed by chemical etching such as in an HF solution. The roller coating, screen printing and dip coating methods are types of so-called "Liquid Transfer Coating" (LTC). Examples of LTC methods are disclosed in U.S. Patent Publication No. 2009-0042320, entitled, METHODS FOR LIQUID TRANSFER COATING OF THREE-DIMENSIONAL SUBSTRATES, by David Xuan-Qi Wang and Mehrdad M. Moslehi is hereby incorporated by reference. Other may also be used for this spatially selective etch liquid/paste coating. It is to be noted that the methods using ion implantation and liquid/paste selective coating of the doping source for emitter doping may provide selective emitters that provide heavily doped emitter contact regions. In other words, on the front side, the top ridge region is doped with heavier n++ doping and pyramid sidewall areas are doped with lighter n+ doping. Next, before optional base back surface field doping, another thin layer of oxide is thermally grown on the TFSS and the backside oxide is then removed to expose the backside semiconductor surface.

Shown are three options/embodiments for performing back surface field (BSF) p-type doping. One process uses furnace equipment based diffusion of p-type (boron) doping. After the diffusion, HF solution based chemical etching is used to remove the thin glass layer on the back surface in a deglazing process. In another process embodiment of BSF doping, ion implantation of p-type doping source can be conducted following by annealing. In yet another embodiment, liquid/paste p-type doping source can be coated and cured on the backside surface by self-aligned spatially selective coating, such as roller coating, dip coating or screen printing. After drying/curing (250° C. to 400° C.) and thermal annealing (800° C. to 950° C.), the remaining dried doping source layer is removed by chemical etching such as in an HF solution. The roller coating, screen printing and dip coating methods are types of so-called LTC. Other methods may also be used for this spatially selective etch liquid/paste coating. It is to be noted that the methods of using ion implantation and liquid/paste selective coating of the doping source for back surface field (BSF) doping may provide selective bases that are heavily doped. In other words, on the back side, the pyramid tip region is doped with p++ (for reduced base contact resistance) and pyramid sidewall areas are doped with p+.

After forming the emitter and BSF regions, the 3-D TFSS is ready for downstream cell process. In the case of making a see-through 3-D TFSS, same as described in FIG. 10, one embodiment is to etch the see-through openings from the small pyramids using a self-aligned process that includes hard mask layer and/or soft mask layer coatings, controlled anisotropic semiconductor etching and other process steps. In another see-through holes making embodiment, the openings are etched from the large pyramids and process also includes self-aligned coating, mechanical lapping and etching steps. In yet another see-through hole making embodiment, the openings are made from flat area by laser drilling or coating, photolithography and controlled semiconductor etching. The detail embodiments of the see-through hole making processes are disclosed in the later sections of the present application.

After forming the see-through holes, the remaining mask layer is removed by chemical etching and the see-through 3-D TFSS is cleaned by standard RCA1 and RCA2 cleaning following by DI water rinsing and drying. The cleaning of the 3-D TFSS with or without see-through holes may require proper fixtures to protect the TFSS from mechanical damages during cleaning and drying. The cleaned 3-D TFSS with or without see-through holes, is ready for the subsequent cell process.

Figure 13:
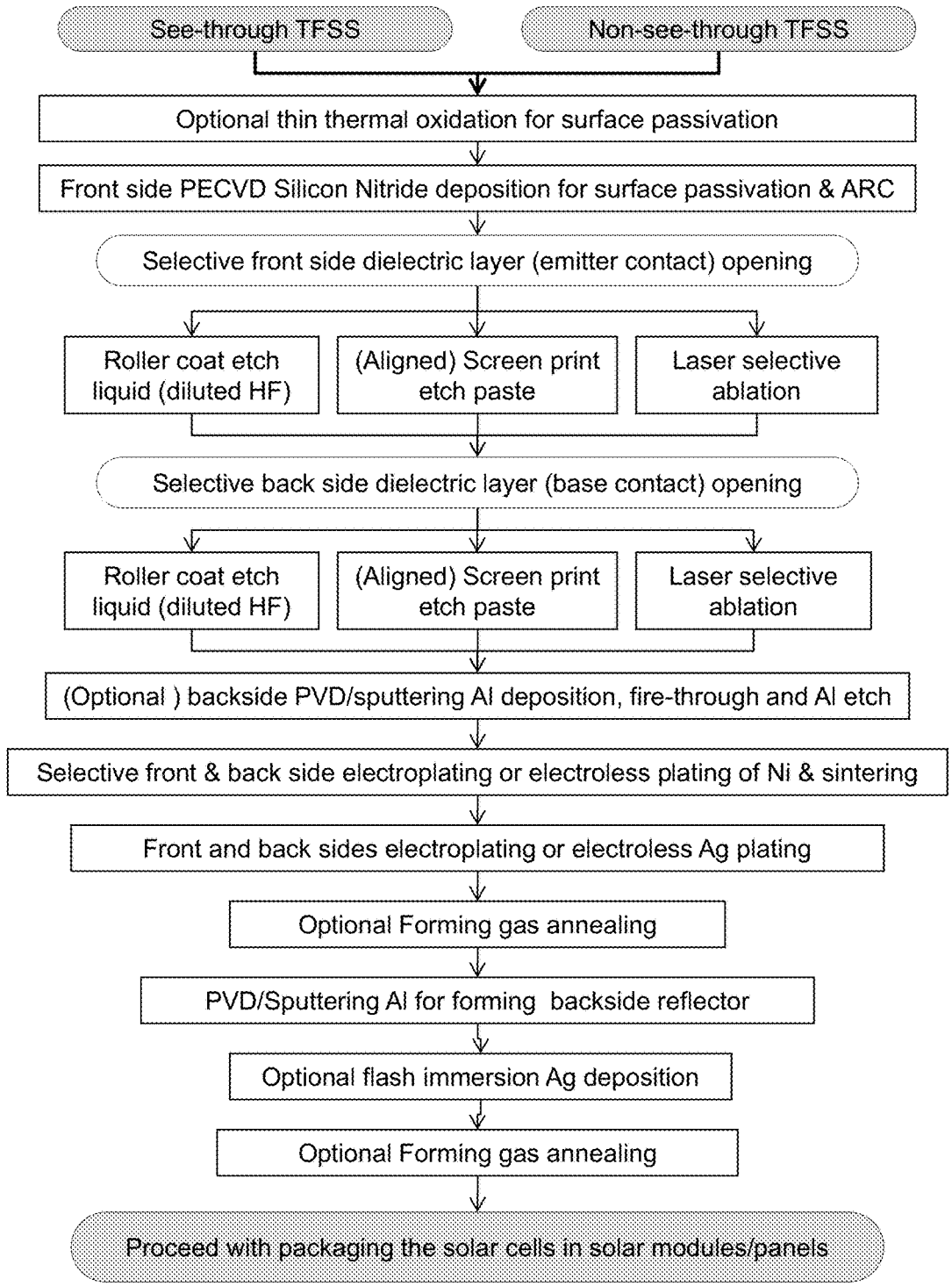

FIG. 13 outlines a process flow for the fabrication a 3-D TFSC with or without see-through holes. The process steps include surface passivation on front and back surfaces of the released 3-D TFSS, anti-reflection layer coating, selective and local dielectric layer opening, emitter and base metal plating, and back reflector metal deposition.

After surface cleaning of the 3-D TFSS, the process starts with surface passivation. As an example, a thin semiconductor oxide ($SiO_2$) of 3 nm to 100 nm thick is thermally grown by oxidation in the temperature range of 800° C. to 950° C. to serve as the passivation layer for both sides. Next, a 3 nm to 100 nm thick PECVD semiconductor nitride ($SiN_x$) is deposited on the front side oxide surface for serving as an anti-reflection (ARC) layer and another front surface passivation layer. As an alternative to or in addition to the thin thermal oxide, a thin layer of reactive sputtered or PECVD deposited aluminum oxide ($AlO_x$) or PECVD $SiN_x$ may be used for the back surface passivation. Next, the emitter and base contact areas are subsequently opened by spatially selective etching of dielectric layer(s). In one embodiment, dielectric etching liquid, such as diluted HF, is roller coated or dip coated to the front ridge or the back pyramid tip regions for direct etching the dielectric layers to be opened. After the etching, the 3-D TFSS is rinsed with DI water and dried. In another embodiment, the dielectric etching paste is screen printed on the front ridge or the back pyramid tip regions followed by a heated curing step. During the heating, the dielectric layer is etched by the coated etch paste.

After the etching, the remaining etch paste is strip and the 3-D TFSS is cleaned. The roller coating, screen printing and dip coating methods are types of so-called LTC. Other methods may also be used for this spatially selective etch liquid/paste coating. In yet another embodiment, controlled laser ablation is used to selectively remove the dielectric layers. In order to effectively remove the dielectric layer without or minimum damage to the underneath semiconductor surface, short-pulsed (Pico-second) UV laser is preferred. In yet another embodiment, photolithography patterning of the emitter and base contact opening could be conducted. In this method, photoresist is sprayed and dried following by aligned exposure and resist developing. Upon creating the contact opening pattern by photoresist, chemical etching of the exposed dielectric layers may be conducted. Then the remaining resist layer is removed. The above methods of spatially selective etching of dielectric layers may be used for both emitter and base contact openings; however the etching source material may be different. After the emitter and base contact openings process, an optional aluminum (Al) deposition by evaporation or sputtering is conducted on the TFSS backside followed by an annealing/fire-through at 800° C. to 950° C. The annealing process provide Al—Si alloy and form p++ region at base contact. This p++ base contact is effective in the case that boron p++ region is not performed by the earlier diffusion process. The remaining aluminum at TFSS backside can be optionally removed. Next, the emitter and base metallization is conducted by selective electroplating or electroless plating of nickel (Ni) in the thickness range of 50 nm to 300 nm following by optional Ni sintering. Next, electroplating or electroless plating of Ag is conducted on both the emitter and base contact regions. The Ni and Ag plating may be replaced by Cu plating with a suitable barrier layer (e.g. Ta). Next, an optional forming gas annealing (FGA) is performed at temperature range of 200° C. to 400° C. to reduce the interconnect resistance and help with surface/bulk passivation of metals. Next, a thin layer of Al is PVD, evaporation, or sputtered on the TFSC backside to serves as a back-reflection mirror. Optionally, the FGA process could be performed at this stage. In the next step, the fabricated 3-D TFSC is packaged in a solar module or panel.

Figure 14:
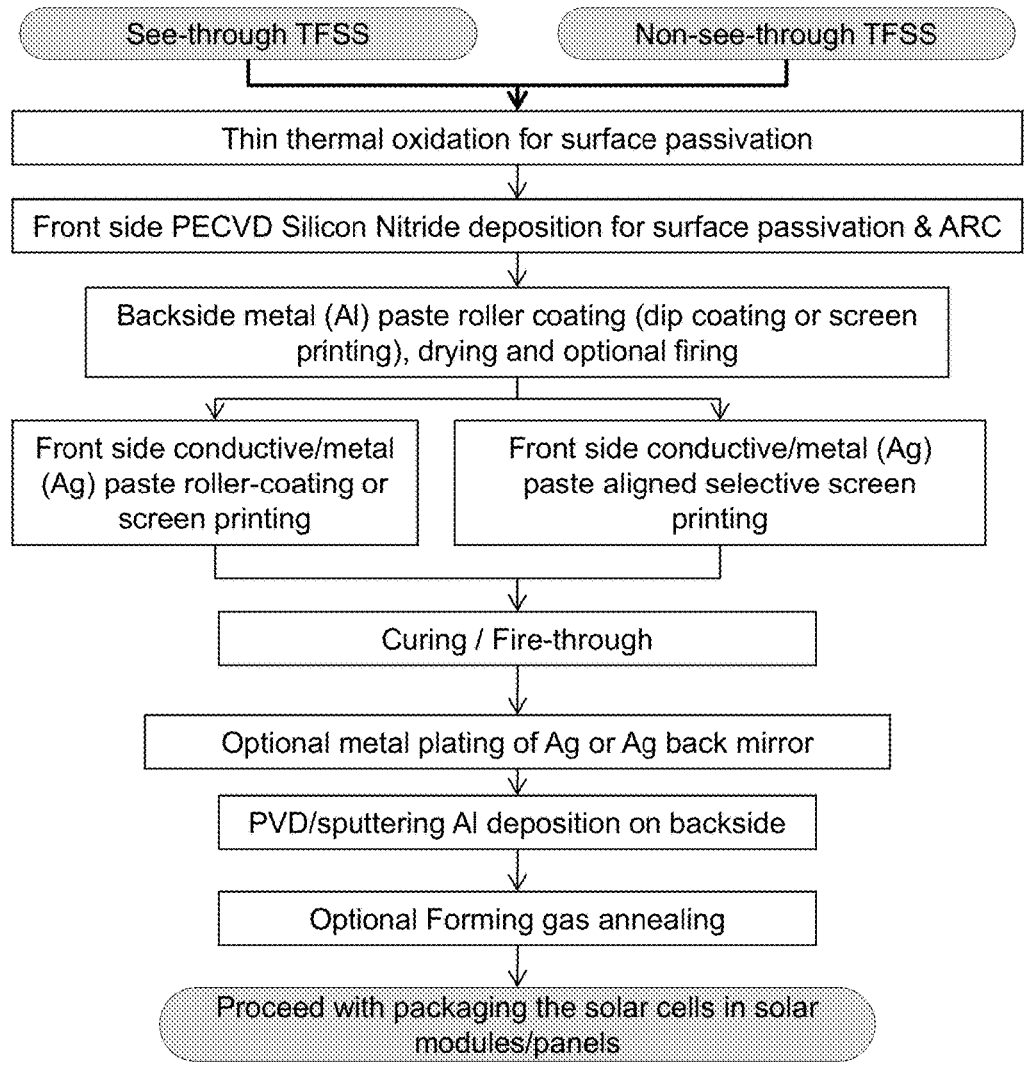
FIG. 14 outlines another process flow for fabrication of a 3-D TFSC with or without see-through holes.

FIG. 14 outlines another process flow for fabrication of a 3-D TFSC with or without see-through holes. The process steps include surface passivation on front and back surfaces of the released 3-D TFSS, anti-reflection layer coating, screen printed emitter and base metal contacts, and back reflector metal deposition. After surface cleaning of the 3-D TFSS, the process starts with surface passivation. As an example, a thin semiconductor oxide ($SiO_2$) of 3 nm to 100 nm thick is thermally grown by oxidation in the temperature range of 800° C. to 950° C. to serve as the passivation layer for both sides. Next, a 3 nm to 100 nm thick PECVD semiconductor nitride ($SiN_x$) is deposited on the front side oxide surface for serving as an anti-reflection (ARC) layer and another front surface passivation layer. Alternative or in addition to the thin thermal oxide, a thin layer of reactive sputtered or PECVD deposited aluminum oxide ($AlO_x$) or PECVD $SiN_x$ can be used for the back surface passivation. Backside (base) metallization is performed by coating metal paste or like to the backside pyramid tip regions. In the case that p++ base contact region is formed in the upstream diffusion process, Al paste could be used as the base contact metal. In the case that p++ base contact region has not been previously formed, Al is preferred to be the base metal since after annealing it may form a p++ base contact region from the Al—Si alloy. The Ag or Al paste can be roller coated, dip coated or screen printed in a self-aligned coating process, i.e. only the pyramid tip regions are coated. After drying/curing of the coated metal paste by IR or oven heating, the base metal fire-through process may be optionally performed so that the Al can be fired through the backside dielectric layer(s) and form direct metal to semiconductor base contact.

Next, emitter metallization coating is performed in two optional paths. In the first option, metal paste is roller-coated, dip-coated or screen-printed to the top ridge portions of the front surface in a self-aligned manner. Again, other liquid transfer coating methods, such as those disclosed in U.S. Patent Publication No. 2009-0042320, entitled, METHODS FOR LIQUID TRANSFER COATING OF THREE-DIMENSIONAL SUBSTRATES, by David Xuan-Qi Wang and Mehrdad M. Moslehi is hereby incorporated by reference, may also be used for the base and emitter metal paste coating process. In the second option, the metal paste is screen-printed with alignment to certain features on the 3-D TFSS, and results with only specific area, such as stripes of flat areas, coated with the metal paste. Next, the coated emitter metal paste is dried and fired through the front side surface passivation and ARC dielectric layers to form emitter contact. Both the emitter silver and base aluminum may be co-fired using a single thermal anneal step instead of two separate firing steps. After the front and back metal fire-through process, an optional electroplating or electroless plating of an Ag layer may be conducted for increased emitter and base electrical conductivity. The Ni and Ag plating may be replaced by Cu plating with a suitable barrier layer (e.g. Ta). Next, a thin layer of Al is deposited by evaporation or sputtering on the TFSC backside to serve as a back-reflection mirror. Next, an optional forming gas annealing (FGA) is performed at temperature range of 200° C. to 400° C. to reduce the interconnect resistance and help with surface/bulk passivation of metals. In the next step, the fabricated 3-D TFSC is packaged in a solar module or panel.

FIG. 15A through 15D illustrate schematic cross-sectional drawings of a template fabrication process. A mono-crystalline (100) semiconductor wafer of 100 mm to 300 mm is used for making the template. The thickness of the wafers is in the range of 0.5 mm to 2 mm. The template making process may also be applied onto a polished as well as non-polished surface. Alternatively, wafers with square or quasi-square shapes could also be used.

Figures 15A, 15B, 15C, 15D:
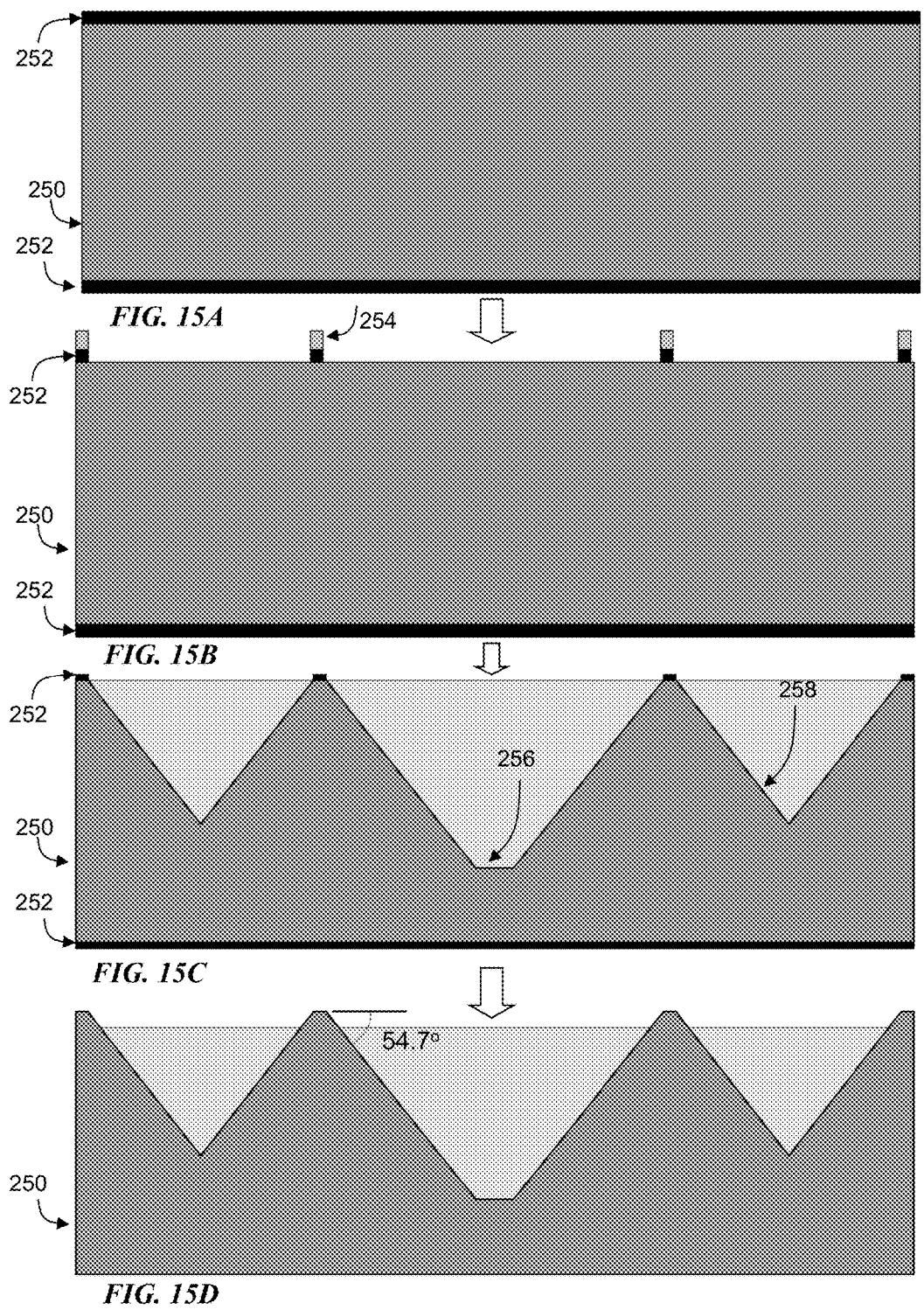
FIG. 15A through 15D illustrate schematic cross-sectional drawings of a template fabrication process.

As shown in FIG. 15A, a thermally grown oxide layer of semiconductor oxide 252, 0.5 um to 1.5 um thick, is used as the hard mask layer on (100) semiconductor wafer 250. The oxide on the wafer edge is not shown. Next, photolithographic defined or screen-printed photoresist pattern 254 is applied on the front wafer surface of (100) semiconductor wafer 250. The photolithography process includes photoresist coating, baking, exposure, developing and post baking. It is important the square-opening patterns are precisely aligned to the wafer <100> direction on the front surface. Next, the photoresist pattern is transferred to the front oxide layer, as shown in FIG. 15B, by controlled oxide etching in a buffered HF solution. After stripping off the remaining photoresist layer and wafer cleaning, the front oxide patterned wafer is etched in anisotropic semiconductor etch solution, such as KOH and TMAH. The etching temperature is in the range of 50° C. to 80° C.

As shown in FIG. 15C, the semiconductor wafer 250 backside and edge surfaces are fully protected by the un-patterned oxide layer during the KOH etching. The KOH etch can be timely controlled so that a certain pyramid cavity depth could be reached creating cavity surface 256 aligned along the (100) crystallographic plane. Alternatively, the KOH etching could be self-terminated when the four pyramid (111) sidewalls meet at the cavity bottom. Shown, sidewalls 258 are aligned along the (111) crystallographic plane. After the KOH etching, the remaining oxide layer is removed in diluted HF solution followed by standard wafer cleaning in RCA1 and RCA2 with DI water rinsing and drying.

FIG. 15D illustrates a made semiconductor template with mainly (111) semiconductor crystallographic planes on its front surface. And the angle between the cavity sidewalls to the lateral plane is 54.7°. The advantages of the template include (i) the template KOH etching process is more convenient to control and with low cost in manufacturing compared to other semiconductor etching methods, such as RIE dry etching; (ii) The (111) plane dominant 3-D structure provides good porous semiconductor forming uniformity and epitaxial semiconductor quality due to their sidewall smoothness and predictable and repeatable epitaxial growth rates; (iii) The dimensions, shape and profiles of the inverted pyramid structure on the template can be maintained conveniently and restored easily by a short KOH etching if needed after multiple template reuse cycles.

Figure 16A:
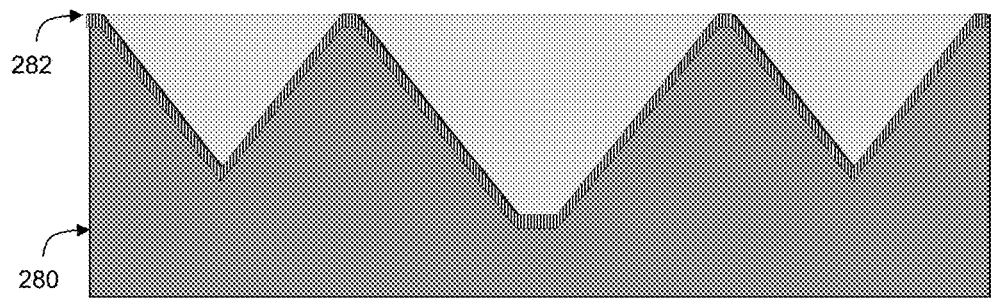
FIGS. 16A through 16C are cross-sectional drawings illustrating a 3-D TFSS fabrication process with in-situ emitter, base, and BSF doping.
Figure 16B:
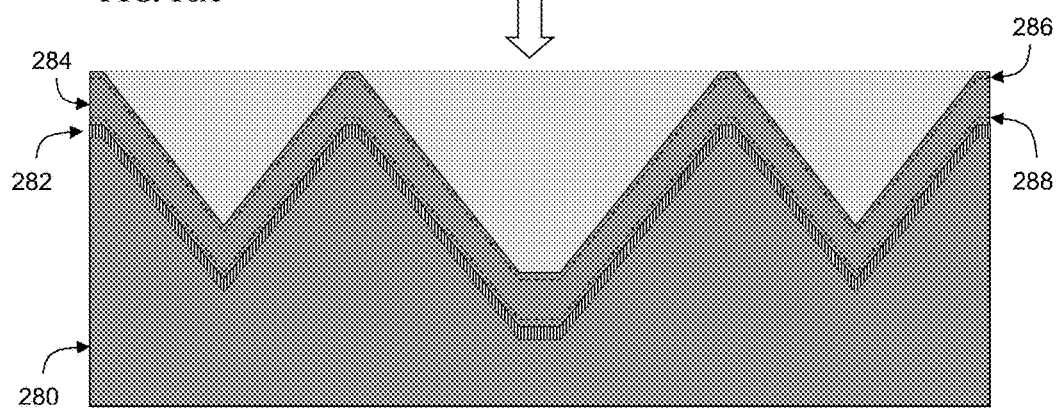
Figure 16C:
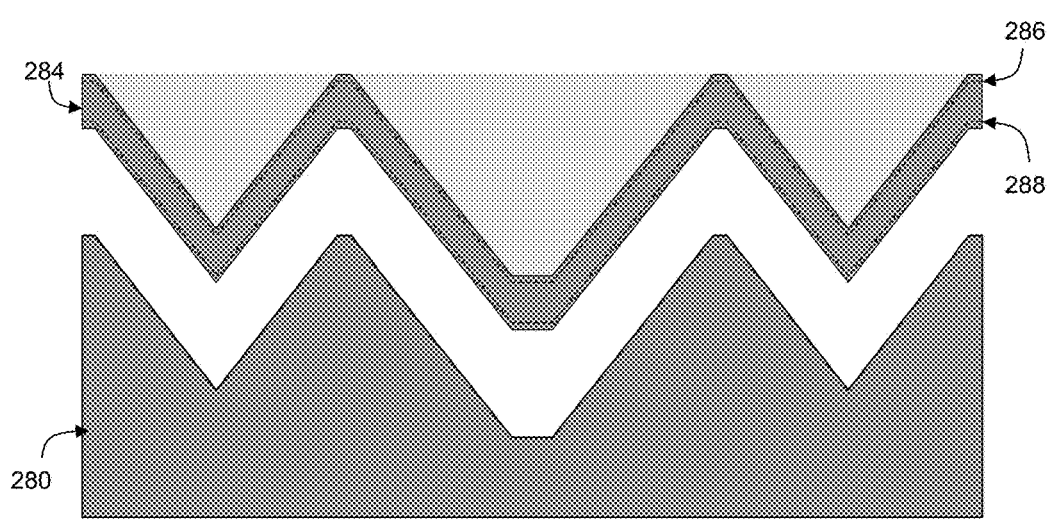

FIGS. 16A through 16C are cross-sectional drawings illustrating a 3-D TFSS fabrication process with in-situ emitter, base, and BSF doping. As shown is FIG. 16A, porous semiconductor layer 282 is formed by electrochemical HF etching on the front surfaces of template 280 and it is used as a sacrificial layer for epitaxial semiconductor layer release. The porous semiconductor layer preferably consists of two thin layers with different porosities. The first thin porous semiconductor layer is on top and is first formed from the bulk semiconductor wafer. The first thin layer preferably has a lower porosity of 15%~30%. The second thin porous semiconductor layer is directly grown from the bulk semiconductor and is underneath the first thin layer of porous semiconductor. The $2^{nd}$ thin porous semiconductor layer preferably has a higher porosity in the range of 50%~80%. The top lower porosity layer is used as a crystalline seed layer for high quality epitaxial semiconductor growth and the underneath higher porosity porous semiconductor layer is used for easier TFSS releasing due to its less density physical connections (between the epitaxial and bulk semiconductor interfaces) and its weaker mechanical strength. Alternatively, a single porosity release layer with a progressively increased porosity from top to bottom can also be used. In this case, the top portion of the porous semiconductor layer has a low porosity of 15% to 30% and the lower portion of the porous semiconductor layer has a high porosity of 50% to 80%. Before the epitaxial semiconductor growth, the wafer is baked in a high temperature (at 950° C. to 1150° C.) hydrogen environment within the epitaxial semiconductor deposition reactor in order to form coalesced structures (with relatively large voids) within the higher-porosity buried porous semiconductor layer while forming a continuous surface seed layer of crystalline semiconductor on the top of the lower-porosity porous semiconductor layer.

As shown in FIG. 16B, in-situ-doped mono-crystalline semiconductor epitaxial layer 284 is deposited on the front side only of template 280. The bulk base of the epitaxial layer is p-type, boron ($B_2H_6$) doped, while the back surface field (BSF) region 288 (initial epitaxial growth at bottom) may be optionally heavily p-type doped and emitter region 286 (end epitaxial growth at top) is n-type, phosphorus ($PH_3$) doped. The thickness of the epitaxial layer is in the range of 5 um to 60 um.

In the next step, prior to the release, an encompassing border trench may be made on the peripheral of the active wafer area to facilitate the release.

Detailed methods of making the border definition trenches include a double-trench method. An inner shallow trench defines the outer boundary of the finished 3-D TFSS. The outer deep trench is cut through porous silicon layer and provides access to the porous silicon layer so that the 3-D TFSS may be released. The encompassing trenches are formed by controlled laser cutting and their depths are in the range of 5 um to 100 um. The trenches define the boundary of the 3-D TFSS to be released and allow initiation of the release from the trenched region. In another embodiment, instead of making the laser cut, the wafer edge is polished by an abrasive tape for removing the epitaxial semiconductor wrap-around and exposes the porous semiconductor layers at the wafer edge.

The encompassing trenches are formed by controlled laser cutting and their depths are in the range of 5 um to 100 um. The trenches define the boundary of the 3-D TFSS to be released and allow initiation of the release from the trenched region. In another embodiment, instead of making the laser cut, the wafer edge is polished by an abrasive tape for removing the epitaxial semiconductor wrap-around and exposes the porous semiconductor layers at the wafer edge. In yet another embodiment, instead of making laser cut trenches on the front surface, the wafer or a batch of wafer stacked together could be edge-ground to a controlled depth in order to facilitate the entire epitaxial semiconductor layer to be released from the template.

In the next step, the epitaxial layer of semiconductor is released/separated from the template. The release methods disclosed in U.S. Patent Publication No. 2010-0022074 filed May 28, 2009 entitled, SUBSTRATE RELEASE METHODS AND APPARATUS, by the common inventors David Xuan-Qi Wang Mehrdad M. Moslehi are hereby incorporated by reference. In one method, the 3-D TFSS is released in an ultrasonic DI-water bath. In yet method, the 3-D TFSS is released by direct pulling with wafer backside and top epitaxial vacuum chucked. After removal of the epitaxial semiconductor layer from the template, the template is cleaned by using diluted HF and diluted wet semiconductor etch solution, such as TMAH and/or KOH to remove the remaining porous semiconductor layers and semiconductor particles. Then the template is further cleaned by conventional semiconductor wafer cleaning methods, such as RCA1 and/or RCA2 wet cleaning to removal possible organic and metallic contaminations. Finally, after proper rinsing with DI water and drying, the template is ready for another re-use cycle. Next, the released TFSS backside surface is cleaned by short semiconductor etching using KOH or TMAH solutions to remove the semiconductor debris and fully or partially remove the QMS layer. FIG. 16C illustrates cleaned reusable template 280 and the released and cleaned 3-D TFSS comprised of semiconductor epitaxial layer 284, in-situ n-type doped emitter layer 286, and in-situ p-type BSF 288.

Figure 17A:
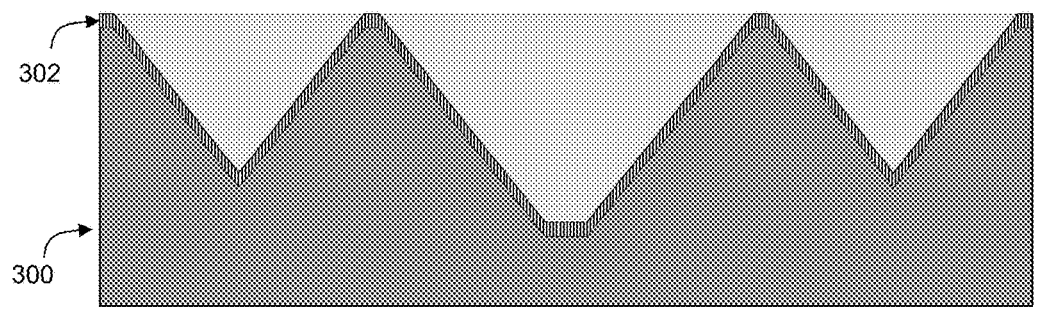
FIGS. 17A through 17C are cross-sectional drawings illustrating a 3-D TFSS fabrication process in which neither the emitter nor BSF is particularly doped during epitaxial growth.
Figure 17B:
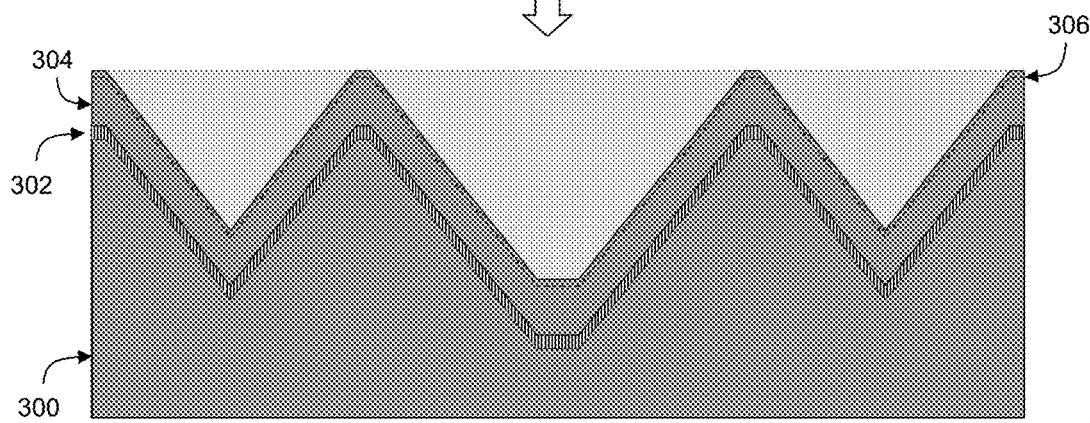
Figure 17C:
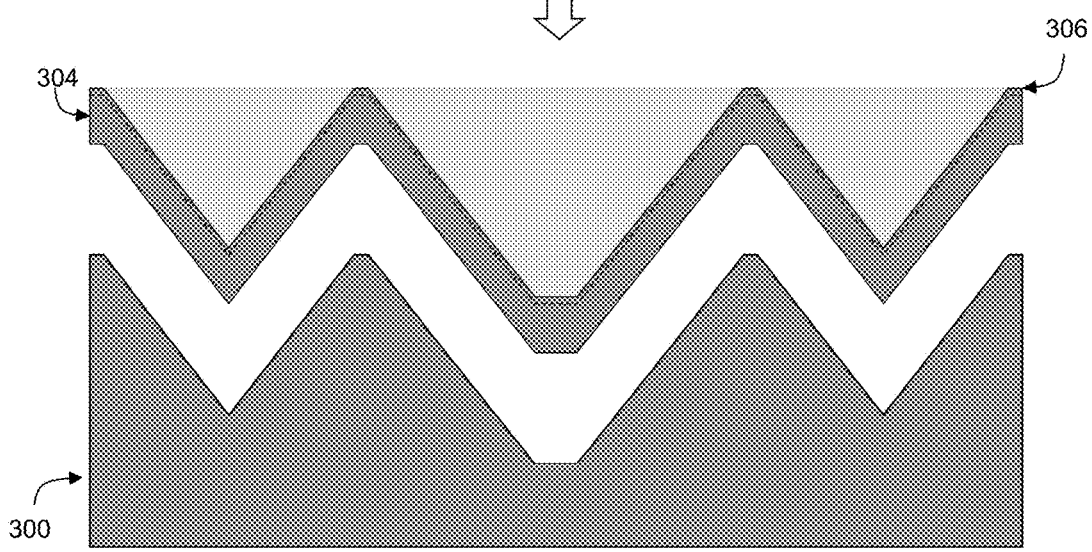

FIGS. 17A through 17C are cross-sectional drawings illustrating a 3-D TFSS fabrication process in which neither the emitter nor BSF is particularly doped during epitaxial growth. However, the bulk base of epitaxial layer 304 is in-situ p-type, boron ($B_2H_6$) doped. FIG. 17A illustrates porous bi-layer 302 formation process on template 300 which is same as described in the above section for FIG. 16A. The emitter 306 doping is conducted by phosphorus diffusion or ion implantation after epitaxial semiconductor 304 growth as shown in FIG. 17B. The post ion implantation annealing may be performed before or after the 3-D TFSS release and the optional base p-type doping may be conducted after the release of 3-D TFSS. FIG. 17C illustrates cleaned and reusable template 300 and released and cleaned 3-D TFSS comprising epitaxial semiconductor layer 304 and n-type doped emitter 306.

Figure 18A:
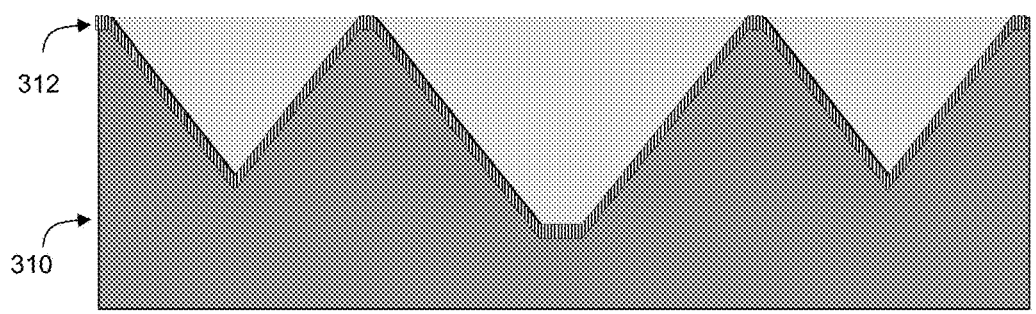
FIGS. 18A through 18C are cross-sectional drawings illustrating a 3-D TFSS fabrication process in which neither the emitter nor back surface field (BSF) is particularly doped during epitaxial growth.
Figure 18B:
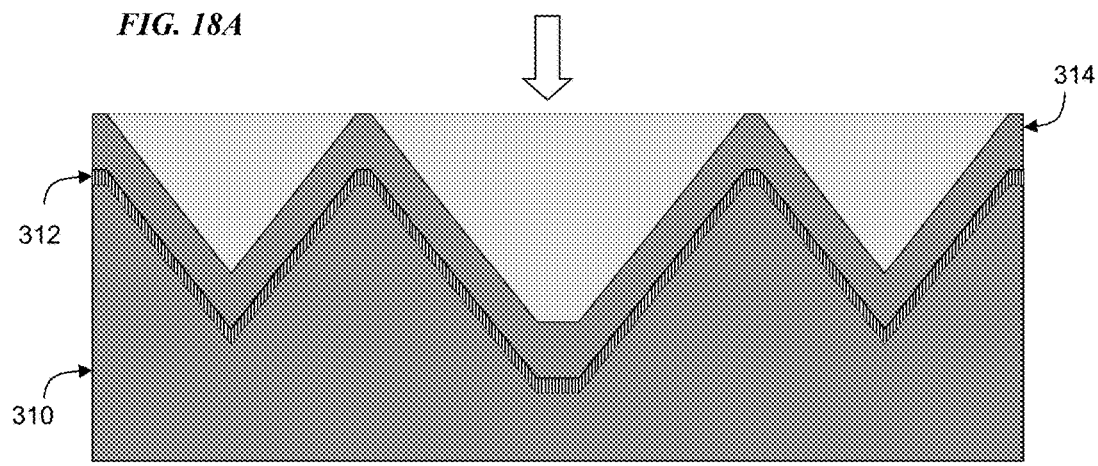
Figure 18C:
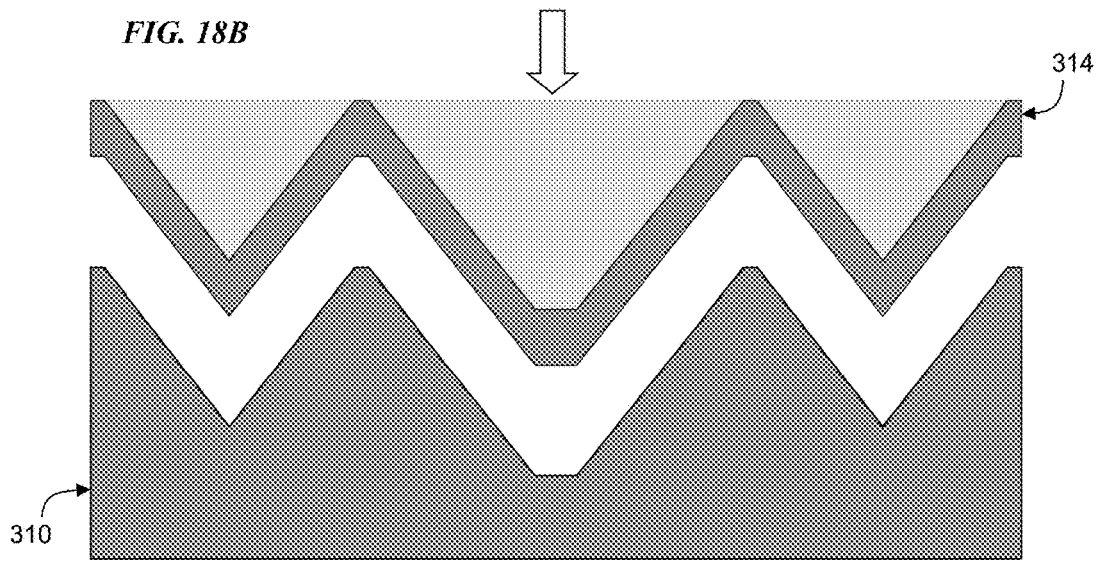

FIGS. 18A through 18C are cross-sectional drawings illustrating a 3-D TFSS fabrication process in which neither the emitter nor back surface field (BSF) is particularly doped during epitaxial growth. The emitter and BFS doping processes are conducted after the release of 3-D TFSS. FIG. 18A illustrates porous bi-layer 312 formation process on template 310 which is same as described in the above section for FIG. 16A. As shown in FIG. 18B, epitaxial semiconductor layer 314 is not particularly doped for emitter or BSF, however, the bulk base p-type doping is performed in-situ to form a p-type epitaxial bulk base layer. FIG. 18C illustrates cleaned reusable template 310 and the released and cleaned 3-D TFSS comprised of p-type doped epitaxial semiconductor layer 314.

Figure 19A:
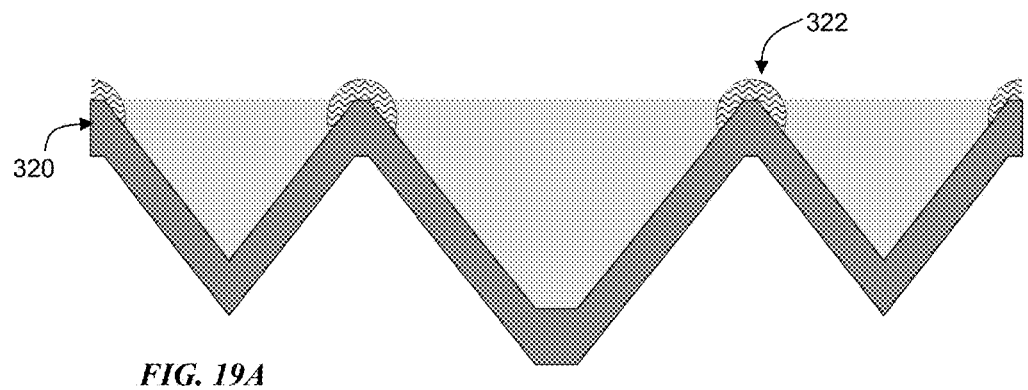
FIGS. 19A through 19C illustrates a selective emitter and BSF doping process performed on a released 3-D TFSS by liquid transfer coating.
Figure 19B:
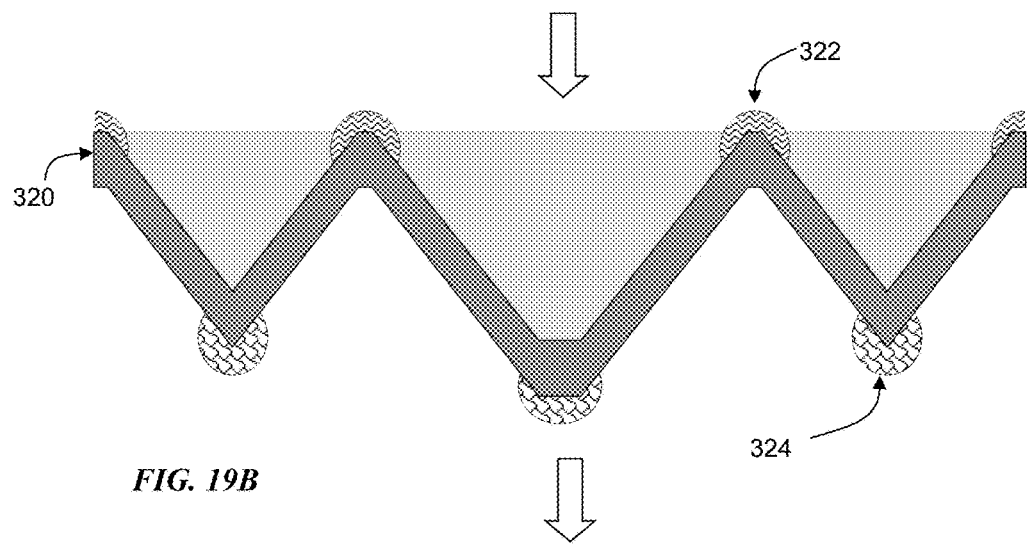
Figure 19C:
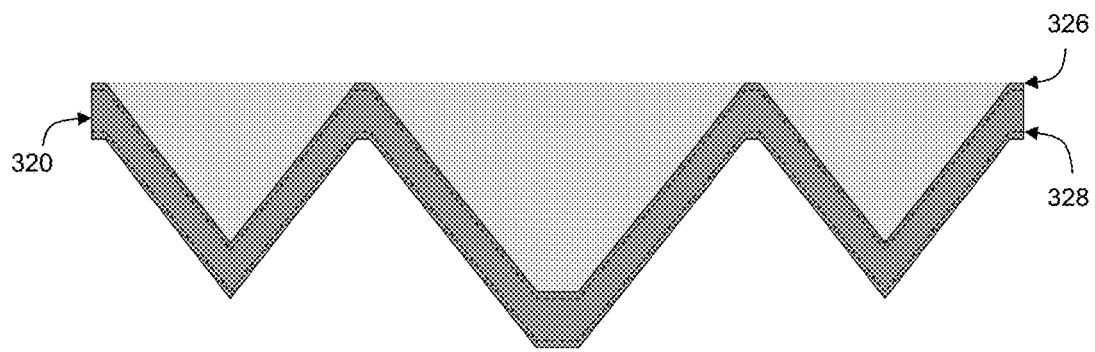

FIGS. 19A through 19C illustrates a selective emitter and BSF doping process performed on a released 3-D TFSS by liquid transfer coating. As shown in FIG. 19A, liquid or paste n-type doping source 322 is coated and cured on the top portions (ridges) of the epitaxial semiconductor layer 320 by self-aligned spatially selective coating, such as roller coating, screen printing or dip coating. After drying/curing (250° C. to 400° C.) and thermal annealing (800° C. to 950° C.), the remaining dried doping source layer is removed by chemical etching such is in a HF solution. The roller coating, screen printing and dip coating methods are types of so-called liquid transfer coating—such as the LTC methods disclosed in U.S. Patent Application Pub. No. 2009-0042320 which is incorporated by reference. Other methods may also be used for this spatially selective etch liquid/paste coating. The liquid/paste selective coating of the doping source for emitter doping could provide selective emitters that are heavily doped. In other words, on the front side, the top ridge region is doped with n++ and pyramid sidewall areas are doped with n+ (shown as n-type doped emitter 326 in FIG. 19C).

Next, as shown in FIG. 19B, a liquid or paste p-type doping source 324 is coated and cured on the backside surface of epitaxial layer 320 by self-aligned spatially selective coating, such as roller coating, dip coating or screen printing. After drying/curing (250° C. to 400° C.) and thermal annealing (800° C. to 950° C.), the remaining dried doping source layer is removed by chemical etching such is in a HF solution. The roller coating, screen printing and dip coating methods are types of so-called "Liquid Transfer Coating" (LTC). The examples of LTC found U.S. Patent Publication No. 2009-0042320, entitled, METHODS FOR LIQUID TRANSFER COATING OF THREE-DIMENSIONAL SUBSTRATES, by common inventors David Xuan-Qi Wang and Mehrdad M. Moslehi are incorporated by reference. Other methods may also be used for this spatially selective etch liquid/paste coating. The liquid/paste selective coating of the doping source for base doping could provide selective bases that are heavily doped. In other words, on the back side, the pyramid tip region is doped with p++ and pyramid sidewall areas are doped with p+ (shown as p-type doped base 328 in FIG. 19C). Alternatively, a liquid p-type doping source may be spray coated to the entire backside surface. After annealing, a continuous BSF region is formed.

Figure 20A:
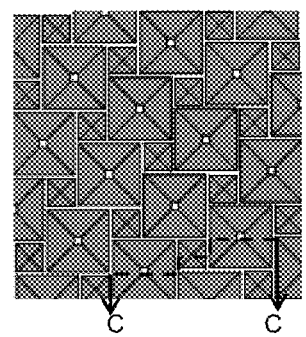
FIGS. 20A through 20D the 3-D TFSS/TFSC see-through fabrication process in which the small pyramids will be selectively patterned and etched from their backsides.
Figure 20B:
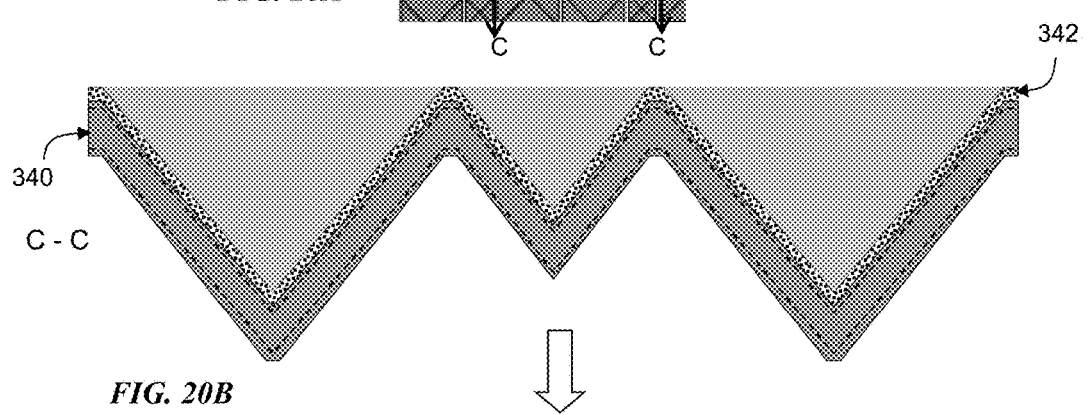
Figure 20C:
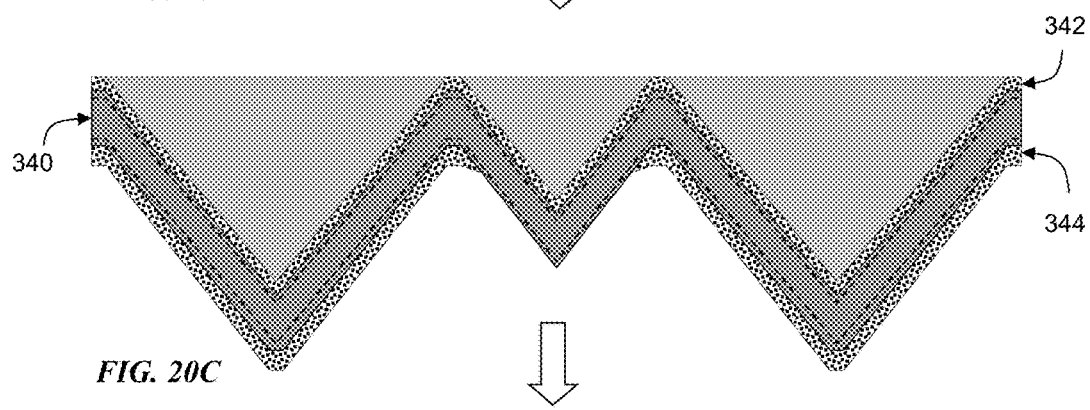
Figure 20D:
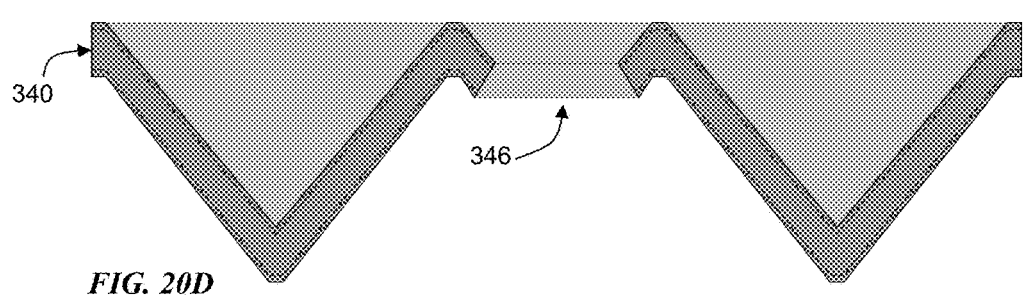

FIG. 20A shows the schematic top view of the 3-D TFSS prior to the see-through hole etching process, in which the small pyramids will be selectively patterned and etched from their backsides. FIGS. 20B through 20D illustrate a method of forming the see-through holes from a released 3-D TFSS by etching small pyramidal cavities.

FIG. 20B is a depiction of a cross-section along the C-C dash line in FIG. 20A. In FIG. 20B, front surface mask layer 342 is deposited to cover the entire front surfaces of released 3-D TFSS 340 comprising and epitaxial semiconductor layer, a top emitter doping region, and a bottom base doping region. The mask material is to protect the front surface from the subsequent semiconductor etching, such a KOH etching. The mask materials include but not limited to oxide, nitride, evaporated/sputtered chrome (Cr), and polymeric soft mask materials such as coated PMMA. In FIG. 20B, back surface mask material 344, which may be different than the front mask material, is selectively coated on the backside of 3-D TFSS 340. The backside coating coverage is preferably performed by self-alignment rather than by photolithography, even though both methods may be used in accordance with the disclosed subject matter. The backside selective coating is preferred conducted from a liquid source and by a controlled liquid transfer coating (LTC), which includes of roller coating, dip coating, and screen printing. As an example, in a roller coating method, the coating material only wet the tips of the large pyramids and from there to spread and cover the entire surfaces of the large pyramids and the grooves between the large and small pyramids. The liquid amount that is transferred from the large pyramid tips is limited and precisely controlled so that further spreading on the surfaces of small pyramids is prohibited. In addition, the coating liquid temperature, viscosity, solvent properties, and TFSS backside surface conditions are important factors to affect the coating coverage control. After the self-aligned LTC process, the coated mask material is dried and cured followed by a KOH semiconductor etching. Even through the semiconductor surface to be etched are mostly (111) planes, these (111) planes meet and form convex edges and sharp tips which are etched in a much faster rates than regular crystallographic planes. As a result, the exposed semiconductor (111) planes are etched from their peripherals and finally etched through. The see-through hole opening size may be in-situ controlled by using a light source and an optical detector to measure the light transmissivity during etching and terminated the etching process when a pre-determined opening size/ratio. After the KOH etching, the coating material on both the front and backsides are stripped and 3-D TFSS 340 with see-through hole 346 is cleaned and dried (as shown in FIG. 20D).

Figure 21A:
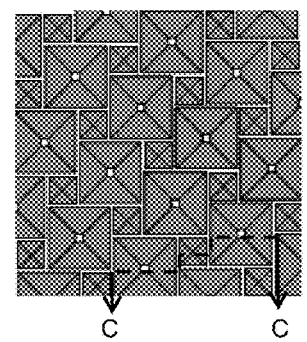
FIGS. 21A through 21D the 3-D TFSS/TFSC see-through fabrication process in which the small pyramids will be selectively patterned and etched from their backsides.
Figure 21B:
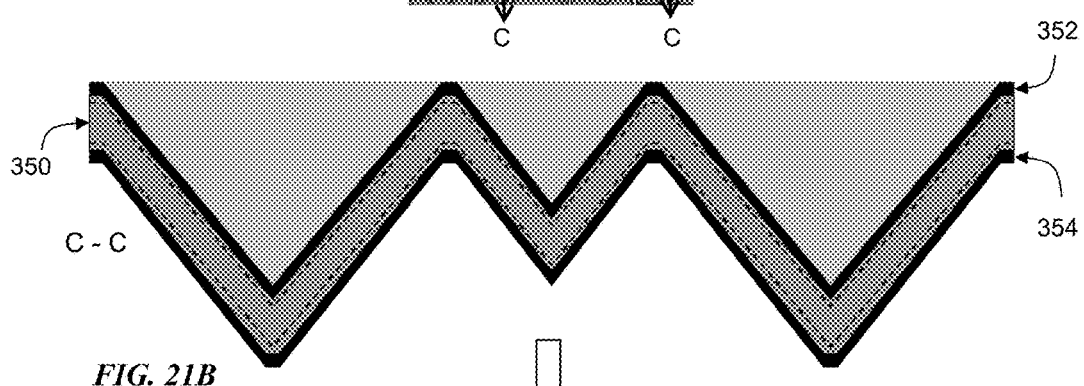
Figure 21C:
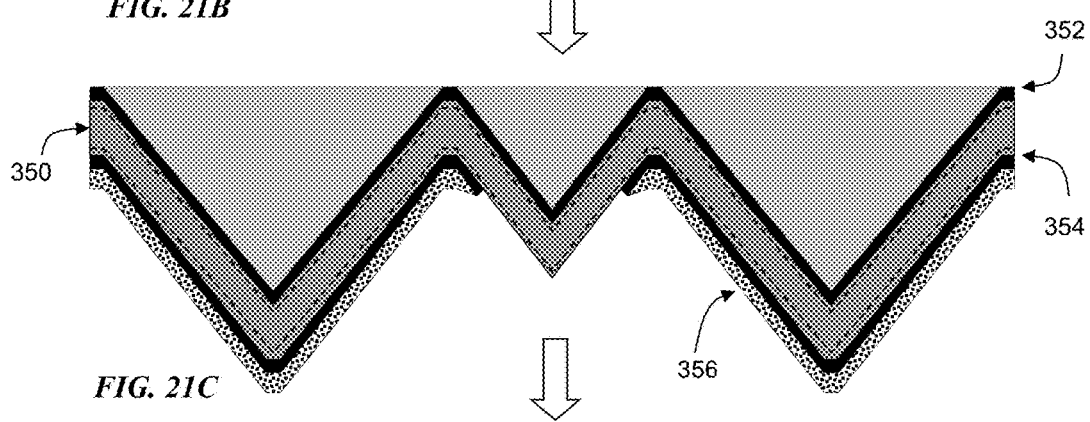
Figure 21D:
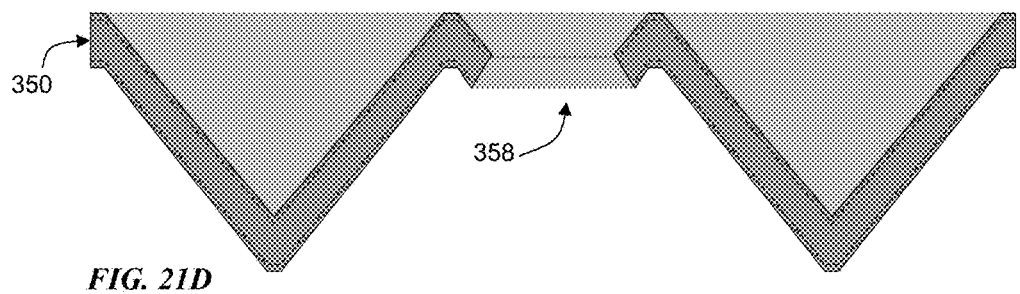

FIG. 21A shows the schematic top view of the 3-D TFSS prior to the see-through hole etching process, in which the small pyramids will be selectively patterned and etched from their backsides. FIGS. 21B through 21D illustrate a method of forming the see-through holes from a released 3-D TFSS by etching small pyramidal cavities.

FIG. 21B is a depiction of a cross-section along the C-C dash line in FIG. 21A. In FIG. 21B, a hard mask layer is deposited to cover the front surface (hard mask layer 352), back surface (354) and side surfaces of 3-D TFSS 350 comprising and epitaxial semiconductor layer, a top emitter doping region, and a bottom base doping region. The hard mask material is used to protect surfaces from the subsequent semiconductor etching, such a KOH etching. The mask materials include but not limited to thermally grown oxide and LPCVD nitride.

In FIG. 21C, soft mask material 356 is selectively coated on the backside of 3-D TFSS 350. The backside coating may be conducted by the self-alignment selective coating or by photolithographic defined photoresist coating to define the openings at the small pyramid back surfaces. The backside selective coating is preferably conducted from a liquid source and by a controlled liquid transfer coating (LTC) method, which may include roller coating, dip coating, and screen printing. As an example, in a roller coating method, the coating material only wet the tips of the large pyramids and from there to spread and cover the entire surfaces of the large pyramids and the grooves between the large and small pyramids. The liquid amount that is transferred from the large pyramid tips is limited and precisely controlled so that further spreading on the surfaces of small pyramids is prohibited. In addition, the coating liquid temperature, viscosity, solvent properties, and TFSS backside surface conditions are important factors to affect the coating coverage control. After the backside soft mask patterning by either self-aligned LTC process or photolithography, the opening pattern of the soft mask is transferred onto the hard mask by etching the exposed hard mask. After striping the soft mask layer, KOH semiconductor etching is used to form the openings on the small pyramid by the backside etching. Even through the semiconductor surface to be etched are most (111) planes, however these (111) planes meet and form convex edges and sharp tips, which are etched in a much faster rates than regular crystallographic planes. As a result, the exposed semiconductor (111) planes are etched from their peripherals and finically etched through. The see-through hole opening size can be in-situ controlled by using a light source and an optical detector to measure the light transmissivity during etching and terminated the etching process when a pre-determined opening size/ratio. After the KOH etching, the remaining hard masking material is stripped and 3-D TFSS 350 with see-through hole 358 is cleaned and dried (as shown in FIG. 21D).

Figure 22A:
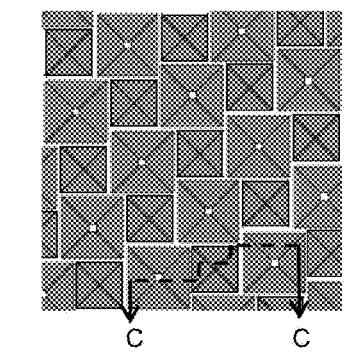
FIGS. 22A through 22D the 3-D TFSS/TFSC see-through fabrication process in which the large pyramids will be selectively patterned and etched from their backsides.
Figure 22B:
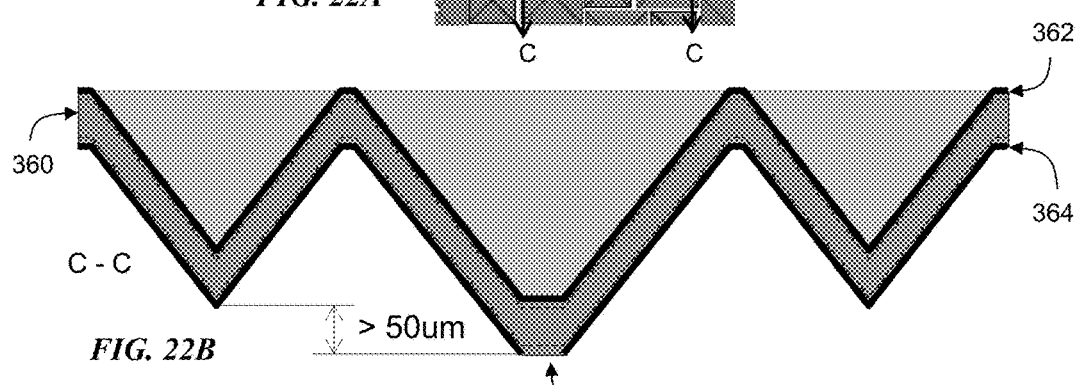
Figure 22C:
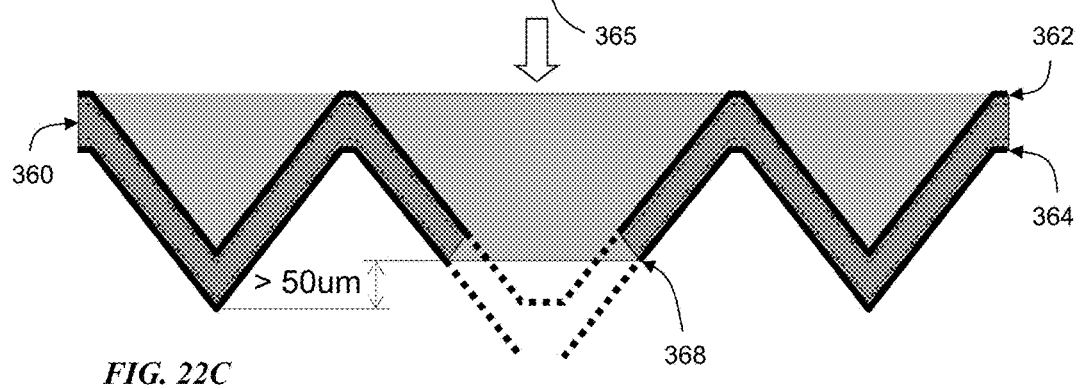
Figure 22D:
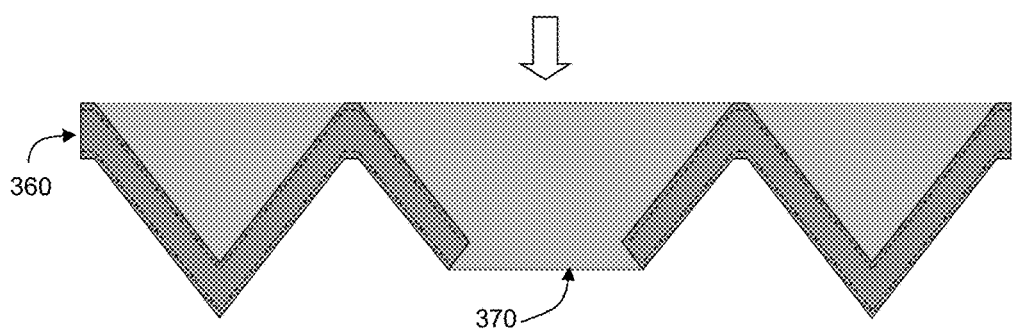

FIG. 22A shows the schematic top view of the 3-D TFSS prior to the see-through hole etching process, in which the large pyramid cavities will be selectively patterned and etched from their backsides to form see-through holes. FIGS. 22B through 22D illustrate a method of forming the see-through holes from a released 3-D TFSS by etching large pyramidal cavities.

FIG. 22B is a depiction of a cross-section along the C-C dash line in FIG. 22A. It is important to note that the height/depth of the inverted pyramidal cavities difference between the large and small pyramids is an important factor for the see-through opening etch and it is determined by the lateral size difference (designed in the template layout) between the large and small pyramids. There is a minimum pyramid height difference requirement for conducting subsequent etching process. In FIG. 22B, a 50 um pyramid height difference is shown. In FIG. 22B, a hard mask layer is deposited to cover the front surface (hard mask layer 362), back surface (364) and side surfaces of 3-D TFSS 360 comprising and epitaxial semiconductor layer, a top emitter doping region, and a bottom base doping region. The hard mask material is used to protect surfaces from the subsequent semiconductor etching, such a KOH etching. The mask materials include but not limited to thermally grown oxide and LPCVD nitride.

Next, as shown in FIG. 22B, the hard mask layer at the large pyramid bottom, shown as 365, is selectively removed by self-aligned methods, such as mechanical lapping or LTC coating of an etch paste. In the mechanical lapping case, since the large pyramids have uniform depth, the lapping surface only makes physical contacts to the bottom of the large pyramids. Therefore it is convenient to selectively remove the hard mask layer that is less than 1 um thick in this self-aligned process. In the second case, a hard mask etching paste or liquid could be readily coated to the large pyramid bottom surfaces without contacting the surfaces or the small pyramids. The backside selective etchant coating is conducted by a controlled LTC process, which includes of roller coating, dip coating, and screen printing.

After opening the hard mask layer at the bottom surface of the large pyramids, KOH semiconductor etching is used to form the backside openings. As shown in FIG. 22C, the etching of the openings progresses along the sidewalls of the large pyramids and etching is terminated after a pre-determined opening size is reached, such as at point 368. It is important to note, the amount of the large pyramid etched should create a reversed height difference of a minimum value between the large etched opening level and the bottom of the small pyramids. A 50 um of a height difference is shown in FIG. 22C. This reversed height difference between the large and small pyramids is needed for conducting downstream self-aligned cell fabrication process including passivation layer selective opening and selective base metallization at the bottom of the extruded small pyramids. As shown in FIG. 22C, as the semiconductor etching progresses, overhanging hard mask layer may be left at the semiconductor etching fronts and affects the etching depth and rate uniformity. Therefore, the semiconductor etching is preferably performed with agitation of the etching solution, such as megasonic/ultrasonic or jetting mechanisms in order to break off the overhanging hard mask layer at semiconductor etching front. The see-through opening size may be in-situ controlled by using a light source and an optical detector to measure the light transmissivity during etching and terminated the etching process when a pre-determined opening size/ratio. After the KOH etching, the remaining hard masking material is stripped and 3-D TFSS 360 with see-through hole 370 is cleaned and dried (as shown in FIG. 22D).

Figure 23A:
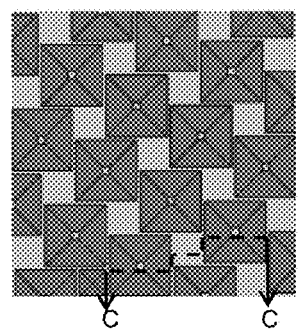
FIGS. 23A through 23D the 3-D TFSS/TFSC see-through fabrication process in which the flat surface areas will be selectively patterned and etched from their frontside.
Figure 23B:
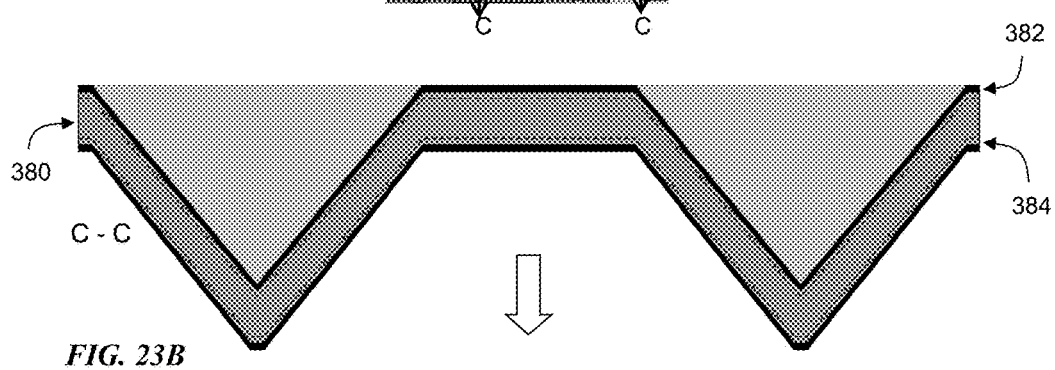
Figure 23C:
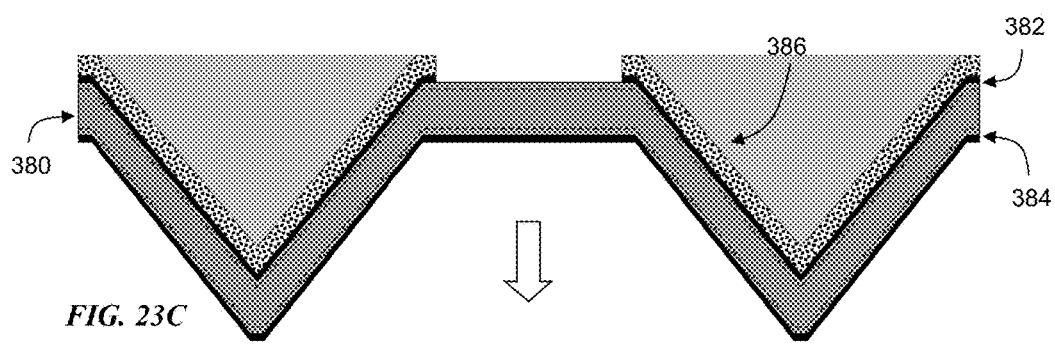
Figure 23D:
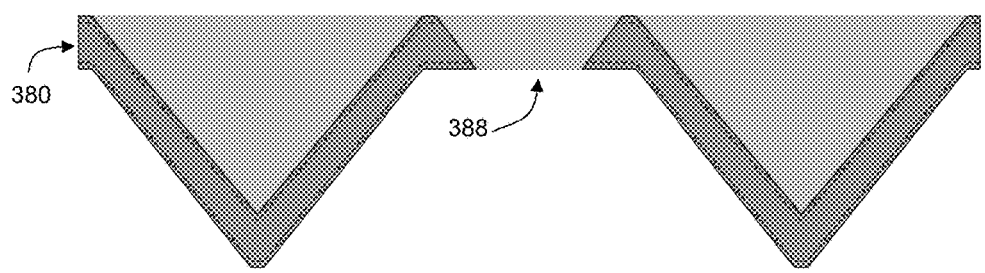

FIG. 23A shows the schematic top view of the 3-D TFSS prior to the see-through hole etching process, in which flat surfaces areas among the inverted pyramidal cavities will be selectively patterned etched from their backsides. FIGS. 23B through 23D illustrate a method of forming the see-through holes from a released 3-D TFSS by etching the flat surfaces areas of the 3-D TFSS.

FIG. 23B is a depiction of a cross-section along the C-C dash line in FIG. 23A. In FIG. 23B, a hard mask layer is deposited to cover the front surface (hard mask layer 382), back surface (384) and side surfaces of 3-D TFSS 380 comprising and epitaxial semiconductor layer, a top emitter doping region, and a bottom base doping region. The hard mask material is used to protect surfaces from the subsequent semiconductor etching, such a KOH etching. The mask materials include but not limited to thermally grown oxide and LPCVD nitride. As shown in FIG. 23C, soft mask material 386, such as photoresist, is spray-coated on the front surface and photolithographic defined to open the flat area. The opening pattern in photoresist is transferred to the hard mask by etching the exposed hard mask. For example, a thermal oxide hard masked can be etched by buffered HF solution. After stripping the soft mask layer, KOH semiconductor etching is used to form the defined openings on the flat area. In this case, the exposed semiconductor surface is (100) crystallographic plane and its etching yield a tapered through hole with (111) planes on its sidewalls. After the KOH etching, the remaining hard masking material is stripped and 3-D TFSS 380 with see-through hole 388 is cleaned and dried (as shown in FIG. 23D).

FIGS. 24A through 24D are cross-sectional drawings depicting a process flow for the fabrication a 3-D TFSC with or without see-through holes. The process steps include surface passivation on front and back surfaces of the released 3-D TFSS, anti-reflection layer coating, selective and local dielectric layer opening, emitter and base metal plating, and back reflector metal deposition.

Figures 24A, 24B, 24C, 24D:
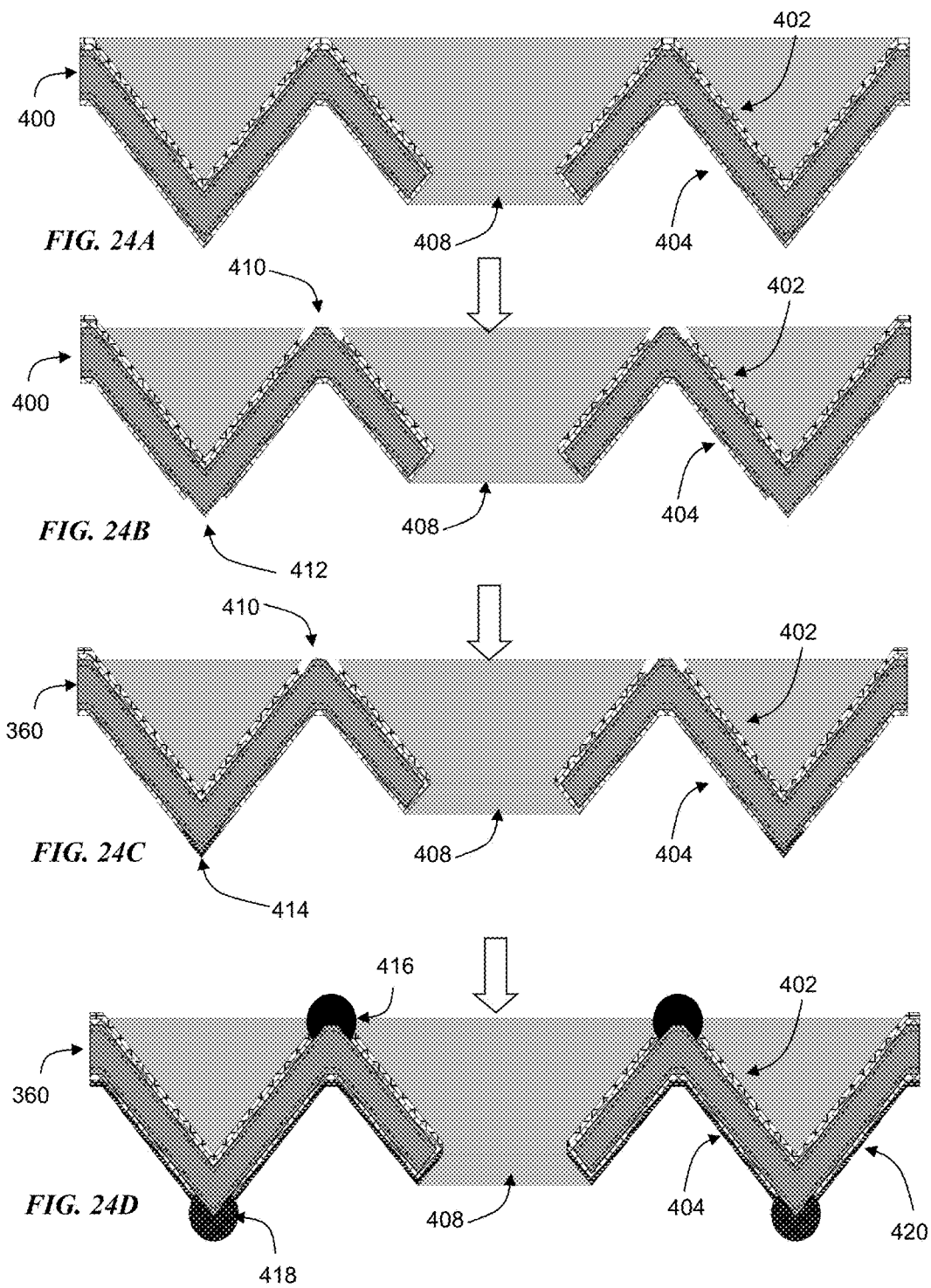
FIGS. 24A through 24D are cross-sectional drawings depicting a process flow for the fabrication a 3-D TFSC with or without see-through holes.

In FIG. 24A, a thin surface passivation layer is deposited on all exposed surfaces of 3-D TFSS 400 comprising see-through hole 408. As an example, a thin semiconductor oxide ($SiO_2$) 404 of 3 nm to 100 nm thick may be thermally grown by oxidation in the temperature range of 800° C. to 950° C. to serve as the passivation layer for both the front and back sides. Next, a 3 nm to 100 nm thick PECVD semiconductor nitride ($SiN_x$) is deposited on the front side oxide surface for serving as an anti-reflection (ARC) layer and another front surface passivation layer—shown as front ARC and passivation layer 402. Alternative or in addition to the thin thermal oxide, a thin layer of reactive sputtered or PECVD deposited aluminum oxide ($AlO_x$) or PECVD $SiN_x$ can be used for the back surface passivation—shown as backside passivation layer 404.

Next, as shown in FIG. 24B, the emitter contact areas 410 and base contact areas 412 are subsequently opened by spatially selective etching of dielectric layer(s). In one embodiment, dielectric etching liquid, such as diluted HF, is roller coated or dip coated to the front ridge or the back pyramid tip regions for direct etching the dielectric layers. After the etching, the 3-D TFSS is rinsed with DI water and dried. In another embodiment, the dielectric etching paste is screen printed on the front ridge or the back pyramid tip regions followed by a heated curing step. During the heating of the coated etch paste, the dielectric layer is etched.

After the etching, the remaining etch paste is stripped and the 3-D TFSS is cleaned as shown in FIG. 24C. Other LTC methods disclosed U.S. Patent Application Pub. No. 2009-0042320 (which is incorporated by reference) may also be used for this spatially selective etch liquid/past coating. In yet another embodiment, controlled laser ablation with short-pulsed (Pico-second) UV laser is used to selectively remove the dielectric layers. In yet another embodiment, photolithography patterning of the emitter and base contact opening could be conducted. In this method, photoresist is sprayed and dried following by aligned exposure and resist developing. Upon creating the contact opening pattern by photoresist, chemical etching of the exposed dielectric layers could be conducted. After that the remaining resist layer is removed. The above methods of spatially selective etching of dielectric layers could be used for both emitter and base contact openings however the etching source material may be different. After the emitter and base contact openings, an optional aluminum (Al) deposition by PVD, evaporation or sputtering is conducted on the TFSS backside followed by an annealing/fire-through at 800° C. to 950° C. The annealing process provide Al—Si alloy and form p++ region at base contact 414. The remaining aluminum at TFSS backside can be optionally removed.

Next, as shown in FIG. 24D, the emitter and base metallization is conducted by selective electroplating or electroless plating of nickel (Ni) in the thickness range of 50 nm to 300 nm followed by optional Ni sintering. Next, electroplating or electroless plating of Ag is conducted on both the emitter contact regions 416 and base contact regions 418. The Ni and Ag plating may be replaced by Cu plating with a suitable barrier layer (e.g. Ta). Next, an optional forming gas annealing (FGA) is performed at temperature range of 200° C. to 400° C. to reduce the interconnect resistance and help with surface/bulk passivation of metals. Next, a thin layer of Al is deposited by evaporation or sputtering on the TFSC backside to serves as back-reflection mirror 420.

Optionally, the FGA process could be performed at this stage. FIG. 24D illustrates the fully processed 3-D TFSC to be packaged in a solar module or panel.

FIGS. 25A through 25D are cross-sectional drawings depicting a process flow for the fabrication a 3-D TFSC with or without see-through holes. The process steps include surface passivation on front and back surfaces of the released 3-D TFSS, anti-reflection layer coating, screen printed emitter and base metal contacts, and back reflector metal deposition.

As shown in FIG. 25A, a thin surface passivation layer is deposited on all exposed surfaces of 3-D TFSS 430 comprising see-through hole 436. As an example, a thin semiconductor oxide ($SiO_2$) of 3 nm to 100 nm thick is thermally grown by oxidation in the temperature range of 800° C. to 950° C. to serve as the passivation layer for both sides. Next, a 3 nm to 100 nm thick PECVD semiconductor nitride ($SiN_x$) is deposited on the front side oxide surface for serving as an anti-reflection (ARC) layer and another front surface passivation layer—shown as front ARC and passivation layer 432. Alternatively or in addition to the thin thermal oxide, a thin layer of reactive sputtered or PECVD deposited aluminum oxide ($AlO_x$) or PECVD $SiN_x$ can be used for the back surface passivation—shown as backside passivation layer 434.

As shown in FIG. 25B, backside (base) metallization 438 is performed by coating metal (aluminum) paste or like to the backside pyramid tip regions. The Al paste can be roller coated, dip coated or screen printed in a self-aligned coating process, i.e. only the pyramid tip regions are coated. After drying/curing of the coated metal paste by IR or oven heating, the base metal fire-through process may be optionally performed so that the Al paste can be fired through the backside dielectric layer(s) and form direct metal to semiconductor base contact; alternatively, this firing step may be postponed and combined with the emitter firing process as a single co-firing step.

Next, as shown in FIG. 25C, emitter metallization coating is performed in two optional paths. In the first option, metal (Ag) paste is roller-coated, dip-coated or screen-printed to the top ridge portions of the front surface in a self-aligned manner. Again, other liquid-transfer-coating methods disclosed in U.S. Patent Application Pub. No. 2009-0042320 (which is incorporated by reference) may also be used for the base and emitter metal paste coating process. In the second option, the metal paste is screen-printed with alignment to certain feature on the 3-D TFSS, as results, only specific area, such as stripes of flat areas are coated with the metal paste. Next, the coated emitter (Ag) metal paste is dried and fired through the front side surface passivation and ARC dielectric layers to form emitter contact 440. After the front and back metal fire-through process, an optional electroplating or electroless plating of an Ag layer is conducted for increased emitter and base conductivity. The Ni and Ag plating may be replaced by Cu plating with a suitable barrier layer (e.g. Ta).

Next, as shown in FIG. 25D, a thin layer of Al is deposited by evaporation or sputtering on the TFSC backside to serves as back-reflection mirror 442. Next, an optional forming gas annealing (FGA) is performed at temperature range of 200° C. to 400° C. to reduce the interconnect resistance and help with surface/bulk passivation of metals. FIG. 25D illustrates the fully processed 3-D TFSC to be packaged in a solar module or panel.

Figure 26A:
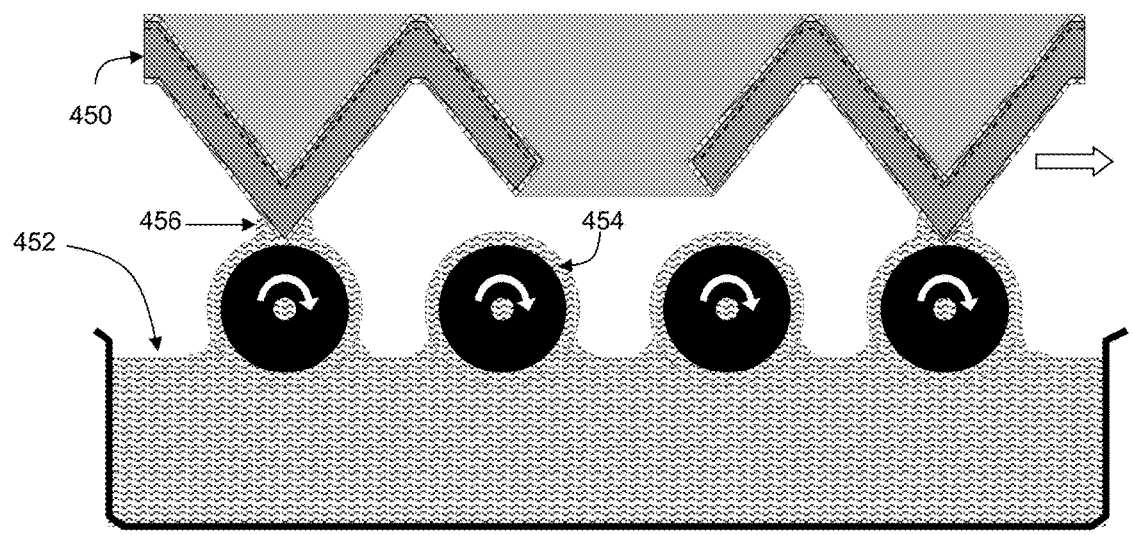
FIGS. 26A and 26B are a cross-sectional depiction illustrating liquid transfer coating with a roller coater and the resulting 3-D TFSS.
Figure 26B:
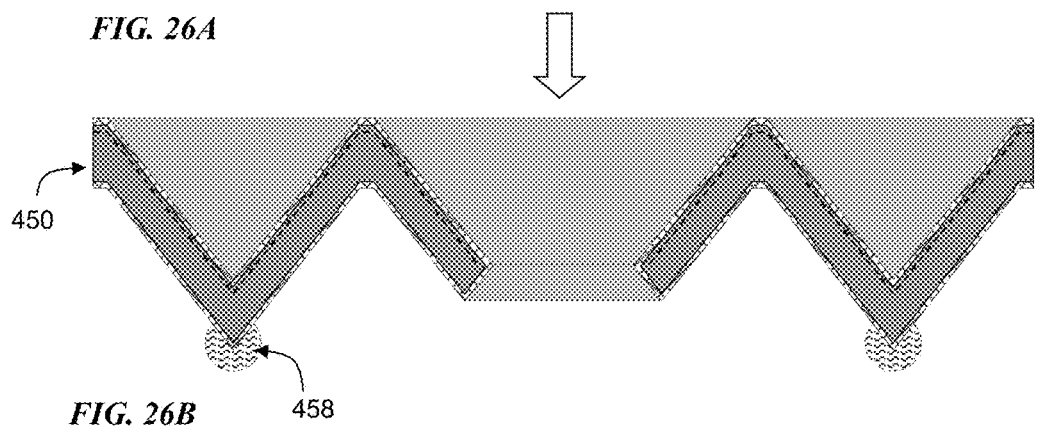

FIGS. 26A and 26B are a cross-sectional depiction illustrating liquid transfer coating with a roller coater and the resulting 3-D TFSS. The LTC process shown uses a selective and self-aligned liquid transfer coating (LTC) process in which a liquid/paste thin layer is coated on the pyramid tips on backside of 3-D TFSS 450. As shown in FIG. 26A, rollers 454 are placed in a parallel roll and partially merged in source 452 of the liquid/paste to be coated. The size/diameter and pitch of the rollers are not drawn to scale FIG. 26A as it is much larger than the pyramid dimensions. The rollers also serve as a conveyer, on which 3-D TFSS 350 is placed and moved when rollers 454 turn. Alternatively, the 3-D TFSS could be mounted/vacuum-chucked to a carrier plate on its top and actively positioned to move the 3-D TFSS relative to the roller surfaces. As a roller turns, a thin liquid layer is coated onto the roller surface by surface forces; the liquid layer thickness depends on a variety of parameters including liquid viscosity, surface tension, temperature, roll surface condition, roller rotation speed, 3-D TFSS proximity distance and its lateral translation speed. These parameters could be actively controlled so that upon contact between the liquid on the roller top surface and the 3-D TFSS, a controlled-amount of liquid is transferred to the large pyramid tips 456 on the 3-D TFSS backside.

As shown in FIG. 26B the liquid is coated 458 on the large pyramid tips of 3-D TFSS 450 in a self-aligned fashion. As described previously, the present LTC method may be applied to (1) emitter and base doping, in which case there are coating liquid sources an n-type doping and p-type doping respectively; (2) passivation layer etching, in which case the coating liquid may=be diluted HF solution or oxide/nitride etch pastes; (3) semiconductor etching, in which case the coating liquid may be KOH solution or HNA like solutions; (4) local emitter and base metallization, in which case the coating liquid is a metal paste or a liquid with dissolved metal nano-particles.

Figures 27A, 27B:
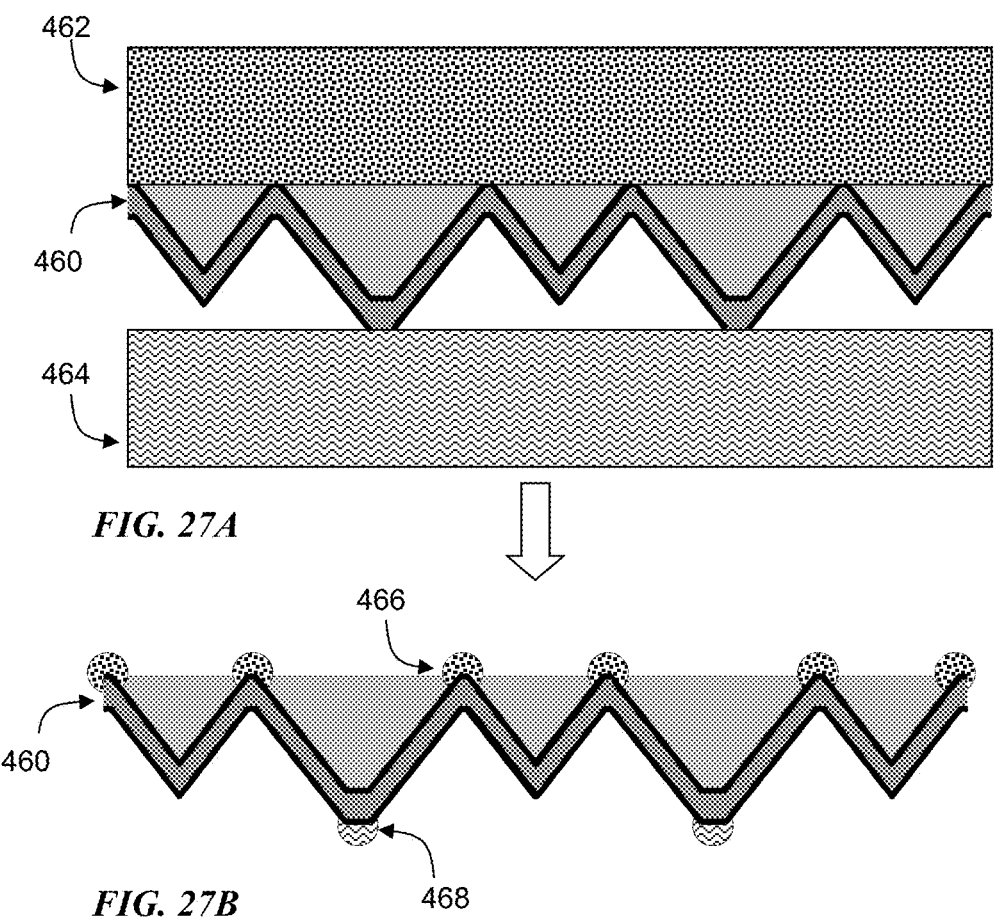
FIGS. 27A and 27B are a cross-sectional depiction illustrating liquid transfer coating according to a stamping/dipping process.

FIGS. 27A and 27B are a cross-sectional depiction illustrating liquid transfer coating according to a stamping/dipping process. Shown, a liquid/paste thin layer is coated on the selective surfaces of 3-D TFSS 460 from a liquid carrier or surface such as a screen or a pad. As shown in FIG. 27A, the front pyramid ridges and back pyramid tips of a 3-D TFSS are contacting two flat surfaces—front side liquid carrier 462 and back side liquid carrier 464. Thus, the liquid types of the front and back contacts may be the same or different. The choices of liquid carriers include a pre-soaked porous plate/surface, a fine-grid screen, or a sponge-like solid pad, and a flat surface with pre-coated thin layer of the liquid. The transferring of liquid from the carrier surface to the pyramid surface upon contacting is driven by surface forces of liquid and/or surface forces between the liquid and pyramid interfaces. The amount of liquid transferred is determined and limited by the said surface forces and the amount of liquid pre-soaked on the carrier prior to contacting the 3-D TFSS.

As shown in FIG. 27B, after the liquid transfer coating, the coated liquid is dried and cured and it only lies on the selective areas front side areas 466 and selective back side areas 468 of 3-D TFSS 460. As described in the earlier, the present LTC method can be applied to (1) emitter and base doping, which results in liquid coating of an n-type doping source and a p-type doping source respectively; (2) passivation layer etching, in which case the coating liquid may be diluted HF solution or oxide/nitride etch pastes; (3) semiconductor etching, in which case the coating liquid may be KOH solution or HNA like solutions; (4) local emitter and base metallization, in which case the coating liquid is metal pastes or a liquid with dissolved metal nano-particles.

Figure 28A:
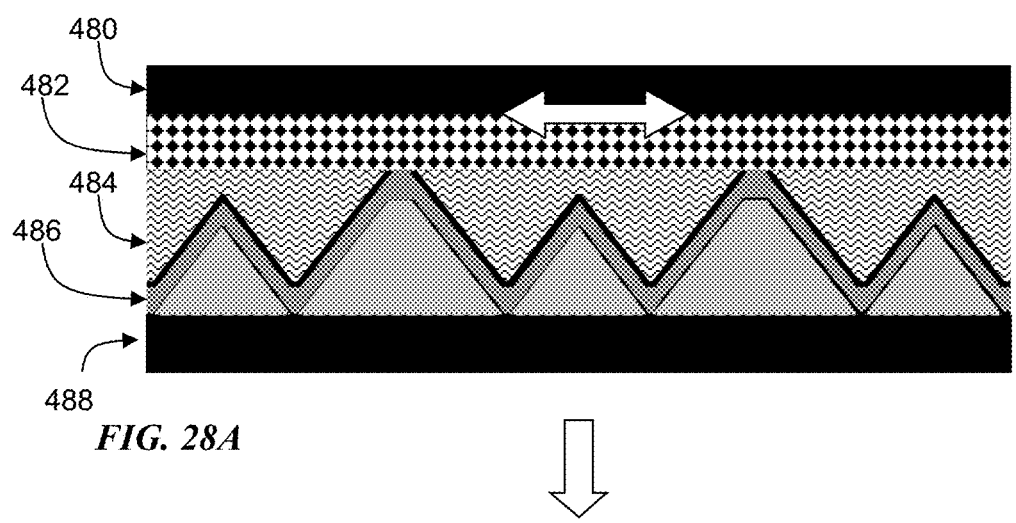
FIGS. 28A and 28B are a cross-sectional depiction illustrating a selective and self-aligned mechanical polishing/lapping process.
Figure 28B:
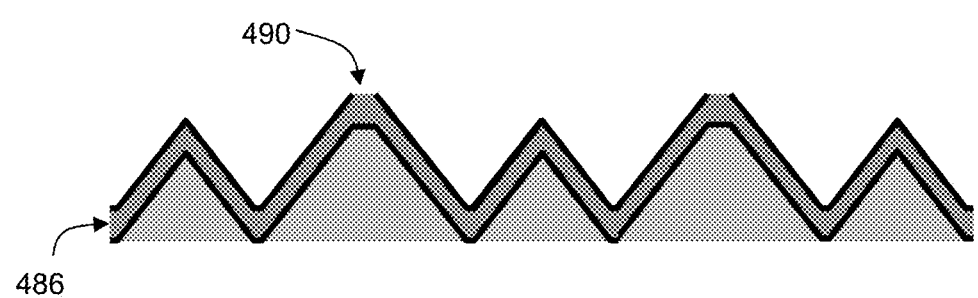

FIGS. 28A and 28B are a cross-sectional depiction illustrating a selective and self-aligned mechanical polishing/ lapping process in which a thin layer of a material on pyramid surfaces of a 3-D TFSS is removed. As shown in FIG. 28A, 3-D TFSS 462 is sandwiched between two parallel plates/surfaces. Bottom plate 488 is a vacuum chuck and top mounting plate 480 has abrasive surface 482 (such as a lap pad) for lapping the top surface of 3-D TFSS 486. 3-D TFSS 486 is optionally submerged in a liquid, such as DI water 484, for the convenient carrying and removing of lapping debris. Alternatively, the liquid may be a diluted chemical etchant or slurry for assisting the mechanical removal of the surface layer. Abrasive surface 482 may be a soft lapping pad or a fine grid lapping cloth, which is used to gently and evenly conduct the mechanical polishing/lapping in a controlled lateral and/or rotation motions.

Since the pitch between pyramid tips being polished is less than 1 mm, the local deformation of the lapping pad between the two adjacent pyramid tips is smaller than the height difference between the large and small pyramids. FIG. 28A is not drawn to scale as the thickness of the plates is much larger than the pyramid dimensions. In this mechanical lapping process, the choice of abrasive materials, the roughness and elasticity of the lapping surface, the force loaded in the vertical direction (weight) onto the 3-D TFSS, lateral and rotation speeds need to be managed so that the mechanical damage to the 3-D TFSS is prevented.

Resulting 3-D TFSS 486 is shown in FIG. 28B—a thin surface layer is only removed from the large pyramid tip surfaces 490 with the small pyramid tips untouched. Mechanical lapping method like this may be applied to either front or backside surfaces. Therefore, as described in the earlier, this method of selective and self-aligned thin layer removal can be used in (1) Opening the hard-etch-mask on backside at large pyramid tips for see-though hole etching; (2) Opening hard mask layer on front and/or backside surfaces for selective emitter/base doping; and (3) Opening the passivation dielectric layer on front and/or backside surfaces for selective emitter/base metallization.

Figure 29A:
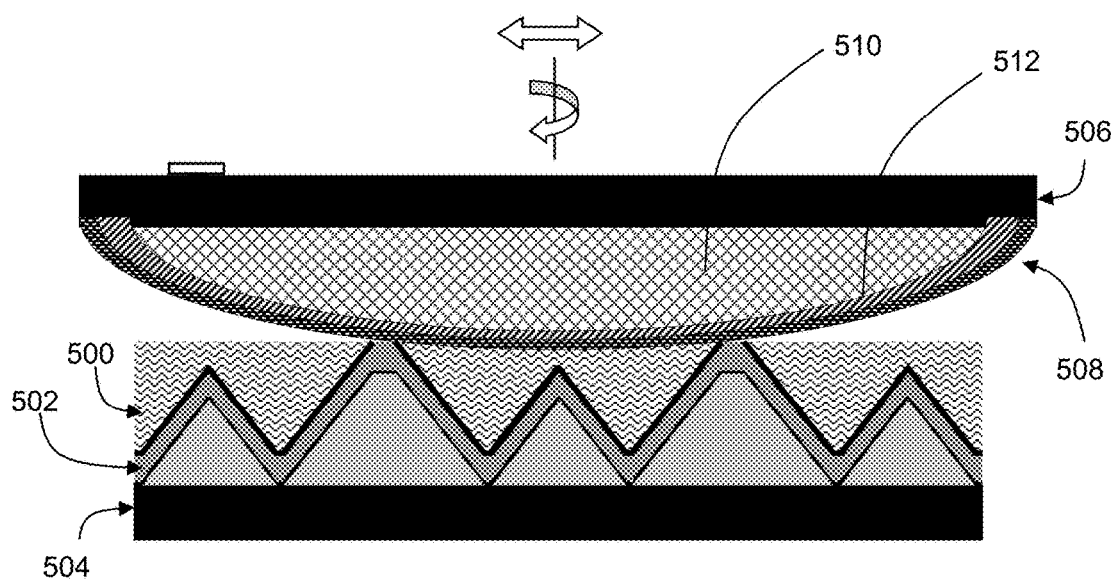
FIGS. 29A and 29B are a cross-sectional depiction illustrating a selective and self-aligned mechanical polishing/lapping process.
Figure 29B:
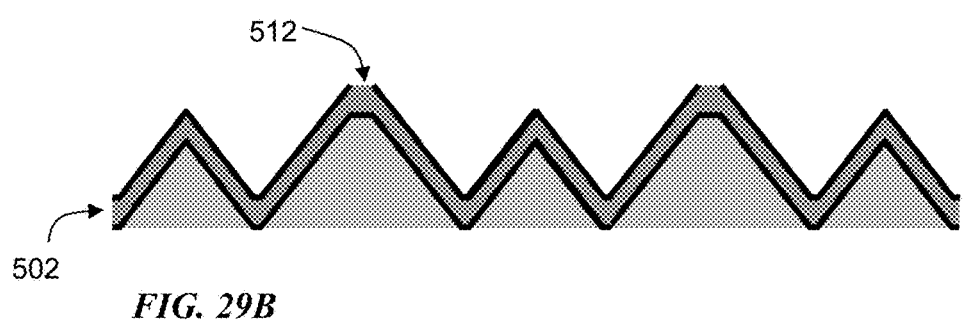

FIGS. 29A and 29B are a cross-sectional depiction illustrating a selective and self-aligned mechanical polishing/lapping process in which a thin layer of a material on pyramid surfaces of a 3-D TFSS is removed by a diaphragm based abrasive lapping. As shown in FIG. 29A, 3-D TFSS 502 is held by vacuum chuck 504 and optionally submerged in liquid 500, such as DI water, for convenient carrying and removing lapping debris. Alternatively, the liquid may be a diluted chemical etchant or slurry for assisting in the mechanical removal of the surface layer. Abrasive material 508 makes contact to the surfaces of 3-D TFSS 502 and may be a soft lapping pad or a fine grid lapping cloth which is used to gently and evenly conduct the mechanical polishing/lapping in a controlled lateral and/or rotation motions. The local surface of abrasive material 508 that makes contact to the TFSS surface is slightly deformed in order to achieve uniform thin film removal. Diaphragm 512 and compressed air/elastic material 510 provide structural yet flexible support to abrasive material 508. Since the pitch between pyramid tips on 3-D TFSS 502 being polished are less than 1 mm, the local deformation of the lapping pad between the two adjacent pyramid tips is smaller than the height difference between the large and small pyramids. FIG. 29B is not drawn to scale as the curvature of the abrasive diaphragm is much larger than the pyramid dimensions. In this mechanical lapping process, the choice of abrasive materials, the roughness of the lapping surface, the elasticity of the diaphragm, the slurry type, the liquid temperature, the force/pressure loaded in the vertical direction (weight) onto the 3-D TFSS, lateral and rotation speeds need to be managed so that the thin layer on the TFSS surface can be effectively removed without damage to the 3-D TFSS structure.

As shown in resulting 3-D TFSS 502 in FIG. 29B, a thin surface layer is only removed from the large pyramid tip surfaces 512 and the small pyramid tips are untouched. Mechanical lapping method like this can be applied to either front or backside surfaces. Therefore, as described in the early sections, this method of selective and self-aligned thin layer removal can be used in (1) Opening the hard-etch-mask on backside at large pyramid tips for see-though hole etching; (2) Opening hard mask layer on front and/or backside surfaces for selective emitter/base doping; (3) Opening the passivation dielectric layer on front and/or backside surfaces for selective emitter/base metallization.

Figures 30A, 30B:
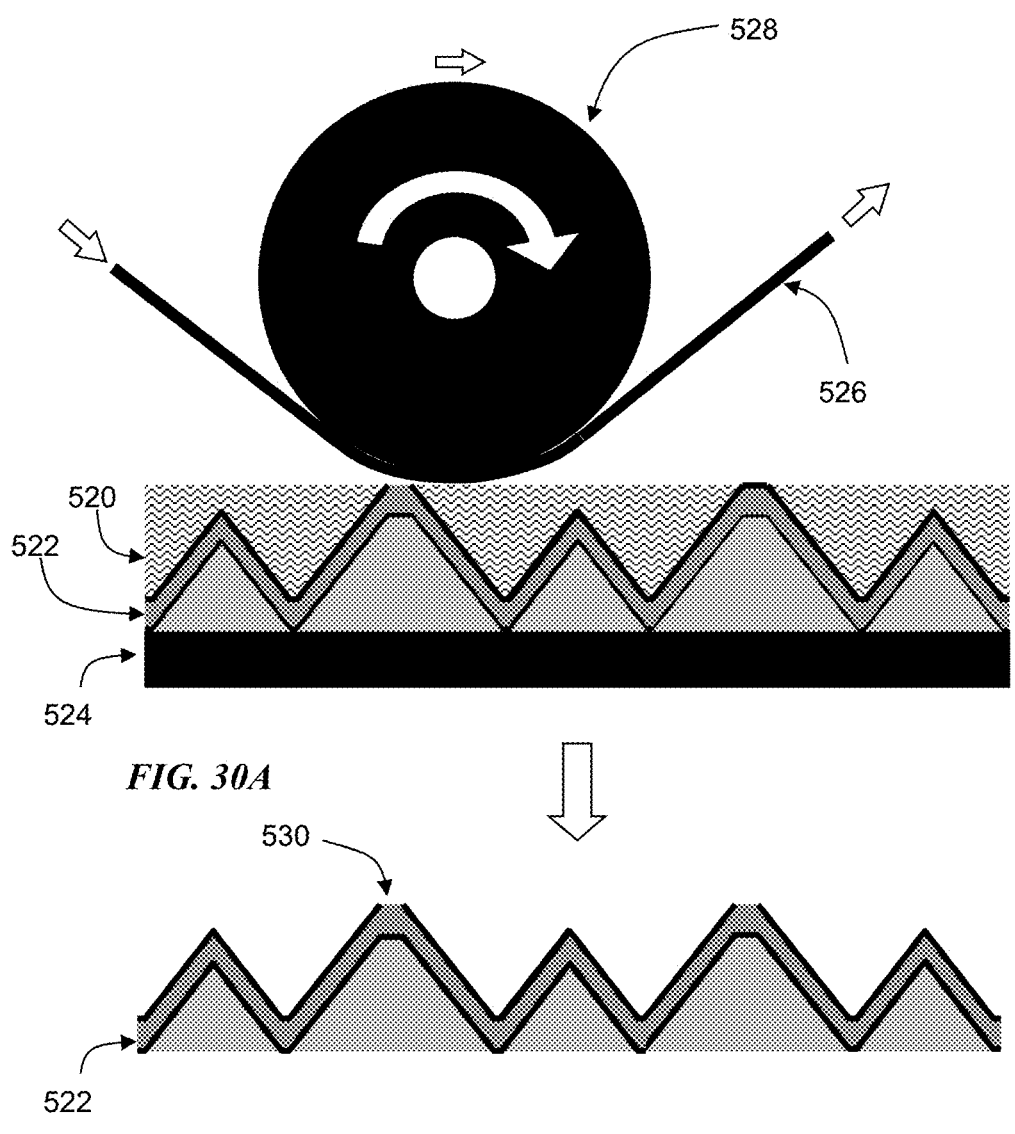
FIGS. 30A and 30B are a cross-sectional depiction illustrating a selective and self-aligned mechanical polishing/lapping process.

FIGS. 30A and 30B are a cross-sectional depiction illustrating a selective and self-aligned mechanical polishing/lapping process in which a thin layer of a material on pyramid surfaces of a 3-D TFSS is removed by mechanical abrasive tape based lapping. As shown in FIG. 30A, 3-D TFSS 522 is held by vacuum chuck 524 and optionally submerged in liquid 520, such as DI water, for convenient carrying and removing lapping debris. Alternatively, the liquid could be a diluted chemical etchant or slurry for assisting the mechanical removal of the surface layer. Abrasive tape 526 is pressed on the TFSS surface to be polished by soft roller 528 and the tape is fed to the surface by a tape-feeding mechanism (not shown). Together with roller 528 roller and the tape-feeding mechanism, the tape feeding speed, the roller rotation speed, and the lateral translation of the roller-tape system is actively controlled. Abrasive tape 526 is soft (such as a PET film) and it has abrasives (such as particles of semiconductor carbide, aluminum oxide, chromium oxide, diamond, and semiconductor oxide) embedded/adhered to its surface so that it can be used to gently and evenly conduct the mechanical lapping. Since the pitch between pyramid tips being polished is less than 1 mm, the local deformation of the lapping pad between the two adjacent pyramid tips is smaller than the height difference between the large and small pyramids. FIG. 30A is not drawn to scale as the diameter of the roller is much larger than the pyramid dimensions. In this mechanical lapping process, the choice of abrasive materials, the roughness of the lapping tape surface, the slurry type, the liquid temperature, the force/pressure loaded in the vertical direction (weight) onto the 3-D TFSS, tape-feeding speed need to be managed so that the thin layer on the TFSS surface can be effectively removed without damage to the 3-D TFSS structure.

As a result, and as shown in FIG. 30B, a thin surface layer is only removed from the large pyramid tip surfaces 530 of 3-D TFSS 522 with the smaller pyramid tips untouched. This mechanical lapping method may be applied to either front or backside surfaces. Therefore, as described in the earlier, this method of selective and self-aligned thin layer removal may be used in (1) Opening the hard-etch-mask on backside at large pyramid tips for see-though hole etching; (2) Opening hard mask layer on front and/or backside surfaces for selective emitter/base doping; (3) Opening the passivation dielectric layer on front and/or backside surfaces for selective emitter/base metallization.

Figure 31A:
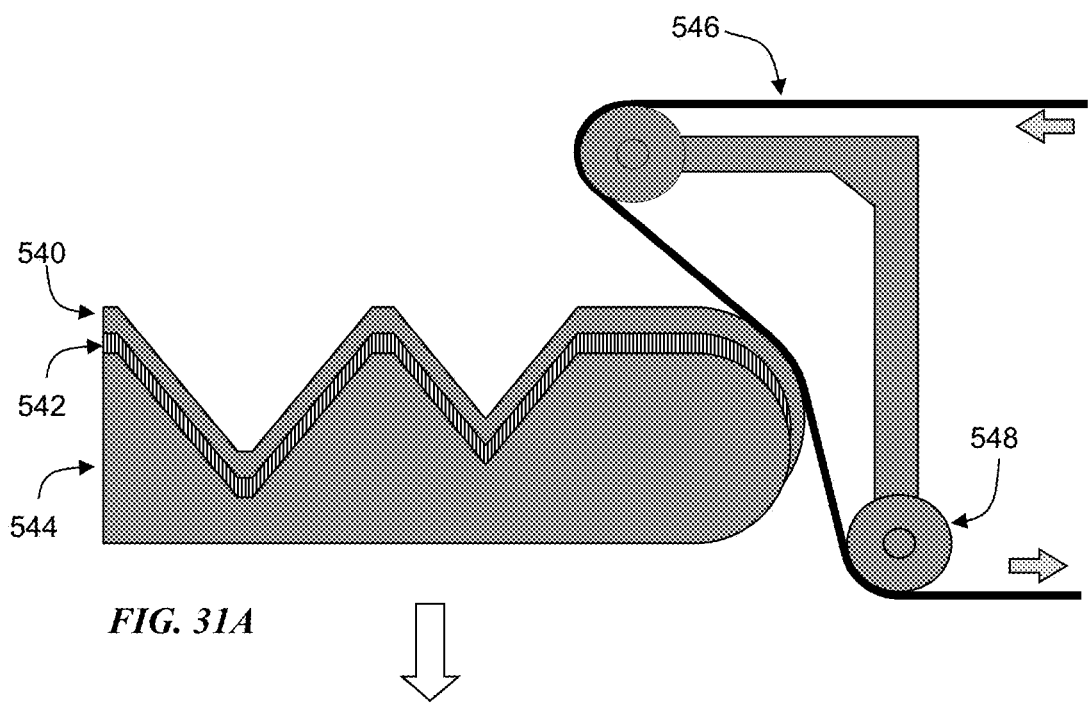
FIGS. 31A and 31C are a cross-sectional depiction illustrating a template/wafer edge lapping process.
Figure 31B:
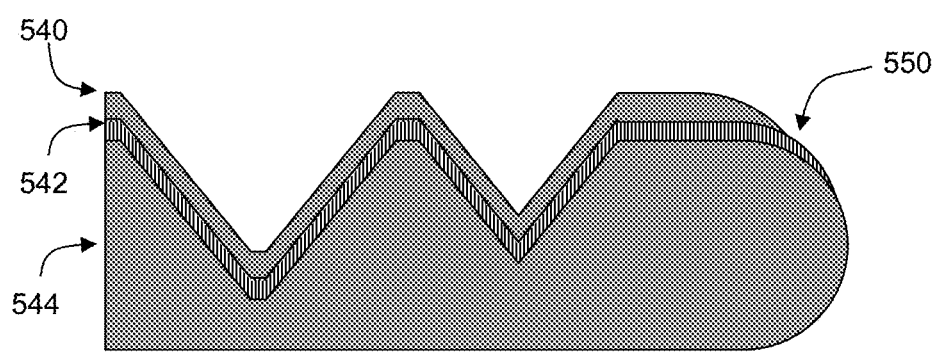
Figure 31C:
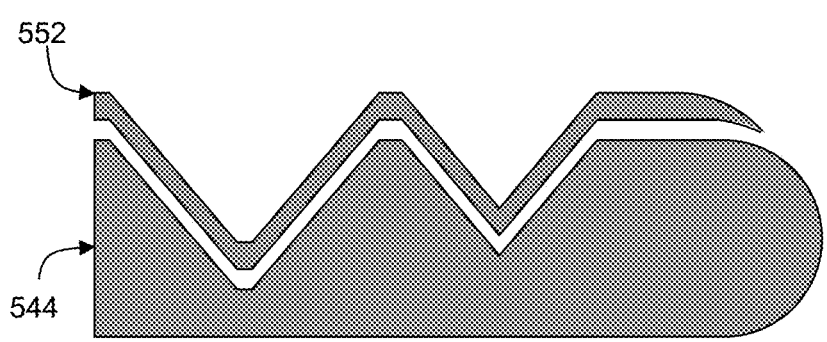

FIGS. 31A and 31C are a cross-sectional depiction illustrating a template/wafer edge lapping process in which a thin layer of a material at the template edge is removed by an abrasive tape based lapping.

As shown in FIG. 31A, abrasive tape 546 is pressed on the wafer edge by two rollers that are place in a distance away from the wafer edge. The wafer comprising template 544, porous semiconductor layer 542, and epitaxial layer 540. During lapping, abrasive tape 546 is continuously fed and guided by the two rollers 548. The distance and the angle of the two rollers 548 with respect to the wafer edge location determines the abrasive tape contact location, angle, and area, thus determines the profile of the wafer edge after lapping. It is to be noted that the distance and angle of the two rollers may be actively changed and controlled so that various amount of semiconductor at various edge locations may be removed accordingly. As a result, either a symmetrical or an asymmetrical wafer edge profile may be achieved by this wafer edge lapping method.

The following aspects of this edge lapping method that are integral parts of the current invention but are not illustrated in FIG. 31A. (1) Wafer mounting and rotation mechanism: the wafer can be mounted on a vacuum chuck with it edge area exposed or it can be clamped between two plates with the wafer edge exposed. The wafer is rotating in a uniform and controlled speed during lapping; (2) Abrasive tape feeding and tension control mechanism: the abrasive tape is continuously fed so that the tape can be actively cleaned/reconditioned before making contact to the wafer surface. The feeding speed and tension of the abrasive tape is controlled by mechanical and electrical systems that consists of multiple rollers of different sizes, motors, sensors and controllers; (3) Roller position and angle control mechanism: the relative position and angle of the two rollers shown in FIG. 31A are also controlled by mechanical and electrical means including actuators, motors, sensors and controllers; and (4) Liquid/chemical/slurry dispensing mechanism: liquid such as DI water, chemicals such as diluted semiconductor etchant, and/or abrasive slurry can be added to the wafer edge area where contact is made to the abrasive tape. These lapping medium can be added by direct dispense for a nozzle in proximity to the lapping area or carried to the lapping area by the abrasive tape.

The lapping tape is soft (such as a PET film) and it has abrasives (such as particles of semiconductor carbide, aluminum oxide, chromium oxide, diamond, and semiconductor oxide) embedded/adhered to its surface so that it can be used to gently and evenly conduct the mechanical lapping. FIG. 31A is not drawn to scale as the diameter of the roller could be larger than the wafer thickness. In this mechanical lapping process, the choice of abrasive materials, the roughness of the lapping tape surface, the slurry type, the liquid temperature, the force/pressure loaded to the wafer edge, tape tension and tape-feeding speed need to be managed so a thin layer of the wafer edge can be effectively removed without damage to the wafer integrity.

FIG. 31B illustrates the edge tape lapping method for facilitating the 3-D TFSS release and template re-use. Pre-structured semiconductor template 544 has grown epitaxial semiconductor layer 540 on top of a bi-layer porous semiconductor thin layer 542 in accordance with the present application. The edge lapping method is used for (1) to remove the edge wrap-around epitaxial semiconductor layer so that it would not be locked to the template; (2) to expose the buried porous semiconductor layer at edge—shown at wafer edge 550. Many 3-D TFSS release mechanisms described herein require the initiation of the releasing/separation of the porous semiconductor layer at the wafer edges. With this polished edge, the exposed porous semiconductor layer at the wafer edges serves as the releasing/separation initiation locations; (3) to polish the template edge in order to remove the semiconductor nodules/roughness from the porous semiconductor formation and epitaxial growth processes. A polished smooth template edge will make the template more robust for subsequent handling and re-use cycles as described. FIG. 31B illustrates the polished edge 550 of the wafer.

Next, the 3-D TFSS may be released/separated from the template. FIG. 31C illustrates released 3-D TFSS 552 and template 544. The porous semiconductor residue on the released TFSS and template surfaces are removed by diluted semiconductor etching solution, such as TMAH or KOH or NaOH. It is to be noted, the wafer edge tape lapping method may be used to polish a wafer of circular shape as well as wafers with square shape or quasi-square shapes. In the non-circular edge tape lapping cases, the wafer may not be rotating against its central axis; instead, the motion of the lapping tape is controlled to follow the wafer edge profile in the lateral directions.

Figure 32:
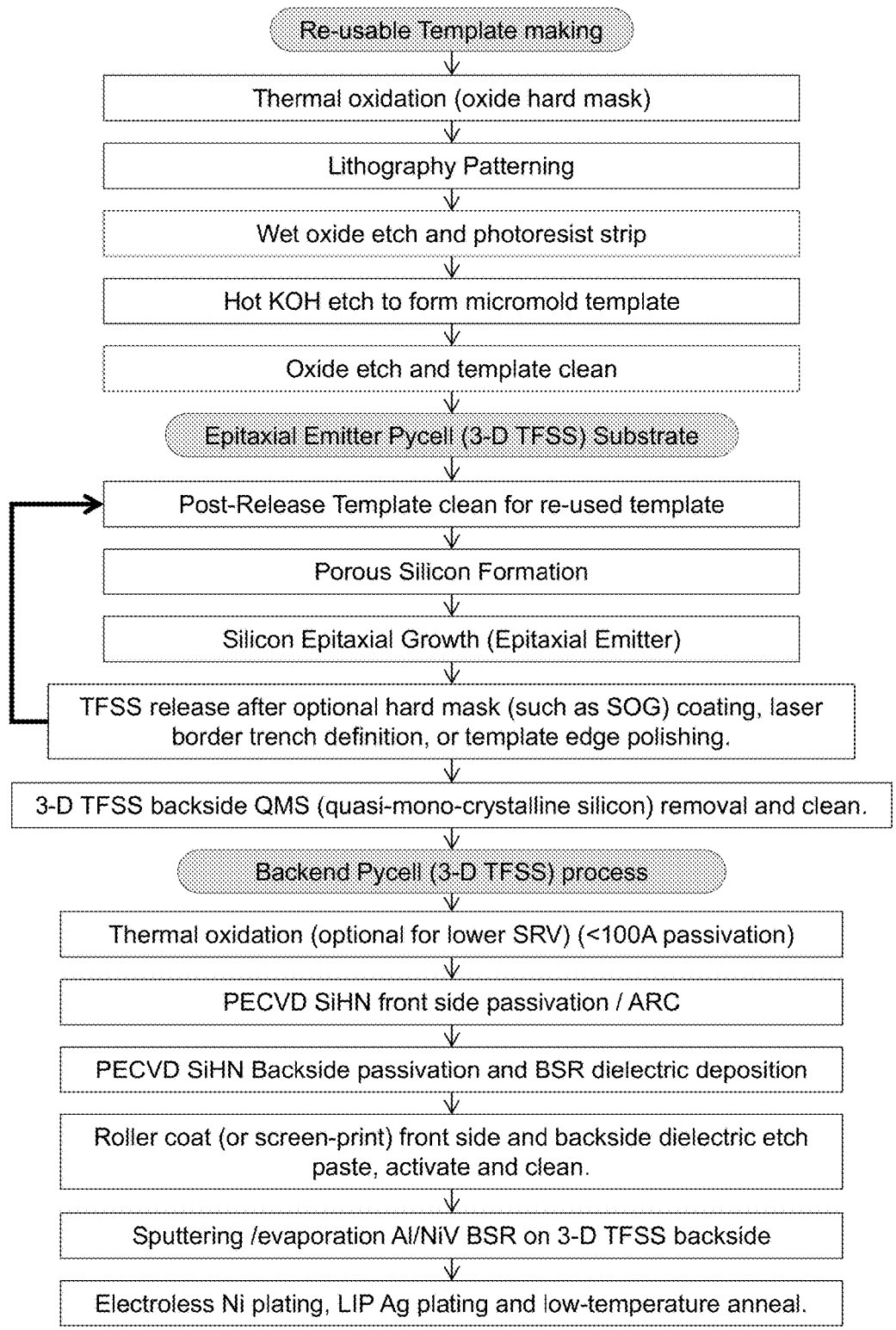
FIG. 32 is a process flow outlining the major steps of an overall re-usable template, 3-D TFSS and TFSC fabrication process with selective base metal, epitaxial emitter and plated metallization.

FIG. 32 is a process flow outlining the major steps of an overall re-usable template, 3-D TFSS and TFSC fabrication process with selective base metal, epitaxial emitter and plated metallization. The re-usable template making process as shown in the top section of FIG. 32 is same as described in FIG. 9 and FIGS. 15A through 15D. The Epitaxial Emitter Pycell (3-D TFSS) Substrate process is similar to the process described in FIG. 10 and FIGS. 16A through 16C. The term "Pycell" is refers to pyramid 3-D TFSS. In the backend Pycell (3-D TFSS) process as shown in FIG. 32, an optional thin thermal oxide layer of less than 100 A thick is first grown on the 3-D TFSS surfaces for passivation. Then hydrogen-rich PECVD semiconductor nitride is deposited on front and back side surfaces. In addition to serving as passivation layers, the semiconductor nitride on front side may also used as antireflection coating (ARC) and the semiconductor nitride on the backside may also be used as back surface reflection (BSR) layer.

In the next step, dielectric etch paste/liquid is coated on the front and back surface in a self-aligned coating process, such as roller coating or screen printing. The etch paste/liquid is selectively coated on the front ridges and back pyramid tips, where the dielectric layer is to be opened locally. After coating, the paste is cured/baked to activate the dielectric layer etching. After the etching, the residue paste and removed and the 3-D TFSS is cleaned. Next, a thin Al or NiV (nickel vanadium) layer is sputtered on the 3-D TFSS backside to serve as a backside surface reflection (BSF) layer. Next, electroless Ni plating is conducted on the front and back sides followed by LIP (light induced plating) of Ag on the front side. After the plating, a low temperature annealing is conducted for reducing the contact resistance.

Figure 33:
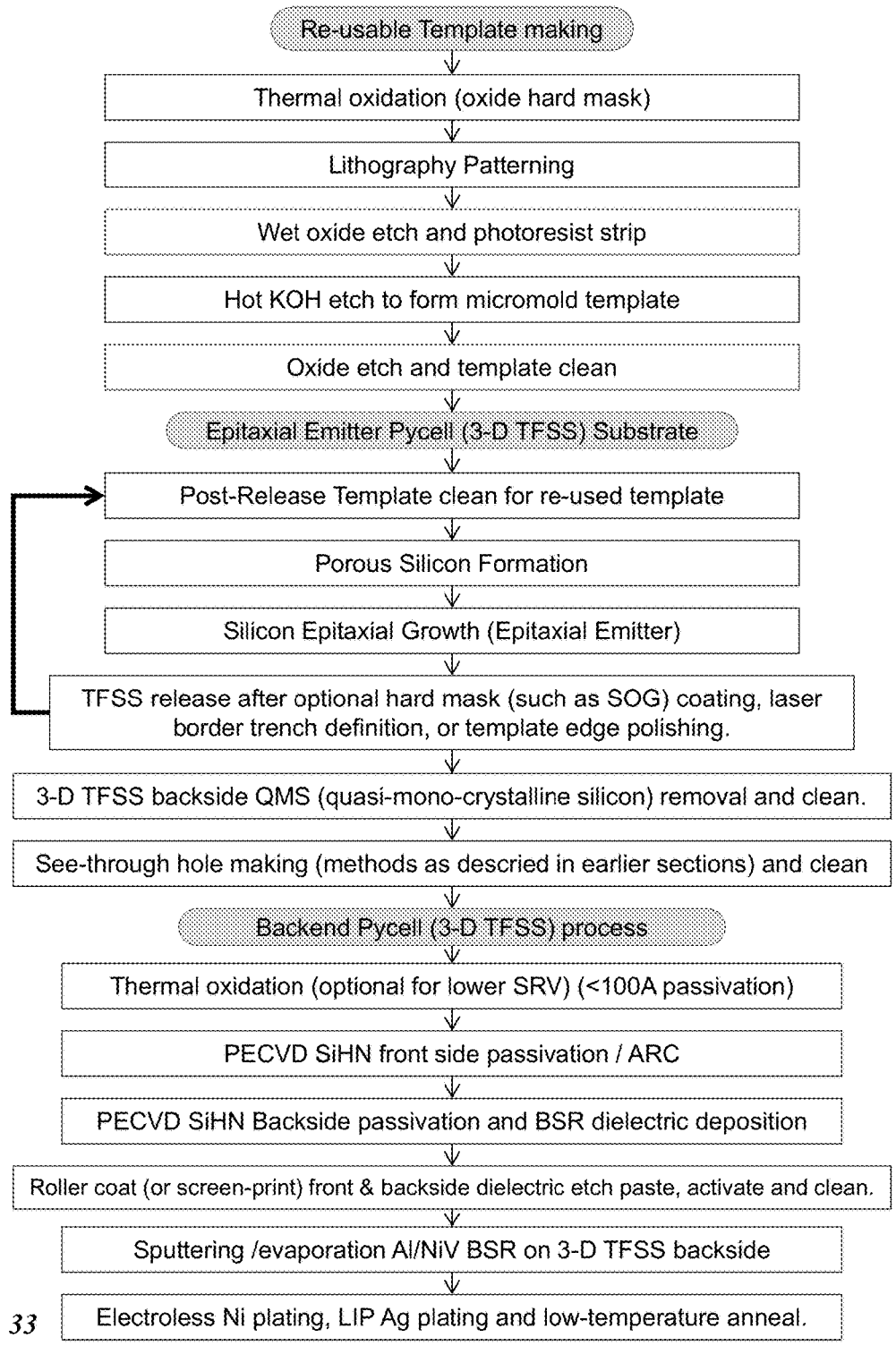
FIG. 33 is a process flow outlining the major steps of an overall re-usable template, see-through 3-D TFSS and TFSC fabrication process with selective base metal, epitaxial emitter and plated metallization.

FIG. 33 is a process flow outlining the major steps of an overall re-usable template, see-through 3-D TFSS and TFSC fabrication process with selective base metal, epitaxial emitter and plated metallization. The re-usable template making process as shown in the top section of FIG. 33 is same as described in FIG. 9 and FIGS. 15A through 15D. The Epitaxial Emitter Pycell (3-D TFSS) Substrate process is similar to the process described in FIG. 10 and FIGS. 16A through 16C. The term "Pycell" is refers to pyramid 3-D TFSS. After the 3-D TFSS releasing and its backside QMS (quasi-mono-crystalline semiconductor) layer removal, the see-through hole openings are made by methods described in FIG. 10, FIGS. 21A through 21D, FIGS. 22A through 22D, FIGS. 23A through 23D, and FIGS. 24A through 24D. In the backend Pycell (3-D TFSS) process as shown in FIG. 33, an optional thin thermal oxide layer of less than 100 A thick is first grown on the 3-D TFSS surfaces for passivation. Then hydrogen-rich PECVD semiconductor nitride is deposited on front and back side surfaces. In addition to serving as passivation layers, the semiconductor nitride on front side may also used as antireflection coating (ARC) and the semiconductor nitride on the backside may also be used as back surface reflection (BSR) layer. In the next step, dielectric etch paste/liquid is coated on the front and back surface in a self-aligned coating process, such as roller coating or screen printing. The etch paste/liquid is selectively coated on the front ridges and back pyramid tips, where the dielectric layer is to be opened locally.

After coating, the paste is cured/baked to activate the dielectric layer etching. After the etching, the residue paste and removed and the 3-D TFSS is cleaned. Next, a thin Al or NiV (nickel vanadium) layer is sputtered on the 3-D TFSS backside to serve as a backside surface reflection (BSF) layer. Next, electroless Ni plating is conducted on the front and back sides followed by LIP (light induced plating) of Ag on the front side. After the plating, a low temperature annealing is conducted for reducing the contact resistance.

The foregoing description of the exemplary embodiments is provided to enable any person skilled in the art to make or use the subject matter. Various modifications to these embodiments will be readily apparent to those skilled in the art, and the generic principles defined herein may be applied to other embodiments without the use of the innovative faculty. Thus, the subject matter to be claimed in subsequently filed applications is not intended to be limited to the embodiments shown herein but is to be accorded the widest scope consistent with the principles and novel features disclosed herein.

What is claimed is:

1. A three-dimensional thin-film semiconductor substrate for fabricating a partially transparent three-dimensional thin-film solar cell, comprising:
   a plurality of top surface areas substantially aligned along a (100) crystallographic plane of the semiconductor substrate and defining a base opening of an inverted pyramidal surface cavity on said top surface of the semiconductor substrate;
   a plurality of walls substantially aligned along a (111) crystallographic orientation plane of the semiconductor substrate wherein said walls form a plurality of at least two differently sized three-dimensional inverted pyramidal cavities comprising a larger set of three-dimensional inverted pyramidal cavities and a smaller set of three-dimensional inverted pyramidal cavities wherein said larger set of inverted pyramidal cavities and said smaller set of inverted pyramidal cavities are arranged in a staggered pattern on said semiconductor substrate;
   a plurality of selectively formed through-holes in said semiconductor substrate positioned between the front and back lateral surface planes of said semiconductor substrate which form a partially transparent three-dimensional thin-film semiconductor substrate.

2. The three-dimensional thin-film semiconductor substrate of claim 1, wherein said plurality of selectively formed through-holes in said semiconductor substrate are positioned in said smaller set of three-dimensional inverted pyramidal cavities on said semiconductor substrate.

3. The three-dimensional thin-film semiconductor substrate of claim 1, wherein said plurality of selectively formed through-holes in said semiconductor substrate are positioned in said larger set of three-dimensional inverted pyramidal cavities on said semiconductor substrate.

4. The three-dimensional thin-film semiconductor substrate of claim 1, wherein said plurality of selectively formed through-holes in said semiconductor substrate are positioned on the top surface areas on said semiconductor substrate.

5. A three-dimensional thin-film solar cell, comprising:
   a plurality of at least two differently sized three-dimensional inverted pyramidal cavities comprising a larger set of three-dimensional inverted pyramidal cavities and a smaller set of three-dimensional inverted pyramidal cavities wherein said larger set of inverted pyramidal cavities and said smaller set of inverted pyramidal cavities are arranged in a staggered pattern on a semiconductor substrate;
   a plurality of selectively formed through-holes in said semiconductor substrate with openings between the front and back lateral surface planes of said semiconductor substrate which form a partially transparent three-dimensional thin-film semiconductor substrate;
   a sunny side n-type doped emitter region positioned on the top surface of said semiconductor substrate and a front side surface passivation layer and an anti-reflection layer positioned on said emitter region;
   a back surface field p-type doped base region positioned on the bottom surface of said semiconductor substrate and a back side surface passivation layer positioned on said base region;
   a plurality of emitter metal contacts positioned on base openings of said inverted pyramidal cavities on said semiconductor substrate; and
   a plurality of base metal contacts positioned on the bottom surface of said semiconductor substrate at the apex of said inverted pyramidal cavities on said semiconductor substrate.

* * * * *